United States Patent
Adachi

(10) Patent No.: US 9,759,844 B2
(45) Date of Patent: Sep. 12, 2017

(54) FILM MIRROR, FILM MIRROR MANUFACTURING METHOD, FILM MIRROR FOR PHOTOVOLTAIC POWER GENERATION, AND REFLECTION DEVICE FOR PHOTOVOLTAIC POWER GENERATION

(71) Applicant: KONICA MINOLTA INC., Tokyo (JP)

(72) Inventor: Hitoshi Adachi, Kanagawa (JP)

(73) Assignee: KONICA MINOLTA, INC., Tokyo (JP)

( * ) Notice: Subject to any disclaimer, the term of this patent is extended or adjusted under 35 U.S.C. 154(b) by 448 days.

(21) Appl. No.: 14/370,539

(22) PCT Filed: Dec. 28, 2012

(86) PCT No.: PCT/JP2012/084151
§ 371 (c)(1),
(2) Date: Jul. 3, 2014

(87) PCT Pub. No.: WO2013/103139
PCT Pub. Date: Jul. 11, 2013

(65) Prior Publication Data
US 2014/0340741 A1    Nov. 20, 2014

(30) Foreign Application Priority Data
Jan. 6, 2012  (JP) ................ 2012-001108

(51) Int. Cl.
*G02B 5/08* (2006.01)
*B32B 15/08* (2006.01)
(Continued)

(52) U.S. Cl.
CPC .......... *G02B 5/0866* (2013.01); *B05D 5/063* (2013.01); *B32B 7/02* (2013.01); *B32B 15/08* (2013.01);
(Continued)

(58) Field of Classification Search
CPC ... G02B 1/00; G02B 1/10; G02B 5/08; G02B 5/0816; G02B 5/0825; G02B 5/0833;
(Continued)

(56) References Cited

U.S. PATENT DOCUMENTS 3,694,059 A * 9/1972 Shakespeare ............ F24J 2/12
343/912
4,307,150 A   12/1981 Roche
(Continued)

FOREIGN PATENT DOCUMENTS

JP    2006162746 A  *  6/2006
JP    2006198973       8/2006
(Continued)

OTHER PUBLICATIONS

International Search Report for International Application No. PCT/JP2012/084151, date of mailing: Feb. 5, 2013. English Translation attached.
(Continued)

Primary Examiner — Arnel C Lavarias
(74) Attorney, Agent, or Firm — Cantor Colburn LLP

(57) ABSTRACT

A film mirror having a metal reflective layer formed on a resin substrate may include, closer to a light incident side than the metal reflective layer, an interface reflective layer having at least one set of a high refractive index layer and a low refractive index layer that are adjacent to each other. At least one of the high refractive index layer and the low refractive index layer may include a water soluble polymer and metal oxide particles. A method for manufacturing the film mirror may include forming the interface reflective layer by simultaneous multilayer coating of materials of the high refractive index layer and the low refractive index layer.

18 Claims, 9 Drawing Sheets

(51) Int. Cl.
| | |
|---|---|
| B05D 5/06 | (2006.01) |
| G02B 1/10 | (2015.01) |
| G02B 19/00 | (2006.01) |
| H01L 31/056 | (2014.01) |
| F24J 2/10 | (2006.01) |
| B32B 7/02 | (2006.01) |
| B32B 27/30 | (2006.01) |
| G02B 1/14 | (2015.01) |

(52) U.S. Cl.
CPC ........... B32B 27/306 (2013.01); F24J 2/1057 (2013.01); G02B 1/10 (2013.01); G02B 19/009 (2013.01); G02B 19/0019 (2013.01); G02B 19/0042 (2013.01); H01L 31/056 (2014.12); B32B 2307/416 (2013.01); B32B 2307/418 (2013.01); B32B 2307/712 (2013.01); B32B 2457/12 (2013.01); B32B 2551/08 (2013.01); G02B 1/14 (2015.01); Y02E 10/40 (2013.01); Y02E 10/52 (2013.01)

(58) Field of Classification Search
CPC .... G02B 5/0841; G02B 5/085; G02B 5/0858; G02B 5/0866; G02B 5/0883; G02B 5/0891; B32B 15/04; B32B 15/08; B32B 15/082; B32B 15/085; B32B 15/088; B32B 15/09; B32B 15/092; B32B 15/095; B32B 15/098
USPC ........ 359/360, 350, 359, 361; 428/323, 326, 428/327
See application file for complete search history.

(56) References Cited

U.S. PATENT DOCUMENTS

| | | | |
|---|---|---|---|
| 4,645,714 A | 2/1987 | Roche et al. | |
| 2004/0118395 A1* | 6/2004 | Rubbia | F24J 2/1057 126/694 |
| 2007/0178316 A1* | 8/2007 | Mellott | C03C 17/36 428/426 |
| 2009/0233106 A1* | 9/2009 | Medwick | C03C 17/36 428/432 |
| 2013/0114155 A1* | 5/2013 | Eguro | G02B 5/10 359/853 |

FOREIGN PATENT DOCUMENTS

| | | |
|---|---|---|
| JP | 2006285217 | 10/2006 |
| JP | 2006285217 A | 10/2006 |
| JP | 2008003243 | 1/2008 |
| JP | 2008003243 A | 1/2008 |
| JP | 2008039960 | 2/2008 |
| JP | 2008039960 A | 2/2008 |
| JP | 2008251225 | 10/2008 |
| JP | 2009086659 A * | 4/2009 |
| JP | 2010231155 | 10/2010 |
| JP | 2010231155 A | 10/2010 |
| JP | 2010237415 | 10/2010 |
| WO | 2010078105 A1 | 7/2010 |
| WO | 2010078289 A2 | 7/2010 |

OTHER PUBLICATIONS

Written Opinion of the International Searching Authority for International Application No. PCT/JP2012/084151, date of mailing: Jan. 24, 2013. English Translation attached.

Extended European Search Report corresponding to Application No. 12864094.3; Date of Mailing: Jul. 28, 2015.

Japanese Notice of Reasons for Rejection corresponding to Application No. 2013-552430; Drafting Date: Oct. 31, 2016, with English translation.

* cited by examiner

FILM MIRROR, FILM MIRROR MANUFACTURING METHOD, FILM MIRROR FOR PHOTOVOLTAIC POWER GENERATION, AND REFLECTION DEVICE FOR PHOTOVOLTAIC POWER GENERATION

CROSS REFERENCE TO RELATED APPLICATIONS

This is the U.S. national stage of application No. PCT/JP2012/084151, filed on 18 Dec. 2012. Priority under 35 U.S.C. §119(a) and 35 U.S.C. §365(b) is claimed from Japanese Application No. 2012-001108, filed 6 Jan. 2012, the disclosure of which is also incorporated herein by reference.

TECHNICAL FIELD

The present invention relates to a film mirror, a manufacturing method thereof, a film mirror for photovoltaic power generation, and a reflection device for photovoltaic power generation.

BACKGROUND ART

Global warming in recent years has developed into such a serious situation as to threaten even the survival of mankind in the future. The main cause of global warming has been believed to be atmospheric carbon dioxide ($CO_2$) emitted from fossil fuels which have been used in large amounts as energy sources in the 20th century. Accordingly, in the near future, it may be no longer possible to continue use of fossil fuels at the current rate. At the same time, depletion of petroleum oil and natural gas, which were believed to be inexhaustible in the past, seems to become more likely due to increasing energy demand accompanied by the rapid economic growth of so-called developing countries, for example, China, India, and Brazil.

The solar energy is considered to be a natural energy source which is most stable as an alternative energy source of a fossil fuel and has much quantity. Especially, since the vast desert spreads out near the equator called Sun Belt Places in the world, the solar energy poured thereto is quite inexhaustible supply. Regarding the use of the solar energy, if only several percent of the desert which spreads in the southwestern U.S. is used for this purpose, it is thought possible to acquire energy of 7,000 GW. Moreover, if only several percent of the desert of Arabian Peninsula and North Africa is used, it is thought that all the energy that all mankind uses can be provided.

However, even though solar energy is considered as a very strong alternative energy, in terms of utilizing it in social activities, it has problems such that (1) energy density of solar energy is low and (2) storage and transfer of solar energy are difficult.

In order to solve the problem that the energy density of solar energy is low, proposed is a huge light concentrating device which can collect solar energy.

Because a light concentrating device is exposed to ultraviolet rays of solar light, heat, windstorm, sandstorm, or the like, a glass mirror having good weather resistance has been conventionally used. However, although the glass mirror is highly durable for environments, it has disadvantages such as breakage during transport and significantly high weights, leading to high plant construction costs for providing necessary strength of mounts on which the mirrors are installed.

To solve such problems, a method of replacing a glass mirror with a resinous reflection mirror is contemplated (for example, Patent Literatures 1 and 2).

However, when aluminum is used for a metal reflective layer of a resinous reflection mirror, there is a problem that the efficiency of using energy of solar light is low since the infrared reflectivity is low in an aluminum reflective layer.

Further, when silver is used for a metal reflective layer of a resinous reflection mirror, there is a problem that the reflection efficiency is lowered due to deterioration of the silver reflective layer, which is caused by easy corrosion of silver in natural environment, or a problem that a resin substrate as a lower layer of the silver reflective layer is deteriorated by ultraviolet rays since ultraviolet rays can easily pass through the silver reflective layer.

Further, for a resinous reflection mirror, a technique of preventing deterioration of a resin substrate caused by ultraviolet rays by installing an ultraviolet reflection film, which is obtained by laminating alternately a high refractive index layer and a low refractive index layer by a vapor deposition method, has been known (for example, Patent Literature 3).

However, in order to also reflect visible rays and infrared rays by a laminate having a high refractive index layer and a low refractive index layer for effective use of solar energy, it is necessary to form multiple layers of the high refractive index layer and the low refractive index layer. When the lamination number of a high refractive index layer and a low refractive index layer is increased by deposition due to such reasons, there is a problem of having high production costs.

CITATION LIST

Patent Literature

Patent Literature 1: U.S. Pat. No. 4,307,150
Patent Literature 2: U.S. Pat. No. 4,645,714
Patent Literature 3: JP 2010-237415 A

SUMMARY OF INVENTION

Technical Problem

The present invention has been made in view of the problems described above, and the problem to be solved is to provide a film mirror having high reflectivity for efficiently concentrating solar light and having excellent weather resistance, a method for manufacturing the film mirror, a film mirror for photovoltaic power generation, and a reflection device for photovoltaic power generation.

Solution to Problem

In order to solve the above problem, an invention according to claim 1 is a film mirror having a metal reflective layer formed on a resin substrate, the film mirror including, closer to a light incident side than the metal reflective layer:

an interface reflective layer having at least one set of a high refractive index layer and a low refractive index layer that are adjacent to each other, wherein at least one of the high refractive index layer and the low refractive index layer contains a water soluble polymer and metal oxide particles.

An invention according to claim 2 is the film mirror according to claim 1, wherein the water soluble polymer is at least one water soluble polymer of polyvinyl alcohol, gelatin, and thickening polysaccharides.

An invention according to claim 3 is the film mirror according to claim 1 or 2, wherein the metal oxide is rutile type titanium dioxide.

An invention according to claim 4 is the film mirror according to any one of claims 1 to 3, wherein an ultraviolet absorbing layer is provided closer to the light incident side than the interface reflective layer.

An invention according to claim 5 is the film mirror according to any one of claims 1 to 4, wherein a hard coat layer is provided on an outermost surface of the light incident side of the film mirror.

An invention according to claim 6 is the film mirror according to any one of claims 1 to 5, wherein a gas barrier layer is provided closer to the light incident side than the metal reflective layer.

An invention according to claim 7 is a film mirror manufacturing method for manufacturing the film mirror according to any one of claims 1 to 6, including:

forming the interface reflective layer by simultaneous multilayer coating of materials of the high refractive index layer and the low refractive index layer.

An invention according to claim 8 is a film mirror for photovoltaic power generation including, on a resin substrate:

an interface reflective layer having at least one set of a high refractive index layer and a low refractive index layer that are adjacent to each other, wherein at least one of the high refractive index layer and the low refractive index layer contains a water soluble polymer and metal oxide particles.

An invention according to claim 9 is a reflection device for photovoltaic power generation formed by adhering the film mirror according to any one of claims 1 to 6 to a supporting substrate with a self-supporting property via an adhesion layer.

An invention according to claim 10 is the reflection device for photovoltaic power generation according to claim 9, wherein the supporting substrate includes a resin material with a hollow structure.

An invention according to claim 11 is the reflection device for photovoltaic power generation according to claim 9, wherein the supporting substrate includes a pair of flat metal plates and an intermediate layer interposed between the flat metal plates, and the intermediate layer includes a material or a resin material with a hollow structure.

Advantageous Effects of Invention

According to the present invention, a film mirror having high reflectivity for efficiently concentrating solar light and having excellent weather resistance, a method for manufacturing the film mirror, a film mirror for photovoltaic power generation, and a reflection device for photovoltaic power generation can be provided.

DESCRIPTION OF EMBODIMENTS

Figure 1A:
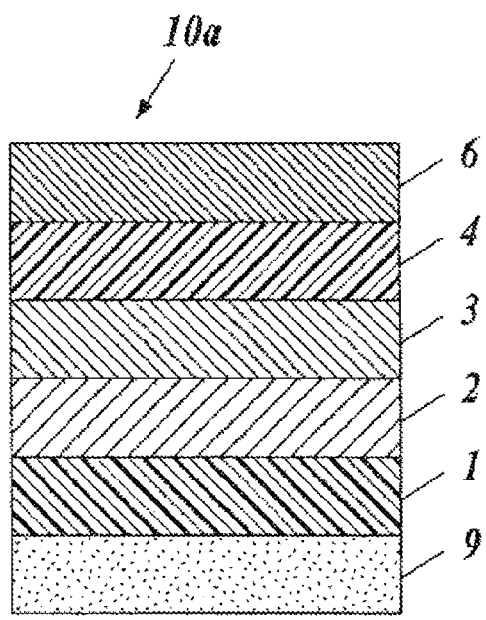
FIG. 1A is a brief cross-section drawing illustrating one exemplary configuration of the film mirror for photovoltaic power generation of the present invention.

Hereinbelow, details of the film mirror for photovoltaic power generation according to the present invention are explained. However, although the embodiments described below are given with various limitations that are technically desirable for carrying out the present invention, the scope of the present invention is not limited to the following embodiments and illustrated examples described below.

As a result of intensive studies by the inventors of the present invention, it was found that, by using an interface reflective layer having at least one set of a high refractive index layer and a low refractive index layer that are adjacent to each other and a metal reflective layer in combination, and by disposing the interface reflective layer closer to the light incident side than the metal reflective layer, a film mirror having high reflectivity and high durability is obtained.

It has been known that an interface reflective layer for reflecting solar light or the like on an interface between layers can be designed by alternately laminating layers with different refractive index layer (high refractive index layer, low refractive index layer) and also by controlling simultaneously the optical film thickness of each layer.

However, only with alternate lamination of layers with different refractive index, desired reflection characteristics may not be obtained because high-dimensional reflection occurs in a wavelength range other than the wavelength range that is intended to be reflected.

As a method of preventing it, for example, when an interface reflective layer is constituted with an alternate lamination unit having a high refractive index layer A (refractive index of nA) and a low refractive index layer C (refractive index of nC), a technique relating to an alternate lamination unit in which a layer B with refractive index satisfying the relationship of $nB=\sqrt{nAnC}$ is laminated with the high refractive index layer A and the low refractive index layer C by alternate lamination in order of ABC and the ratio of optical film thickness of each layer is designed to have A; 1/3, B; 1/6, and C; 1/3 has been known.

According to the present invention, the aforementioned constitution is basically adopted but by installing, between the high refractive index region and the low refractive index region, a region in which both of a high refractive index material in the high refractive index layer and a low refractive index material in the low refractive index layer are present, the desired favorable reflection is realized at an interface between the high refractive index layer and the low refractive index layer in the interface reflective layer.

(1) Outline of Configuration of Film Mirror for Photovoltaic Power Generation

The film mirror of the present invention is provided with a metal reflective layer (for example, a silver reflective layer) 3, which is formed on a resin substrate 1 in a resin film shape, and also provided, closer to the light incident side than the metal reflective layer 3, with an interface reflective layer (dielectric reflective layer) 6 having at least one set of a high refractive index layer and a low refractive index layer that are adjacent to each other.

In addition, other constitutional layers may be formed between the respective constitutional layers or on the constitution layers.

For example, an anchor layer 2 may be formed between the resin substrate 1 and the metal reflective layer 3 (see FIGS. 1A and 1B to FIGS. 4A and 4B).

For example, a resin coat 4 may be formed adjacent to the light incident side of the metal reflective layer 3 (see FIGS. 1A and 1B to FIGS. 4A and 4B).

Figure 4A:
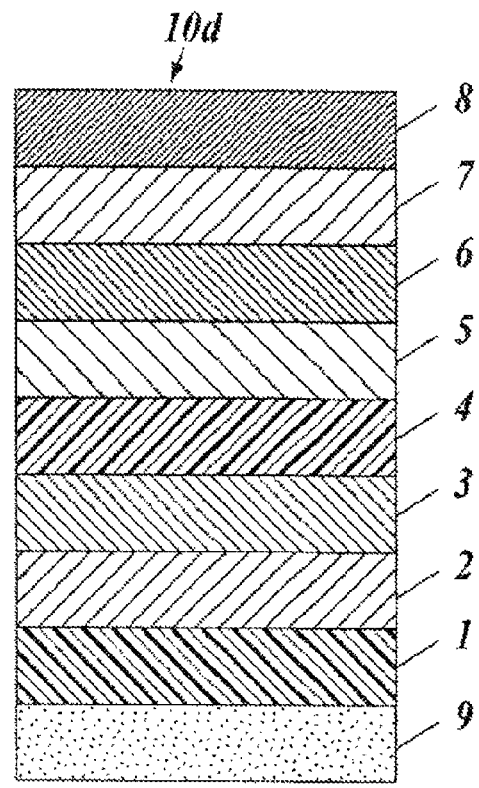
FIG. 4A is a brief cross-section drawing illustrating one exemplary configuration of the film mirror for photovoltaic power generation of the present invention.
Figure 4B:
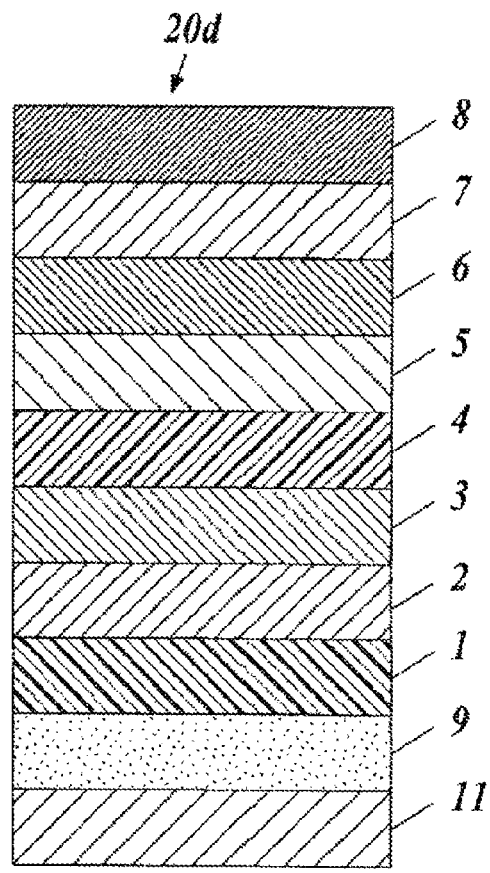
FIG. 4B is a brief cross-section drawing illustrating one exemplary configuration of the reflection device for photovoltaic power generation of the present invention.

For example, a gas barrier layer 5 may be formed closer to the light incident side than the metal reflective layer 3 (see FIGS. 4A and 4B).

For example, an ultraviolet absorbing layer 7 may be formed closer to the light incident side than the interface reflective layer (dielectric reflective layer) 6 (see FIGS. 2A and 2B to FIGS. 4A and 4B).

For example, a hard coat layer 8 may be formed on the outermost surface of the light incident side of the film mirror (see FIGS. 3A and 3B and FIGS. 4A and 4B).

For example, an adhesion layer 9 may be formed on the opposite surface to the light incident side of the resin substrate 1 (see FIGS. 1A and 1B to FIGS. 4A and 4B).

Further, from the viewpoint of warpage prevention, regular reflectivity, handling property, or the like, the thickness of the whole of the film mirror according to the present invention is preferably 80 to 300 µm, more preferably 80 to 200 µm, and still more preferably 80 to 170 µm. Further, the center line average roughness (Ra) of the outermost layer of the light incident side of the film mirror is preferably between 3 nm and 20 nm from the viewpoint of increasing light concentration efficiency by preventing scattering of reflected light.

Herein, an example of a preferable layer configuration of the film mirror for photovoltaic power generation will be described by using FIGS. 1A to 4A. Further, the outline of the reflection device for photovoltaic power generation will be described by using FIGS. 1B to 4B.

As illustrated in FIG. 1A, a film mirror 10a is formed by laminating, on the resin substrate 1, the anchor layer 2, the metal reflective layer (for example, a silver reflective layer) 3, the resin coat layer 4, and the dielectric reflective layer (interface reflective layer) 6 in order. Further, on the opposite surface of the light incident side of the resin substrate 1, the adhesion layer 9 is formed.

Figure 1B:
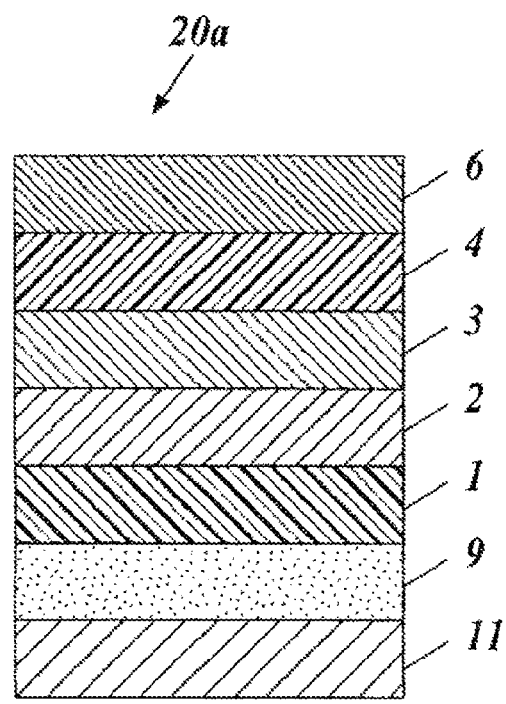
FIG. 1B is a brief cross-section drawing illustrating one exemplary configuration of the reflection device for photovoltaic power generation of the present invention.

As illustrated in FIG. 1B, a reflection device for photovoltaic power generation 20a is a reflection mirror which is obtained by adhering the adhesion layer 9 of the film mirror 10a to a supporting substrate 11 and laminating film mirror 10a with the supporting substrate 11.

Figure 2A:
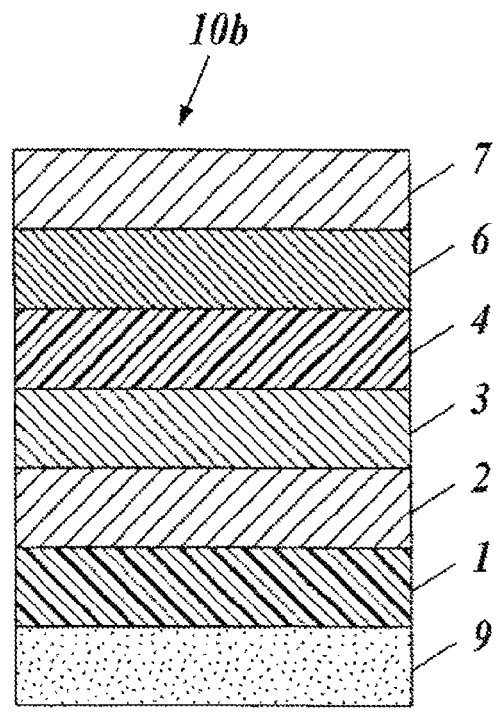
FIG. 2A is a brief cross-section drawing illustrating one exemplary configuration of the film mirror for photovoltaic power generation of the present invention.

As illustrated in FIG. 2A, the film mirror 10b is formed by laminating, on the resin substrate 1, the anchor layer 2, the metal reflective layer (for example, a silver reflective layer) 3, the resin coat layer 4, the dielectric reflective layer (interface reflective layer) 6, and the ultraviolet absorbing layer 7 in order. Further, on the opposite surface of the light incident side of the resin substrate 1, the adhesion layer 9 is formed.

Figure 2B:
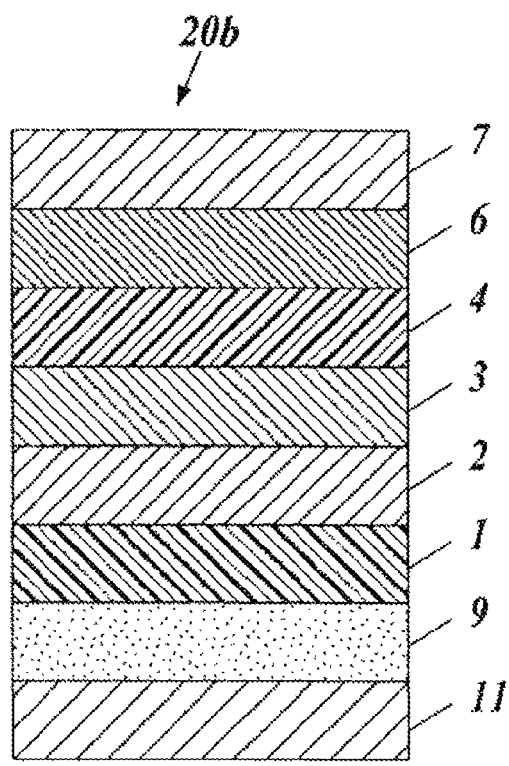
FIG. 2B is a brief cross-section drawing illustrating one exemplary configuration of the reflection device for photovoltaic power generation of the present invention.

As illustrated in FIG. 2B, a reflection device for photovoltaic power generation 20b is a reflection mirror which is obtained by adhering the adhesion layer 9 of the film mirror 10b to the supporting substrate 11 and laminating film mirror 10b with the supporting substrate 11.

Figure 3A:
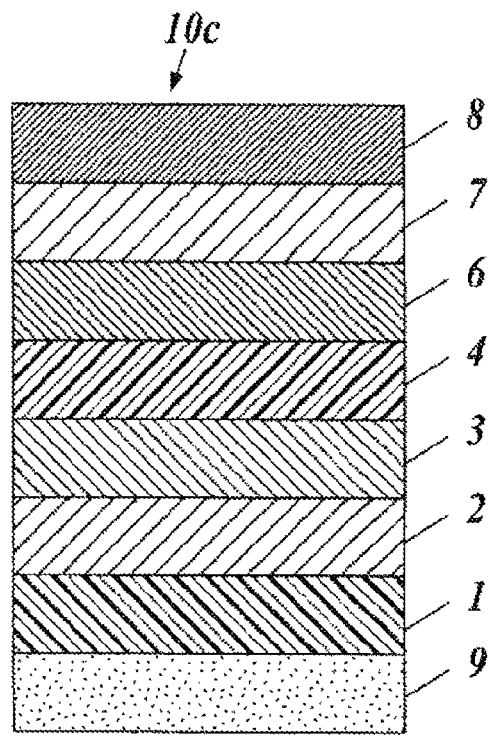
FIG. 3A is a brief cross-section drawing illustrating one exemplary configuration of the film mirror for photovoltaic power generation of the present invention.

As illustrated in FIG. 3A, a film mirror 10c is formed by laminating, on the resin substrate 1, the anchor layer 2, the metal reflective layer (for example, a silver reflective layer) 3, the resin coat layer 4, the dielectric reflective layer (interface reflective layer) 6, the ultraviolet absorbing layer 7, and the hard coat layer 8 in order. Further, on the opposite surface of the light incident side of the resin substrate 1, the adhesion layer 9 is formed.

Figure 3B:
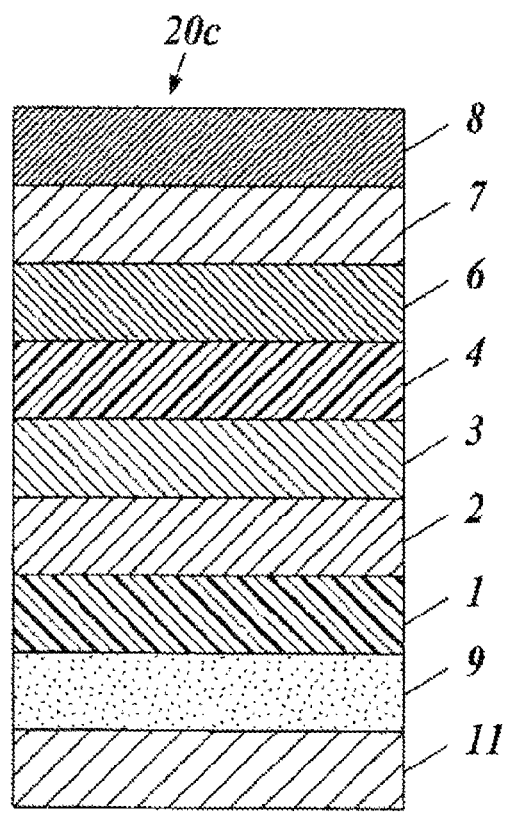
FIG. 3B is a brief cross-section drawing illustrating one exemplary configuration of the reflection device for photovoltaic power generation of the present invention.

As illustrated in FIG. 3B, a reflection device for photovoltaic power generation 20c is a reflection mirror which is obtained by adhering the adhesion layer 9 of the film mirror 10c to the supporting substrate 11 and laminating film mirror 10c with the supporting substrate 11.

As illustrated in FIG. 4A, a film mirror 10d is formed by laminating, on the resin substrate 1, the anchor layer 2, the metal reflective layer (for example, a silver reflective layer) 3, the resin coat layer 4, the gas barrier layer 5, the dielectric reflective layer (interface reflective layer) 6, the ultraviolet absorbing layer 7, and the hard coat layer 8 in order. Further, on the opposite surface of the light incident side of the resin substrate 1, the adhesion layer 9 is formed.

As illustrated in FIG. 4B, a reflection device for photovoltaic power generation 20d is a reflection mirror which is obtained by adhering the adhesion layer 9 of the film mirror 10d to the supporting substrate 11 and laminating film mirror 10d with the supporting substrate 11.

Hereinbelow, details of each constitutional layer will be described.

(2) Resin Substrate

A variety of conventionally known resin films may be used as the resin substrate 1. Examples thereof include cellulose ester-based films, polyester-based films, polycarbonate-based films, polyarylate-based films, polysulfone-based (including polyether sulfone) films, polyester films such as polyethylene terephthalate or polyethylene naphthalate films, polyethylene films, polypropylene films, cellophane, cellulose diacetate films, cellulose triacetate films, cellulose acetate propionate films, cellulose acetate butyrate films, polyvinylidene chloride films, polyvinyl alcohols films, ethylene vinyl alcohol films, syndiotactic polystyrene-based films, polycarbonate films, norbornene-based resin films, polymethylpentene films, polyether ketone films, polyether ketone imide films, polyamide films, fluororesin films, nylon films, polymethyl methacrylate films, and acrylic films. Among them, polycarbonate-based films, polyester-based films such as polyethylene terephthalate, norbornene-based resin films, and cellulose ester-based films, and acrylic films are preferred. Particularly, polyester-based films such as polyethylene terephthalate or acrylic films are preferably used. Further, the resin film may be either a film produced by melt casting or a film produced by solution casting.

Because the resin substrate 1 is at a position far from the light incident side compared to the metal reflective layer 3 or the dielectric reflective layer (interface reflective layer) 6, it is difficult for ultraviolet rays to reach the resin substrate 1. In particular, when an ultraviolet absorbing agent is contained in a layer (for example, the ultraviolet absorbing layer 7) closer to the light incident side than the resin substrate 1, it is even more difficult for ultraviolet rays to reach the resin substrate 1. Thus, even a resin easily deteriorated by ultraviolet rays can be used for the resin substrate 1. From such point of view, polyester films such as polyethylene terephthalate can be used for the resin substrate 1.

The thickness of the resin substrate 1 is preferably set to have a thickness that is suitable depending on the type of the resin, the purpose, or the like. For example, it is generally in a range of 10 to 250 μm. Preferably, it is in a range of 20 to 200 μm.

(3) Metal Reflective Layer

The metal reflective layer is a layer consisting of a metal or the like having the function of reflecting solar light.

The metal reflective layer 3 preferably has a surface reflectivity of 80% or more, and more preferably 90% or more. The metal reflective layer 3 is preferably made of a material including at least one element selected from the element group consisting of Al, Ag, Cr, Cu, Ni, Ti, Mg, Rh, Pt, and Au. In particular, it is preferable that the reflective layer is mainly composed of Al or Ag in view of reflectivity or corrosion resistance, and two or more thin films of such a metal may be layered to form the reflective layer. In the present invention, a metal reflective layer composed mainly of silver is particularly preferred.

From the viewpoint of reflectivity or the like, the thickness of the metal reflective layer 3 is preferably 10 to 200 nm and more preferably 30 to 150 nm.

It is also possible to further enhance the reflectivity by forming a layer consisting of metal oxide such as $SiO_2$ or $TiO_2$ on the metal reflective layer 3.

As a method of forming the metal reflective layer 3, any one of a wet method and a dry method may be used. The wet method is a general term of a plating method and is a method of precipitating metal from solution and forming a film. A specific example of the wet method includes silver mirror reaction. Meanwhile, the dry method is a general term of a vacuum film forming method, and specific examples thereof include a resistance heating type vacuum vapor deposition method, an electron-beam heating type vacuum vapor deposition method, an ion plating method, an ion beam-assisted vacuum vapor deposition method, and a sputtering method. Particularly, a vapor deposition method capable of employing a roll-to-roll method for continuously forming a film is preferably used in the present invention. For example, a method for manufacturing film mirror for photovoltaic power generation is preferably a manufacturing method of forming the metal reflective layer 3 by silver deposition.

(3-1) Silver Complex Compound Having Vaporizable/Releasable Ligand

The silver reflective layer can be formed by heating and calcining a coating film containing a silver complex compound having a vaporizable/releasable ligand when a silver reflective layer is formed.

The "silver complex compound having vaporizable/releasable ligand" indicates a silver complex compound which has a ligand for stable dissolution of silver in a solution but can have only the metal silver according to thermal decomposition of the ligand by removing the solvent and heating and calcining to yield $CO_2$ or low molecular weight amine compound followed by vaporization/release.

Examples of the complex are described in each of JP 2009-535661 W and 2010-500475 W, and it is preferably a silver complex compound obtained by the reaction between a silver compound represented by the following formula (1) and an ammonium carbamate compound, ammonium carbonate compound, or ammonium bicarbonate compound that are represented by the formulas (2) to (4).

Further, the silver complex compound is contained in a silver coating liquid composition, and by coating the composition, a coating film containing the complex of the present invention is formed on a support, which becomes the film mirror. Specifically, it is preferable that, after forming a coating film on a film by using a silver complex compound, the silver reflective layer is formed by heating and calcining the coating film at the temperature in the range of 80 to 250° C. More preferably, it is in the range of 100 to 220, and particularly preferably in the range of 120 to 200° C. A means for heating and calcining is not particularly limited and any commonly used heating means can be applied.

Hereinbelow, the silver compound represented by the following formula (1) and the ammonium carbamate compound, ammonium carbonate compound, or ammonium bicarbonate compound that are represented by the formulas (2) to (4) are explained.

[Chem. 1]

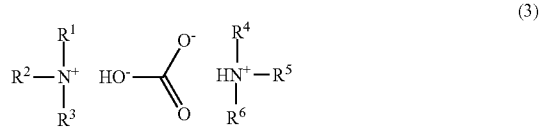

In the formulas (1) to (4), X represents a substituent group selected from oxygen, sulfur, halogen, cyano, cyanate, carbonate, nitrate, nitrite, sulfate, phosphate, thiocyanate, chlorate, perchlorate, tetrafluoroborate, acetylacetonate, carboxylate, and derivatives thereof, n represents an integer of 1 to 4, $R^1$ to $R^6$ each independently represent a substituent group selected from hydrogen, an aliphatic or alicyclic C1 to C30 alkyl group, an aryl group or an aralkyl group, an alkyl group or an aryl group substituted with a functional group, a heterocyclic group, a polymer compound, and derivatives thereof.

Specific examples of the formula (1) include silver oxide, silver thiocyanate, silver sulfide, silver chloride, silver cyanide, silver cyanate, silver carbonate, silver nitrate, silver nitrite, silver sulfate, silver phosphate, silver perchlorate, silver tetrafluoroborate, silver acetylacetonate, silver acetate, silver lactate, silver oxalate, and derivatives thereof, but not limited thereto.

Further, in the formulas (2) to (4), specific examples of $R^1$ to $R^6$ include hydrogen, methyl, ethyl, propyl, isopropyl, butyl, isobutyl, amyl, hexyl, ethylhexyl, heptyl, octyl, isooctyl, nonyl, decyl, dodecyl, hexadecyl, octadecyl, docodecyl, cyclopropyl, cyclopentyl, cyclohexyl, aryl, hydroxy, methoxy, hydroxyethyl, methoxyethyl, 2-hydroxypropyl, methoxypropyl, cyanoethyl, ethoxy, butoxy, hexyloxy, methoxyethoxyethyl, methoxyethoxyethoxyethyl, hexamethylene imine, morpholine, piperidine, piperazine, ethylene diamine, propylenediamine, hexamethylene diamine, triethylene diamine, pyrrole, imidazole, pyridine, carboxymethyl, trimethoxysilylpropyl, triethoxysilylpropyl, phenyl, methoxyphenyl, cyanophenyl, phenoxy, tolyl, benzyl and derivatives thereof, and a polymer compound such as polyarylamine and polyethylene amine, and derivatives thereof, but not limited thereto.

Examples of the compound of the formulas (2) to (4) include one kind selected from ammonium carbamate, ammonium carbonate, ammonium bicarbonate, ethyl ammonium ethyl carbamate, isopropyl ammonium isopropyl carbamate, n-butyl ammonium n-butyl carbamate, isobutyl ammonium isobutyl carbamate, t-butyl ammonium t-butyl carbamate, 2-ethylhexyl ammonium 2-ethylhexyl carbamate, octadecyl ammonium octadecyl carbamate, 2-methoxyethyl ammonium 2-methoxyethyl carbamate, 2-cyanoethyl ammonium 2-cyanoethyl carbamate, dibutyl ammonium dibutyl carbamate, dioctadecyl ammonium dioctadecyl carbamate, methyldecyl ammonium methyldecyl carbamate, hexamethylene imine ammonium hexamethylene imine carbamate, morpholinium morpholine carbamate, pyridium ethylhexyl carbamate, triethylene diaminium isopropyl bicarbamate, benzyl ammonium benzyl carbamate, triethoxysilylpropyl ammonium triethoxysilylpropyl carbamate, ethyl ammonium ethyl carbonate, isopropyl ammonium isopropyl carbonate, isopropyl ammonium bicarbonate, n-butyl ammonium n-butyl carbonate, isobutyl ammonium isobutyl carbonate, t-butyl ammonium t-butyl carbonate, t-butyl ammonium bicarbonate, 2-ethylhexyl ammonium 2-ethylhexyl carbonate, 2-ethylhexyl ammonium bicarbonate, 2-methoxyethyl ammonium 2-methoxyethyl carbonate, 2-methoxyethyl ammonium bicarbonate, 2-cyanoethyl ammonium 2-cyanoethyl carbonate, 2-cyanoethyl ammonium bicarbonate, octadecyl ammonium octadecyl carbonate, dibutyl ammonium dibutyl carbonate, dioctadecyl ammonium dioctadecyl carbonate, dioctadecyl ammonium bicarbonate, methyldecyl ammonium methyldecyl carbonate, hexamethylene imine ammonium hexamethylene imine carbonate, morpholine ammonium morpholine carbonate, benzyl ammonium benzyl carbonate, triethoxysilylpropyl ammonium triethoxysilylpropyl carbonate, pyridium bicarbonate, triethylene diaminium isopropyl carbonate, triethylene diaminium bicarbonate, and derivatives thereof, or a mixture of two or more kinds of them, but not limited thereto.

Meanwhile, the types of the ammonium carbamate compounds, ammonium carbonate compounds, or ammonium bicarbonate compounds, and the methods of manufacturing those compounds are not particularly limited. For example, U.S. Pat. No. 4,542,214 discloses that ammonium carbamate compounds can be prepared from primary amine, secondary amine, tertiary amine or a mixture of at least one of those compounds and carbon dioxide. An ammonium carbonate compound can be prepared in the case where another 0.5 mol of water is added to 1 mol of the amine, while an ammonium bicarbonate compound can be prepared in the case where at least 1 mol of water is added to 1 mol of the amine. The preparation can be directly carried out without using a special solvent under normal pressure or increased pressure. When a solvent is used, examples thereof include water, alcohols such as methanol, ethanol, isopropanol, and butanol; glycols such as ethylene glycol and glycerin; acetates such as ethyl acetate, butyl acetate, and carbitol acetate; ethers such as diethyl ether, tetrahydrofuran, and dioxane; ketones such as methyl ethyl ketone and acetone; hydrocarbons such as hexane and heptane; aromatic compounds such as benzene and toluene; halogen substituted solvents such as chloroform, methylene chloride, and carbon tetrachloride; or mixed solvents thereof. Carbon dioxide may be reacted in a gaseous state by bubbling or in a solid state (dry ice) as well as in a supercritical state. Any known methods other than the above-described methods can be employed for the preparation of the ammonium carbamate or ammonium carbonate derivatives if the structure of the final compound is the same. In other words, the solvent, reaction temperature, concentration, or catalyst for production is not particularly required to be limited, and they do not have an influence on the production yield.

Organic silver complex compounds can be manufactured by the reaction of an ammonium carbamate compound, an ammonium carbonate compound, or an ammonium bicarbonate compound prepared as above with a silver compound. For example, at least one silver compound as described in the formula (1) may be directly reacted with at least one of an ammonium carbamate compound, an ammonium carbonate compound, and an ammonium bicarbonate compound as described in the formulas (2) to (4) or a mixture thereof without using a solvent under normal pressure or increased pressure in nitrogen gas. When a solvent is used, examples of the solvent which may be used include water; alcohols such as methanol, ethanol, isopropanol and butanol; glycols such as ethylene glycol and glycerin; acetates such as ethyl acetate, butyl acetate and carbitol acetate; ethers such as diethyl ether, tetrahydrofuran and dioxane; ketones such as methyl ethyl ketone and acetone; hydrocarbons such as hexane and heptanes; aromatic solvents such as benzene and toluene; and halogen substituted solvents such as chloroform, methylene chloride, and carbon tetrachloride; and a mixture thereof.

For manufacturing the silver complex compound (that is, silver complex compound having vaporizable/releasable ligand), besides the above-described methods, it is possible that a mixed solution of the silver compound represented by the formula (1) and at least one amine compound is prepared, and then reacted with carbon dioxide to give a silver complex compound. As described above, either the direct reaction without solvent or the reaction with solvent can be conducted under normal pressure or increased pressure in nitrogen gas. Any known method can be employed if the structure of the final compound is the same. More specifically, the solvent, reaction temperature, concentration, or presence or absence of catalyst for production is not particularly required to be limited, and they do not have an influence on the production yield.

Method for producing the silver complex compound is described in JP 2008-530001 W, and it is recognized with the following formula (5).

$$Ag[A]_m \qquad (5)$$

(in the formula (5), A is a compound represented by the formulas (2) to (4) and m is 0.5 to 1.5).

The silver coating liquid composition used for forming the reflective surface with high reflectivity and high gloss in the silver reflective layer includes the silver complex compound, and, if necessary, can contain other additives such as a solvent, a stabilizer, a leveling agent, a film adjuvant, a reducing agent, and a pyrolysis promoter.

Examples of the stabilizer include an amine compound such as primary amine, secondary amine, and tertiary amine, an ammonium carbamate compound, an ammonium carbonate compound, an ammonium bicarbonate compound, or a phosphorus compound such as phosphine, phosphite, and phosphate, a sulfur compound such as thiol and sulfide, and a mixture of at least one of them. Specific examples of the amine compound include an amine compound such as methylamine, ethylamine, n-propylamine, isopropylamine, n-butylamine, isobutylamine, isoamylamine, n-hexylamine, 2-ethylhexylamine, n-heptylamine, n-octylamine, isooctylamine, nonylamine, decylamine, dodecylamine, hexadecylamine, octadecylamine, docodecylamine, cyclopropylamine, cyclopentylamine, cyclohexylamine, arylamine, hydroxyamine, ammonium hydroxide, methoxyamine, 2-ethanolamine, methoxyethylamine, 2-hydroxypropylamine, 2-hydroxy-2-methylpropylamine, methoxypropylamine, cyanoethylamine, ethoxyamine, n-butoxyamine, 2-hexyloxyamine, methoxyethoxyethylamine, methoxyethoxyethoxyethylamine, dimethylamine, dipropylamine, diethanolamine, hexamethylene imine, morpholine, piperidine, piperazine, ethylene diamine, propylenediamine, hexamethylene diamine, triethylene diamine, 2,2-(ethylene dioxy)bisethylamine, triethylamine, triethanolamine, pyrrole, imidazole, pyridine, aminoacetaldehyde dimethylacetal, 3-aminopropyltrimethoxysilane, 3-aminopropyltriethoxysilane, aniline, anisidine, aminobenzonitrile, benzylamine, derivatives thereof, a polymeric compound such as polyarylamine and polyethyleneimine, and derivatives thereof.

Specific examples of the ammonium carbamate, carbonate, bicarbonate compound include ammonium carbamate, ammonium carbonate, ammonium bicarbonate, ethyl ammonium ethyl carbamate, isopropyl ammonium isopropyl carbamate, n-butyl ammonium n-butyl carbamate, isobutyl ammonium isobutyl carbamate, t-butyl ammonium t-butyl carbamate, 2-ethylhexyl ammonium 2-ethylhexyl carbamate, octadecyl ammonium octadecyl carbamate, 2-methoxyethyl ammonium 2-methoxyethyl carbamate, 2-cyanoethyl ammonium 2-cyanoethyl carbamate, dibutyl ammonium dibutyl carbamate, dioctadecyl ammonium dioctadecyl carbamate, methyldecyl ammonium methyldecyl carbamate, hexamethylene imine ammonium hexamethylene imine carbamate, morpholinium morpholine carbamate, pyridium ethylhexyl carbamate, triethylene diaminium isopropyl bicarbamate, benzyl ammonium benzyl carbamate, triethoxysilylpropyl ammonium triethoxysilylpropyl carbamate, ethyl ammonium ethyl carbonate, isopropyl ammonium isopropyl carbonate, isopropyl ammonium bicarbonate, n-butyl ammonium n-butyl carbonate, isobutyl ammonium isobutyl carbonate, t-butyl ammonium t-butyl carbonate, t-butyl ammonium bicarbonate, 2-ethylhexyl ammonium 2-ethylhexyl carbonate, 2-ethylhexyl ammonium bicarbonate, 2-methoxyethyl ammonium 2-methoxyethyl carbonate, 2-methoxyethyl ammonium bicarbonate, 2-cyanoethyl ammonium 2-cyanoethyl carbonate, 2-cyanoethyl ammonium bicarbonate, octadecyl ammonium octadecyl carbonate, dibutyl ammonium dibutyl carbonate, dioctadecyl ammonium dioctadecyl carbonate, dioctadecyl ammonium bicarbonate, methyldecyl ammonium methyldecyl carbonate, hexamethylene imine ammonium hexamethylene imine carbonate, morpholine ammonium morpholine carbonate, benzyl ammonium benzyl carbonate, triethoxysilylpropyl ammonium triethoxysilylpropyl carbonate, pyridium bicarbonate, triethylene diaminium isopropyl carbonate, triethylene diaminium bicarbonate, and derivatives thereof.

Furthermore, as for the phosphorous compound, a phosphorus compound represented by a general formula $R_3P$, $(RO)_3P$, or $(RO)_3PO$, in which R is an alkyl or aryl group having 1 to 20 carbon atoms, can be mentioned. Specific examples thereof include tributylphosphine, triphenylphosphine, triethyl phosphite, triphenyl phosphite, dibenzyl phosphate, and triethyl phosphate.

Specific examples of the sulfur compound include butanethiol, n-hexanethiol, diethyl sulfide, tetrahydrothiophene, aryl disulfide, 2-mercaptobenzoxazole, tetrahydrothiophene, and octyl thioglycolate.

Use amount of the stabilizer is not required to be limited particularly. However, the content is preferably 0.1% to 90% in a molar ratio compared to the silver compound.

Examples of the film adjuvant include an organic acid, an organic acid derivative, or a mixture of one or more of them. Specific examples include an organic acid such as acetic acid, butyric acid, valeric acid, pivalic acid, hexanoic acid, octanoic acid, 2-ethylhexanoic acid, neodecanoic acid, lauric acid, stearic acid, and naphthalic acid. Examples of the organic acid derivatives include ammonium salts of organic acids such as ammonium acetate, ammonium citrate, ammonium laurate, ammonium lactate, ammonium maleate, ammonium oxalate, and ammonium molybdate; and metal salts of organic acids, which include metals such as Au, Cu, Zn, Ni, Co, Pd, Pt, Ti, V, Mn, Fe, Cr, Zr, Nb, Mo, W, Ru, Cd, Ta, Re, Os, Ir, Al, Ga, Ge, In, Sn, Sb, Pb, Bi, Sm, Eu, Ac, or Th, for example, manganese oxalate, gold acetate, palladium oxalate, silver 2-ethylhexanoate, silver octanoate, silver neodecanoate, cobalt stearate, nickel naphthalate, and cobalt naphthalate. The use amount of the film adjuvant is preferably, but not particularly limited to, 0.1% to 25% in molar ratio compared to the silver complex compound.

Examples of the reducing agent include Lewis acid and weak Bronsted acid. Specific examples thereof include hydrazine, hydrazine monohydrate, acetohydrazide, sodium borohydride or potassium borohydride, an amine compound such as dimethylamine borane and butylamine borane, a metal salt such as ferrous chloride and iron lactate; hydrogen; hydrogen iodide; carbon monoxide, an aldehyde compounds such as formaldehyde, acetaldehyde, and glyoxal, a formate compound such as methyl formate, butyl formate, and triethyl o-formate, a reducing organic compound such as glucose, ascorbic acid, and hydroquinone, and a mixture containing at least one of those reducing organic compounds.

Specific examples of the pyrolysis promoter include hydroxyalkylamines such as ethanolamine, methyldiethanolamine, triethanolamine, propanolamine, butanolamine, hexanolamine, and dimethylethanolamine; an amine compound such as piperidine, N-methylpiperidine, piperazine, N,N'-dimethylpiperazine, 1-amino-4-methylpiperazine, pyrrolidine, N-methylpyrrolidine, and morpholine; alkyl oximes such as acetone oxime, dimethylglyoxime, 2-butanone oxime, and 2,3-butadione monooxime; glycols such as ethylene glycol, diethylene glycol, and triethylene glycol; alkoxyalkylamines such as methoxyethylamine, ethoxyethylamine, and methoxypropylamine; alkoxyalkanols such as methoxyethanol, methoxypropanol, and ethoxyethanol; ketones such as acetone, methyl ethyl ketone, and methyl isobutyl ketone; ketone alcohols such as acetol and diacetone alcohol; polyhydric phenol compounds; a phenol resin, an alkyd resin, pyrrole and a resin prepared by oxidative polymerization of monomers such as ethylene dioxythiophene (EDOT).

Meanwhile, a solvent may be necessary in some cases for viscosity control of the silver coating liquid composition or for smooth formation of a thin film. Examples of the solvent which may be used at that time include water, alcohols such as methanol, ethanol, isopropanol, 1-methoxypropanol, butanol, ethylhexyl alcohol, and terpineol, glycols such as ethylene glycol and glycerin, acetates such as ethyl acetate, butyl acetate, methoxypropyl acetate, carbitol acetate, and ethylcarbitol acetate, ethers such as methyl cellosolve, butyl cellosolve, diethyl ether, tetrahydrofuran, and dioxane, ketones such as methyl ethyl ketone, acetone, dimethylformamide, and 1-methyl-2-pyrrolidone, hydrocarbon solvents such as hexane, heptane, dodecane, paraffin oil, and mineral spirit, aromatic hydrocarbon solvents such as benzene, toluene and xylene, halogenated solvents such as chloroform, methylene chloride, and carbon tetrachloride, acetonitrile, dimethyl sulfoxide, and a mixture thereof.

(3-2) Nitrogen-Containing Cyclic Compound

For forming the silver reflective layer, if the silver reflective layer is formed by heating and calcining a coating film containing a silver complex compound having a vaporizable/releasable ligand, it is preferable to contain a nitrogen-containing cyclic compound in a layer which is adjacent to the silver reflective layer. The nitrogen-containing cyclic compound having a silver-adsorbing group is preferably used as a corrosion inhibitor of the silver reflective layer.

By using the nitrogen-containing cyclic compound having a silver-adsorbing group as a corrosion inhibitor, desired anti-corrosion effect for the silver reflective layer can be obtained. The nitrogen-containing cyclic compound as a corrosion inhibitor is preferably at least one kind selected from a compound having a pyrrole ring, a compound having a triazole ring, a compound having a pyrazole ring, a compound having an imidazole ring, a compound having an indazole ring, or a mixture of one or more of them.

Examples of the compound having a pyrrole ring include N-butyl-2,5-dimethyl pyrrole, N-phenyl-2,5-dimethylpyrrole, N-phenyl-3-formyl-2,5-dimethylpyrrole, N-phenyl-3,4-diformyl-2,5-dimethylpyrrole, and a mixture thereof.

Examples of the compound having a triazole ring include 1,2,3-triazole, 1,2,4-triazole, 3-mercapto-1,2,4-triazole, 3-hydroxy-1,2,4-triazole, 3-methyl-1,2,4-triazole, 1-methyl-1,2,4-triazole, 1-methyl-3-mercapto-1,2,4-triazole, 4-methyl-1,2,3-triazole, benzotriazole, tolyltriazole, 1-hydroxybenzotriazole, 4,5,6,7-tetrahydrotriazole, 3-amino-1,2,4-triazole, 3-amino-5-methyl-1,2,4-triazole, carboxybenzotriazole, 2-(2'-hydroxy-5'-methylphenyl)benzotriazole, 2-(2'-hydroxy-5'-tert-butylphenyl)benzotriazole, 2-(2'-hydroxy-3'5'-di-tert-butylphenyl)benzotriazole, 2-(2'-hydroxy-4'-octoxyphenyl)benzotriazole, and a mixture thereof.

Examples of the compound having a pyrazole ring include pyrazole, pyrazoline, pyrazolone, pyrazolidine, pyrazolidone, 3,5-dimethylpyrazole, 3-methyl-5-hydroxypyrazole, 4-aminopyrazole, and a mixture thereof.

Examples of the compound having an imidazole ring include imidazole, histidine, 2-heptadecyl imidazole, 2-methyl imidazole, 2-ethyl-4-methyl imidazole, 2-phenyl imidazole, 2-undecyl imidazole, 1-benzyl-2-methyl imidazole, 2-phenyl-4-methyl imidazole, 1-cyanoethyl-2-methyl imidazole, 1-cyanoethyl-2-phenyl imidazole, 1-cyanoethyl-2-ethyl-4-methyl imidazole, 1-cyanoethyl-2-undecyl imidazole, 2-phenyl-4-methyl-5-hydromethyl imidazole, 2-phenyl-4,5-dihydroxymethyl imidazole, 4-formyl imidazole, 2-methyl-4-formyl imidazole, 2-phenyl-4-formyl imidazole, 4-methyl-5-formyl imidazole, 2-ethyl-4-methyl-5-formyl imidazole, 2-phenyl-4-methyl-4-formyl imidazole, 2-mercaptobenzimidazole, and a mixture thereof.

Examples of the compound having an indazole ring include 4-chloroindazole, 4-nitroindazole, 5-nitroindazole, 4-chloro-5-nitroindazole, and a mixture thereof.

(3-3) Anti-Oxidant

For the purpose of preventing corrosion of the metal reflective layer 3, an anti-oxidant can be used.

As an anti-oxidant for the metal reflective layer 3, a phenol-type anti-oxidant, a thiol-type anti-oxidant, and a phosphite-type anti-oxidant are preferably used.

Examples of the phenol-type anti-oxidant include 1,1,3-tris(2-methyl-4-hydroxy-5-t-butylphenyl)butane, 2,2'-methylene bis(4-ethyl-6-t-butylphenol), tetrakis-[methylene-3-(3',5'-di-t-butyl-4'-hydroxyphenyl)propionate]methane, 2,6-di-t-butyl-p-cresol, 4,4'-thiobis(3-methyl-6-t-butylphenol), 4,4'-butylidenebis(3-methyl-6-t-butylphenol), 1,3,5-tris(3',5'-di-t-butyl-4'-hydroxybenzyl)-S-triazine-2,4,6-(1H,3H,5H)trione, stearyl-β-(3,5-di-t-butyl-4-hydroxyphenyl)propionate, triethylene glycol bis[3-(3-t-butyl-5-methyl-4-hydroxyphenyl)propionate], 3,9-bis[1,1-di-methyl-2-[β-(3-t-butyl-4-hydroxy-5-methylphenyl)propionyloxy]ethyl]-2,4,8,10-tetraoxaspiro[5,5]undecane, and 1,3,5-trimethyl-2,4,6-tris(3,5-di-t-butyl-4-hydroxybenzyl)benzene. As for the phenol type anti-oxidant, those having a molecular weight of not less than 550 are particularly preferred.

Examples of the thiol-type anti-oxidant include distearyl-3,3'-thiodipropionate and pentaerythritol-tetrakis-(β-laurylthiopropionate).

Examples of the phosphite-type anti-oxidant include tris (2,4-di-t-butylphenyl)phosphite, distearylpentaerythritol diphosphite, di(2,6-di-t-butylphenyl)pentaerythritol diphosphite, bis-(2,6-di-t-butyl-4-methylphenyl)-pentaerythritol diphosphite, tetrakis(2,4-di-t-butylphenyl)-4,4'-biphenylene-diphosphonite, and 2,2'-methylene bis(4,6-di-t-butylphenyl)octylphosphite.

Meanwhile, the above anti-oxidant and the following photostabilizer can be used in combination.

Examples of the hindered amine-type photostabilizer include bis(2,2,6,6-tetramethyl-4-piperidyl)sebacate, bis(1,2,2,6,6-pentamethyl-4-piperidyl)sebacate, bis(1,2,2,6,6-pentamethyl-4-piperidyl)-2-(3,5-di-t-butyl-4-hydroxybenzyl)-2-n-butyl malonate, 1-methyl-8-(1,2,2,6,6-pentamethyl-4-piperidyl)-sebacate, 1-[2-[3-(3,5-di-t-butyl-4-hydroxyphenyl)propionyloxy]ethyl]-4-[3-(3,5-di-t-butyl-4-hydroxyphenyl)propionyloxy]-2,2,6,6-tetramethylpiperidine, 4-benzoyloxy-2,2,6,6-tetramethylpiperidine, tetrakis(2,2,6,6-tetramethyl-4-piperidyl)-1,2,3,4-butane-tetracarboxylate, triethylene diamine, and 8-acetyl-3-dodecyl-7,7,9,9-tetramethyl-1,3,8-triazaspiro[4,5]decane-2,4-dione.

Further, a nickel-type ultraviolet stabilizer such as [2,2'-thiobis(4-t-octylphenolate)]-2-ethylhexylamine nickel (II), nickel complex-3,5-di-t-butyl-4-hydroxybenzyl.phosphoric acid monoethylate, and nickel.dibutyl-dithiocarbamate can be also used.

As for the hindered amine-type photostabilizer, hindered amine-type photostabilizer containing only a tertiary amine is particularly preferred, and specific examples thereof include bis(1,2,2,6,6-pentamethyl-4-piperidyl)-sebacate, and bis(1,2,2,6,6-pentamethyl-4-piperidyl)-2-(3,5-di-t-butyl-4-hydroxybenzyl)-2-n-butylmalonate. Further, a condensate of 1,2,2,6,6-pentamethyl-4-piperidinol/tridecylalcohol and 1,2,3,4-butanetetracarboxylic acid is also preferred.

(4) Dielectric Reflective Layer (Interface Reflective Layer)

The dielectric reflective layer 6 as an interface reflective layer has at least one set of a high refractive index layer and a low refractive index layer that are adjacent to each other, and at least one or preferably both of the high refractive index layer and the low refractive index layer contains a water soluble polymer and metal oxide particles (dielectrics).

The interface between the high refractive index layer and the low refractive index layer in the dielectric reflective layer 6 becomes a reflective surface. Meanwhile, when the high refractive index layer and the low refractive index layer are laminated alternately, the layer number of each layer can be any number, and the entire layer number can be either an even number (that is, the high refractive index layer and the low refractive index layer are present in equal layer number) or an odd number (that is, there is one more layer of any one of the high refractive index layer and the low refractive index layer).

The dielectric reflective layer (interface reflective layer) 6 is explained in detail hereinbelow.

As described above, in the present invention, by forming a region in which both of a high refractive index material in the high refractive index layer and a low refractive index material in the low refractive index layer are present between the high refractive index layer and the low refractive index layer, desired favorable reflection is achieved at an interface between the high refractive index layer and the low refractive index layer in the interface reflective layer.

Specifically, the film mirror of the present invention is provided with an interface reflective layer in which the high refractive index layer and the low refractive index layer containing a water soluble polymer and metal oxide particles are laminated alternately, and it is characterized in that, at the time of forming the interface reflective layer, a mix region of the high refractive index layer and the low refractive index layer is formed between the high refractive index layer A and the low refractive index layer C by forming the high refractive index layer A (refractive index: nA) and the low refractive index layer C (refractive index: nC) by simultaneous multilayer coating. According to forming a mix region by simultaneous multilayer coating, the number of coating steps can be reduced compared to a case of installing a separate layer B, and it enables a huge cost reduction.

Specifically, when a coating liquid of the high refractive index layer and a coating liquid of the low refractive index layer are used for the simultaneous multilayer coating, compositional components of each coating liquid (that is, a high refractive index material and a low refractive index material) are mixed with each other until the time for setting described below, and as a result, a mix region in which component ratio varies continuously according to mixing of the high refractive index material and the low refractive index material can be formed at an interface.

As described above, by forming an alternate laminate (that is, alternately laminated unit) of the high refractive index layer A (refractive index: nA) and the low refractive index layer C (refractive index: nC) by simultaneous multilayer coating which uses a coating liquid of the high refractive index layer and a coating liquid of the low refractive index layer, the refractive index varies continuously at an interface at which each layer is mixed with each other, and therefore a region with average refractive index of about $nB=\sqrt{nAnC}$ (that is, a layer corresponding to layer B) can be formed.

In a structure having alternately and continuously varying the refractive index by mixing of each layer, the profile of the refractive index of the interface reflective layer in thickness direction is, when (maximum refractive index)−(minimum refractive index)=Δn, such that, with regard to the maximum refractive index, the position with (maximum refractive index)−Δn/3 is preferably in the range of 0.9/3 to 1.1/3 from the maximum refractive index point relative to the width from the maximum refractive index to the minimum refractive index (that is, layer thickness). Further, with regard to the minimum refractive index, the position with (minimum refractive index)+Δn/3 is preferably in the range of 0.9/3 to 1.1/3 from the minimum refractive index point relative to the width from the maximum refractive index to the minimum refractive index (that is, layer thickness).

By having a continuous variation in the refractive index as described above, an alternately laminated structure of the high refractive index layer A and the low refractive index layer C can be achieved, and also according to a continuous and smooth variation of the refractive index rather than a stepwise variation, the reflection in a side band region which is closer to the reflective wavelength region of a main reflective band is also inhibited. Further, even when the fluctuating film thickness is yielded during the production process, an interface reflective layer with high robust property of the optical reflection characteristics is obtained. Meanwhile, the refractive index profile preferably exhibits a sign curve.

Thus, the alternate laminate of the present invention is an alternate laminate obtained not by individual alternate lamination of the high refractive index layer A, the layer B with medium refractive index, and the low refractive index layer C in the order of ABC as described above but by forming simultaneous multilayer coating of a coating liquid of the high refractive index layer and a coating liquid of the low refractive index layer, in which the refractive index continuously varies in the mix region from the high refractive index layer A to the low refractive index layer C. Meanwhile, a state with continuously varying refractive index in the interface reflective layer can be determined by observing the concentration profile of metal oxides described below.

Further, when the width (layer thickness) from the maximum refractive index to the minimum refractive index is T in the refractive index profile in the film thickness direction, if the span of the width (layer thickness) T is divided into T/4 and the minimum value of the refractive index difference in any T/4 section is ΔS, it is preferable that $(\Delta n/16) \leq \Delta S \leq (\Delta n/2)$ is satisfied. As described herein, Δn indicates the difference between the maximum refractive index and the minimum refractive index. For those having continuous refractive index, ΔS has the refractive index difference (Δn/16) of predetermined value or higher. When the difference is Δn/2 between all T/4, the refractive index varies linearly.

Accordingly, by adopting an alternate laminate with a structure in which the refractive index continuously varies, the average visible ray reflectivity can be increased and also irregular reflection can be suppressed.

The laminate configuration described above can be obtained with good productivity by simultaneous multilayer coating of a coating liquid of the high refractive index layer and a coating liquid of the low refractive index layer, and it is also possible to prepare it with a large area. Further, the robust property of the optical reflection characteristics is high even with a fluctuation in film thickness, and in particular, an interface reflective layer having excellent optical characteristics in visible range, which can be easily affected by a fluctuation in film thickness due to requirement for a film thickness as thin as several tens of nanometers, can be obtained.

In the alternate laminate (that is, interface reflective layer) in which a mix region of the high refractive index layer and the low refractive index layer is formed by simultaneous multilayer coating, the high refractive index layer contains titanium oxide as a high refractive index material and the low refractive index layer contains silicon oxide as a low refractive index material, for example, and by measuring the concentration profile of metal oxides in the film thickness direction of the laminate, the composition can be determined. The composition obtained as the concentration profile of metal oxides in the film thickness direction of the laminate can be converted into a refractive index.

Meanwhile, the concentration profile of metal oxides of the laminate can be observed by performing etching in a depth direction from the surface by using a sputtering method, performing the sputtering at rate of 0.5 nm/min when the outermost layer is 0 nm, and measuring the atomic composition ratio using an XPS surface analyzer. As for the XPS surface analyzer, any model can be used, but ESCALAB-200R manufactured by VG Scientific is used. Mg is used for the X ray anode, and the measurement is made with output of 600 W (acceleration voltage of 15 kV and emission current of 40 mA).

(4-1) Designing Laminate

According to the present invention, the refractive index difference between two adjacent layers (that is, the high refractive index layer and the low refractive index layer) is preferably 0.2 or more, and more preferably 0.3 or more. Further, although not particularly limited, the upper limit is usually 1.4 or less. In the laminate of the present invention, because the boundary between the high refractive index layer and the low refractive index layer is a mix region and the high refractive index layer and the low refractive index layer are formed by simultaneous multilayer coating, it is conveniently explained as a bilayer. As described herein, the refractive index difference between the high refractive index layer and the low refractive index layer is actually a difference between the maximum refractive index point in a high reflection region and the minimum refractive index point in a low reflection region.

Also in the explanations given below, the interface reflective layer will be conveniently described as a bilayer configuration with a high refractive index layer and a low refractive index layer.

Reflection on an interface between adjacent layers depends on the refractive index ratio between the layers, and thus the reflectivity increases as the refractive index ratio increases. Further, when an optical path difference between reflected light on layer surface and reflected light at bottom of the layer is set to have a relationship represented by n·d=wavelength/4 when seen from a single layer film, control can be made to strengthen both reflected light based on phase difference, and thus the reflectivity can be increased.

In other words, by using the optical path difference, the reflectivity can be controlled. Meanwhile, n represents refractive index, d represents a physical film thickness of layer, and n·d represents optical film thickness.

Further, by using the relationship after setting a reflection center wavelength or the like and adjusting the refractive index of each layer and film thickness, the visible light or near infrared light reflection can be controlled. In other words, with the refractive index of each layer, film thickness of each layer, and a method of laminating each layer, the reflectivity in a specific wavelength region can be enhanced.

According to the present invention, it is preferable to form, for at least one region of visible light, a region in which visible light average reflectivity is from 30% to 100%. According to the interface reflective layer of the present invention, the refractive index of the high refractive index layer is preferably 1.70 to 2.50, and more preferably 1.80 to 2.20. Further, the refractive index of the low refractive index layer is preferably 1.10 to 1.60, and more preferably 1.30 to 1.55. The film thickness for visible light reflection is, according to the aforementioned equation of n·d=wavelength/4, preferably 30 nm to 130 nm, and more preferably 50 nm to 85 nm for one layer.

As described herein, the visible light average reflectivity can be measured by, after adhering a 5° reflection unit on a spectrophotometer (model U-4000, manufactured by Hitachi Corporation), measuring the reflectivity at 151 points at 2 nm interval in the range of 400 to 700 nm while having the surface side of the optical reflective layer as a surface for measurement, and dividing the sum of obtained reflectivity by 151.

Further, in the alternate laminate of the interface reflective layer (the high refractive index layer and the low refractive index layer), a thick film layer with a film thickness of 600 nm to 1200 nm can be preferably used for any one layer. The thick film layer has effects of (1) broadening the wavelength region for reflection, (2) improving the adhesiveness to a supporting substrate when used as a layer adjacent to the supporting substrate, and (3) improving the physical properties of a film attached with a laminate film as the thick film exhibits a function of relieving stress. The film thickness of the thick film layer is more preferably 700 nm to 1000 nm.

Further, for the interface reflective layer, plural alternate lamination units can be used. By varying the optical film thickness for each unit, effects such as (1) the wavelength region for reflection can be broadened, (2) the band edge can be sharpened, (3) the ripple can be reduced, (4) the high-dimensional reflection can be suppressed, (5) the band shift can be reduced by a change in an incident angle, (6) the change in optical reflection characteristics caused by a polarization difference can be suppressed, or the like is obtained, and therefore useful. In particular, with regard to (1), a reflective film of total light reflection mode can be formed by laminating a unit for reflecting visible light and a unit for reflecting near infrared light without using a light absorbing agent.

Further, letting that the interface reflective layer consists of an alternate laminate of the high refractive index layer and the low refractive index layer and the total number of the layers of the high refractive index layer and the low refractive index layer is n, the n/2 position, that is, the ½ position of the total number of the layers, is a central point, and the total film thickness from the central point to the constitutional layer at the resin substrate side (also referred to as a lower layer region) is Σd1 and the total film thickness from the central point to the constitutional layer at the outermost layer (also referred to as an upper layer region) is Σd2, the film thickness ratio Σd1/Σ2 is preferably 1.05 to 1.80.

When the total number of the layers n has an even number, the boundary region (n/2) between the lower layer region from the layer 1 to layer n/2 and the upper layer region from layer n/2+1 to the layer n becomes an interface between the layer n/2 and the layer n/2+1.

When n has an odd number, the layer corresponding to the boundary region (n+½) is a central point, the total film thickness of the constitutional layer from the central point to the resin substrate excluding the layer corresponding to the boundary region (n+½) on the lower layer side of the layer corresponding to the boundary region (n+½) is defined as Σd1, and the total film thickness of the constitutional layer from the central point to the outermost layer excluding the layer corresponding to the boundary region (n+½) on the upper layer side of the layer corresponding to the boundary region (n+½) is defined as Σd2.

(4-2) Water Soluble Polymer

Examples of the synthetic polymer which is applicable to the present invention include polyvinyl alcohols, polyvinyl pyrrolidones, an acrylic resin such as polyacrylic acid, acrylic acid-acrylonitrile copolymer, potassium acrylate-acrylonitrile copolymer, vinyl acetate-acrylic acid ester copolymer, or acrylic acid-acrylic acid ester copolymer; styrene acrylic acid resin such as styrene-acrylic acid copolymer, styrene-methacrylic acid copolymer, styrene-methacrylic acid-acrylic acid ester copolymer, styrene-α-methyl styrene-acrylic acid copolymer, or styrene-α-methyl styrene-acrylic acid-acrylic acid ester copolymer, styrene-sodium styrene sulfonate copolymer, styrene-2-hydroxy ethyl acrylate copolymer, styrene-2-hydroxy ethyl acrylate-potassium styrene sulfonate copolymer, styrene-maleic acid copolymer, styrene-maleic anhydride copolymer, vinyl naphthalene-acrylic acid copolymer, vinyl naphthalene-maleic acid copolymer; and a vinyl acetate copolymer such as vinyl acetate-maleic acid ester copolymer, vinyl acetate-crotonic acid copolymer, vinyl acetate-acrylic acid copolymer, and salts thereof. Among these, preferred examples include polyvinyl alcohols, polyvinyl pyrrolidones and copolymers containing the same.

In particular, examples of the water soluble polymer which is applicable to the present invention include polyvinyl alcohols, gelatin, and thickening polysaccharides, and the interface reflective layer (high refractive index layer, low refractive index layer) preferably contains at least one of polyvinyl alcohols, gelatin, and thickening polysaccharides.

Meanwhile, the weight average molecular weight of the water soluble polymer is preferably from 1,000 to 200,000. Further, the weight average molecular weight is more preferably from 3,000 to 40,000.

Examples of the polyvinyl alcohols preferably used in the interface reflective layer (high refractive index layer, low refractive index layer) include normal polyvinyl alcohols obtained by the hydrolysis of polyvinyl acetate as well as modified polyvinyl alcohols such as polyvinyl alcohols having the cationically modified terminal and anionically modified polyvinyl alcohols having an anion group.

With respect to polyvinyl alcohols obtained by the hydrolysis of vinyl acetate, those having an average degree of polymerization of 1,000 or higher are preferable, and in particular, those having an average degree of polymerization of 1,500 to 5,000 are preferably used. The saponification degree is preferably 70 to 100%, and particularly preferably 80 to 99.5%.

The cationically modified polyvinyl alcohol is a polyvinyl alcohol containing primary to tertiary amino groups or a quaternary ammonium group in the principal chain or side chain of the above-mentioned polyvinyl alcohols as described in, for example, JP 61-10483 A, and it is obtained by saponifying a copolymer of an ethylenically unsaturated monomer having a cationic group and vinyl acetate.

Examples of the ethylenically unsaturated monomer having a cationic group include trimethyl-(2-acrylamide-2,2-dimethylethyl)ammonium chloride, trimethyl-(3-acrylamide-3,3-dimethylpropyl)ammonium chloride, N-vinylimidazole, N-vinyl-2-methylimidazole, N-(3-dimethylaminopropyl)methacrylamide, hydroxyethyltrimethylammonium chloride, trimethyl-(2-methacrylamide propyl) ammonium chloride, and N-(1,1-dimethyl-3-dimethylaminopropyl)acrylamide.

The ratio of the monomer containing a cationically modified group in the cationically modified polyvinyl alcohols is 0.1 to 10% by mol, and preferably 0.2 to 5% by mol with respect to vinyl acetate.

Examples of the anionically modified polyvinyl alcohols include polyvinyl alcohols having an anionic group as described in JP 1-206088 A, a copolymer of vinyl alcohol and vinyl compound having a water soluble group as described in JP 61-237681 A and JP 63-307979 A, and a modified polyvinyl alcohol having a water soluble group as described in JP 7-285265 A.

Examples of the nonionically modified polyvinyl alcohols include polyvinyl alcohol derivatives in which polyalkylene oxide group is added to a part of vinyl alcohol as described in JP 7-9758 A; and a block copolymer of vinyl compound having a hydrophobic group and vinyl alcohol as described in JP 8-25795 A.

Meanwhile, two or more of the polyvinyl alcohols having different degrees of polymerization or different types of modification can be used in combination.

Examples of the gelatin applicable to the present invention include an acid-treated gelatin in addition to a lime-treated gelatin. Further, a hydrolyzate of gelatin and an enzyme decomposer of gelatin can be also used. Those water swellable polymers may be used singly or plural types thereof may be used.

Examples of the thickening polysaccharides which can be applicable to the present invention include generally known natural simple polysaccharides, natural complex polysaccharides, synthetic simple polysaccharides, and synthetic complex polysaccharides. For the details of these polysaccharides, see "Encyclopedia of Biochemistry (Seikagaku Jiten) second edition, published by Tokyo Kagaku Dojin", "Food Industry" volume 31 (1988) p. 21, or the like.

The thickening polysaccharides mentioned in the present invention refer to a polymer of saccharides, which has a large number of hydrogen bonding groups in the molecule. The thickening polysaccharides have a characteristic that the difference between the viscosity in a low temperature and the viscosity in a high temperature is large because the hydrogen bonding strength between the molecules differs depending on the temperature.

When metal oxide particles are added, the viscosity increases, which is assumed to be caused by the hydrogen bond with the metal oxide particles at a low temperature. It is the polysaccharides which can cause the rise in the viscosity at 40° C. of preferably 1.0 mPa·s or lager, and it is the polysaccharides which has an ability of causing viscosity rise of preferably 5.0 mPa·s or larger, and still more preferably 10.0 mPa·s or larger.

Examples of the thickening polysaccharides which are applicable to the present invention include β1-4 glucan (for example, carboxymethyl cellulose and carboxyethyl cellulose), galactan (for example, agarose, agaropectin), galactomannoglycan (for example, locust bean gum, guaran), xyloglucan (for example, tamarind gum), glucomannoglycan (for example, konjakmannan, wood-derived glucomannan, xanthane gum), galactoglucomannoglycan (for example, coniferous wood-derived glycan), arabinogalactoglycan (for example, soybean-derived glycan, microorganism-derived glycan), glucorhamnoglycan (for example, gellan gum), glycosaminoglycan (for example, hyaluronic acid, keratan sulfate), and red algae-derived natural polymer polysaccharides such as alginic acid and an alginate, agar, κ-carrageenan, λ-carrageenan, ι-carrageenan, and furcellaran.

Among these, from the viewpoint of not decreasing the dispersion stability of metal oxide fine particles coexisting in a coating liquid, thickening polysaccharides in which a constitution unit does not have a carboxylic acid group or a sulfonic acid group are preferred. Preferred examples of such polysaccharides include a thickening polysaccharide composed of only a pentose such as L-arabitose, D-ribose, 2-deoxyribose, and D-xylose; and a hexose such as D-glucose, D-fructose, D-mannose, and D-galactose. Specifically, tamarind seed gum known to be xyloglucan whose principal chain is glucose and whose side chain is xylose; guar gum, locust bean gum, tara gum known to be galactomannan whose principal chain is mannose and whose side chain is galactose; and arabinogalactan whose principal chain is galactose and whose side chain is arabinose can be preferably used.

Meanwhile, in the present invention, two or more thickening polysaccharides are preferably used in combination.

Content of the thickening polysaccharides in each refractive index layer (high refractive index layer, low refractive index layer) is preferably 5% by mass to 50% by mass, and more preferably 10% by mass to 40% by mass. However, when it is used in combination with another water soluble polymer or an emulsion resin, it is sufficient to contain at 3% by mass or more. When the thickening polysaccharides are present in a small amount, the tendency of having lower transparency due to disrupted film surface during drying the coated film increases. However, when the content is 50% by mass or less, the content of the metal oxide particles is relatively appropriate so that it is easier to have a large difference in the refractive index between the high refractive index layer and the low refractive index layer.

(4-3) Hardening Agent

In the present invention, a hardening agent is preferably used for hardening the water soluble polymer as a binder.

The hardening agent which is applicable to the present invention is not particularly limited, if it can cause a hardening reaction with the water soluble polymer. When the water soluble polymer is polyvinyl alcohol, boric acid and salts thereof are preferable, and other well known ones can be also used. The hardening agent is usually a compound which has a group capable of reacting with a water soluble polymer, or a compound capable of promoting the reaction between different groups in a water soluble polymer, and it is suitably selected depending on the type of the water soluble polymer, and used.

Specific examples of the hardening agent include epoxy-base hardening agents (diglycidyl ethyl ether, ethylene glycol diglycidyl ether, 1,4-butanediol diglycidyl ether, 1,6-diglycidyl cyclohexane, N,N-diglycidyl-4-glycidyl oxyaniline, sorbitol polyglycidyl ether, glycerol polyglycidyl ether, and the like); aldehyde-base hardening agent (formaldehyde, glyoxal, etc); active halogen-base hardening agent (2,4-dichloro-4-hydroxy-1,3,5-s-triazine, and the like); active vinyl-base compounds (1,3,5-tris(acryloyl)-hexahydro-s-triazine, bis(vinylsulfonyl)methyl ether, and the like); and aluminum alum.

When the water soluble polymer is gelatin, examples thereof include an organic film hardening agent such as a vinylsulfone compound, a urea-formalin condensate, a melanine-formalin condensate, an epoxy compound, an aziridine compound, active olefins, or an isocyanate compound, and inorganic polyvalent metal salts such as chrome, aluminum, or zirconium.

(4-4) Metal Oxide Particles

The metal oxide particles of the present invention are used as a constitutional material (dielectric material) of the low refractive index layer or the high refractive index layer. Examples of the metal oxide used in the above-mentioned purpose include titanium dioxide, silicon dioxide, zirconium oxide, zinc oxide, synthetic amorphous silica, colloidal silica, alumina, colloidal alumina, lead titanate, minium, yellow lead, zinc yellow, chromium oxide, ferric oxide, iron black, copper oxide, magnesium oxide, magnesium hydroxide, strontium titanate, yttrium oxide, niobium oxide, europium oxide, lanthanum oxide, zircon and tin oxide.

As the metal oxide particles, solid fine particles selected from titanium dioxide, silicon dioxide and alumina are preferably used. The alumina or alumina hydrate may be crystalline or amorphous, and any shapes such as amorphous particles, spherical particles or acicular particles may be employed.

For example, in the case of the gas phase method fine particle silica, the average particle diameter of a metal oxide particle dispersed in a primary particle state (particle diameter in dispersion state before coating) is preferably 100 nm or less, more preferably 4 to 50 nm and most preferably 4 to 20 nm.

The metal oxide particles are preferably in a state in which a fine particle dispersion before mixing with the water soluble polymer is dispersed to primary particles.

As for the fine particle silica having an average particle diameter of primary particle of 4 to 20 nm which is synthesized by a gas phase method and most preferably used, for example, AEROSIL manufactured by Nippon Aerosil Co., Ltd. is commercially available. The gas phase method fine particle silica can be dispersed to primary particle relatively easily by suctioning and dispersing the fine particle silica in water by, for example, Jet-Stream Inductor Mixer manufactured by Mitamura Riken Kogyo Inc.

Meanwhile, the average particle diameter of the metal oxide particle is determined as a simple average value (number average) by observing a particle per se or a particle appeared on the cross section or the surface of the layer with an electron microscope to measure the particle diameter of any 1,000 particles. As described herein, the particle diameter of each particle is represented by the diameter which is obtained under an assumption of having a circle equivalent to the projected area of the particle.

(4-4-1) Silicon Dioxide

As the metal oxide particles contained in the low refractive index layer, silicon dioxide (silica) is preferably used, and acidic colloidal silica sol is particularly preferably used.

Examples of the silicon dioxide (silica) which can be used in the present invention include silica, colloidal silica synthesized by a normal wet method, or silica synthesized by a gas phase method. A particularly preferably used fine particle silica is colloidal silica or fine particle silica synthesized by a gas phase method. Among them, the fine particle silica synthesized by a gas phase method is preferable in that it is unlikely to form a coarse aggregate when added to a cationic polymer.

The gas phase method fine particle silica currently available as a commercial product includes various Aerosils manufactured by Nippon Aerosil Co., Ltd.

Further, the colloidal silica preferably used in the present invention is obtained by heat-maturing a silica sol obtained by double decomposing sodium silicate by an acid or passing sodium silicate through an ion-exchange resin. As for the colloidal silica, descriptions are made in JP 57-14091 A, JP 60-219083 A, JP 60-219084 A, JP 61-20792 A, JP 61-188183 A, JP 63-17807 A, JP 4-93284 A, JP 5-278324 A, JP 6-92011 A, JP 6-183134 A, JP 6-297830 A, JP 7-81214 A, JP 7-101142 A, JP 7-179029 A, JP 7-137431 A and WO 94/26530 A. The colloidal silica preferably has an average particle diameter of 5 to 100 nm, and particularly preferably 7 to 30 nm.

The fine particle silica synthesized by a gas phase method and colloidal silica may have a surface which is cationically modified, and may be those treated with Al, Ca, Mg, Ba and the like.

Further, in the present invention, colloidal silica composite emulsion may also be used as a metal oxide particle contained in a low refractive index layer. A colloidal silica composite emulsion preferably used in the present invention has a polymer or a copolymer as a main component in the center portion of the particle, and is obtained by polymerizing a monomer having an ethylenically unsaturated bond by a conventionally known emulsion polymerization method under the presence of a colloidal silica described in JP 59-71316 A and JP 60-127371 A. The particle diameter of colloidal silica applied to the composite emulsion is preferably less than 40 nm.

Examples of the colloidal silica preferably used for the preparation of the composite emulsion usually include those having a primary particle of 2 to 100 nm. More preferably, the particle diameter is 10 nm or less for the primary particle, and 30 nm or less for the secondary particle. With those particle diameters, the haze is low, and therefore the visible light transparency is excellent.

Examples of the ethylenic monomer include a (meth) acrylic acid ester having an alkyl group having 1 to 18 carbon atoms, an aryl group, or an allyl group, styrene, α-methyl styrene, vinyl toluene, acrylonitrile, vinyl chloride, vinylidene chloride, vinyl acetate, vinyl propionate, acrylamide, N-methylolacrylamide, ethylene and butadiene, which are known materials in latex industry. As needed, vinylsilanes such as vinyltrimethoxysilane, vinyltriethoxysilane and γ-methacryloxy propyl trimethoxysilane are used for better compatibility with colloidal silica. Further, anionic monomers such as (meth)acrylic acid, maleic acid, maleic anhydride, fumaric acid and crotonic acid for dispersion stability of emulsion are used as an auxiliary agent. Meanwhile, two or more of ethylenic monomers can be used in combination as needed.

Further, the solid matter ratio of ethylenic monomer/colloidal silica in emulsion polymerization is preferably 100/1 to 200.

Examples of more preferred colloidal silica composite emulsion used in the present invention include those having glass transition point of −30 to 30° C.

Examples thereof preferred in view of the composition include an ethylenic monomer such as acrylic acid ester and methacrylic acid ester, and the particularly preferred include a copolymer of (meth)acrylic acid ester and styrene, a copolymer of (meth)acrylic acid alkyl ester and (meth) acrylic acid aralkylester, and a copolymer of (meth)acrylic acid alkyl ester and (meth)acrylic acid aryl ester.

Examples of the emulsifier used in emulsion polymerization include alkyl allyl polyether sulfonic acid sodium salt, laurylsulfonic acid sodium salt, alkyl benzene sulfonic acid sodium salt, polyoxy ethylene nonylphenyl ether nitrate sodium salt, alkyl allyl sulfosuccinate sodium salt, sulfopropyl maleic acid monoalkyl ester sodium salt.

(4-4-2) Titanium Dioxide

As the metal oxide particle contained in the high refractive index layer, $TiO_2$, ZnO and $ZrO_2$ are preferably used, and from the viewpoint of the stability of the composition containing a metal oxide particle, $TiO_2$ (titanium dioxide sol) is more preferred. Further, among $TiO_2$, rutile type rather than anatase-type is preferred since the weather resistance of the high refractive index layer or the adjacent layers is high due to a low catalytic activity of the rutile type $TiO_2$, and a high refractive index is obtained.

<Method for Producing Titanium Dioxide Sol>

The first process (process (1)) in a method of producing rutile type fine particle titanium dioxide is a process in which titanium dioxide hydrate is treated with at least one basic compound selected from the group consisting of hydroxide of alkali metal and hydroxide of alkaline-earth metal.

The titanium dioxide hydrate can be obtained by the hydrolysis of a water soluble titanium compound such as titanium sulfate or titanium chloride. The method of hydrolysis is not particularly limited and a known method may be applied. Among others, the one obtained by thermal hydrolysis of titanium sulfate is preferred.

The above-mentioned process (1) can be performed, for example, by adding the basic compound to an aqueous suspension of the titanium dioxide hydrate and treating (reacting) the resultant under a predetermined temperature condition for a predetermined time. The method of making an aqueous suspension of the titanium dioxide hydrate is not particularly limited, and may be performed by adding the titanium dioxide hydrate to water followed by stirring. The concentration of the suspension is not particularly limited, and, for example, a concentration in which the concentration of $TiO_2$ is 30 to 150 g/L in the suspension is preferred. By making the concentration in the above-mentioned range, the reaction (treatment) can efficiently proceed.

At least one basic compound selected from the group consisting of hydroxide of alkali metal and hydroxide of alkaline-earth metal used in the above-mentioned process (1) is not particularly limited, and examples thereof include sodium hydroxide, potassium hydroxide, magnesium hydroxide and calcium hydroxide. The amount of the above-mentioned basic compound added in the above-mentioned process (1) is preferably a concentration of 30 to 300 g/L as the basic compound in the reaction (treatment) suspension.

The above-mentioned process (1) is preferably performed at a reaction (treatment) temperature of 60 to 120° C. The reaction (treatment) time varies depending on the reaction (treatment) temperature, and is preferably 2 to 10 hours. The reaction (treatment) is preferably performed by adding an aqueous solution of sodium hydroxide, potassium hydroxide, magnesium hydroxide or calcium hydroxide to a suspension of titanium dioxide hydrate. After the reaction (treatment), the reacted (treated) mixture is cooled, neutralized with an inorganic acid such as a hydrochloric acid as needed followed by filtration and washing with water, thereby obtaining fine particle titanium dioxide hydrate.

The second process (process (2)) for the method of producing the rutile type fine particle titanium dioxide is a process in which a compound obtained by the process (1) is treated with a carboxylic acid group-containing compound and an inorganic acid. A method of treating a compound obtained in the above-mentioned process (1) with an inorganic acid in the production of the rutile type fine particle titanium dioxide is a known method. The particle diameter thereof can be adjusted by using a carboxylic acid group-containing compound in addition to the inorganic acid.

The carboxylic acid group-containing compound is an organic compound having a —COOH group. The carboxylic acid group-containing compound is preferably a polycarboxylic acid having two or more, more preferably, two to four carboxylic acid groups. Since the polycarboxylic acid has coordination ability to a metal atom, it is presumed that coagulation between fine particles is suppressed by coordination and thus a rutile type fine particle titanium dioxide can be suitably obtained.

The carboxylic acid group-containing compound is not particularly limited, and examples thereof include a dicarboxylic acid such as oxalic acid, malonic acid, succinic acid, glutaric acid, adipic acid, propyl malonic acid and maleic acid; a hydroxyl polyvalent carboxylic acid such as malic acid, tartaric acid and citric acid; an aromatic polycarboxylic acid such as phthalic acid, isophthalic acid, hemimellitic acid and trimellitic acid; and ethylenediamine tetraacetic acid. Two or more of these compounds may be used simultaneously in combination. Meanwhile, whole or part of the carboxylic acid group-containing compound may be a neutralized product of an organic compound having a —COOH group (for example, organic compound having —COONa group).

The inorganic acid is not particularly limited, and examples thereof include hydrochloric acid, sulfuric acid and nitric acid. The inorganic acid may be added such that the concentration thereof in the solution for reaction (treatment) is 0.5 to 2.5 mol/L, more preferably 0.8 to 1.4 mol/L.

In the above-mentioned process (2), the compound obtained in the above-mentioned process (1) is preferably suspended in pure water and, as needed, heated under stirring. The addition of a carboxylic acid group-containing compound and an inorganic acid may be at the same time or sequentially, and a sequential addition thereof is preferred. The addition may be such that the inorganic acid is added after the addition of the carboxylic acid group-containing compound or may be such that the carboxylic acid group-containing compound is added after the addition of the inorganic acid.

Examples of the above-mentioned process (2) include a method (method 1) in which, to a suspension of a compound obtained in the above-mentioned process (1), a carboxyl group-containing compound is added, heating is started and an inorganic acid is added when the liquid temperature is 60° C. or higher and preferably 90° C. or higher, followed by stirring for preferably 15 minutes to 5 hours, more preferably 2 to 3 hours while maintaining the liquid temperature.

Examples of the above-mentioned process (2) also include a method (method 2) in which a suspension of a compound obtained in the above-mentioned process (1) is heated, and an inorganic acid is added when the liquid temperature is 60° C. or higher and preferably 90° C. or higher, then a carboxylic acid group-containing compound is added in 10 to 15 minutes from the addition of the inorganic acid, followed by stirring for preferably 15 minutes to 5 hours, more preferably 2 to 3 hours while maintaining the liquid temperature.

By the methods, a suitable fine particle rutile type titanium dioxide can be obtained.

In a case where the above-mentioned process (2) is performed by the above-mentioned method 1, the carboxylic acid group-containing compound is preferably used in an amount of 0.25 to 1.5% by mol, and more preferably in a proportion of 0.4 to 0.8% by mol with respect to 100% by mol of $TiO_2$. When the amount of the carboxylic acid group-containing compound added is less than 0.25% by mol, particle growth proceeds, by which a fine particle with a desired particle diameter may not be obtained. Further, when the amount of the carboxylic acid group-containing compound added is more than 1.5% by mol, rutilization of the particle does not proceed and an anatase particle may be generated.

In a case where the above-mentioned process (2) is performed by the above-mentioned method 2, the carboxylic acid group-containing compound is preferably used in an amount of 1.6 to 4.0% by mol, and more preferably in a proportion of 2.0 to 2.4% by mol with respect to 100% by mol of $TiO_2$. When the amount of the carboxylic acid group-containing compound added is less than 1.6% by mol, particle growth proceeds, by which a fine particle with a desired particle diameter may not be obtained; and when the amount of the carboxylic acid group-containing compound added is more than 4.0% by mol, rutilization of the particle does not proceed and an anatase particle may be generated. Therefore, even when the amount of the carboxylic acid group-containing compound added is more than 4.0% by mol, the favorable effect is not obtained, which is economically disadvantageous. Further, when the addition of the carboxylic acid group-containing compound is performed in less than 10 minutes from the addition of the inorganic acid, rutilization does not proceed and an anatase particle may be generated; and when the addition of the carboxylic acid group-containing compound is performed in over 15 minutes from the addition of the inorganic acid, the particle growth proceeds too much and a fine particle with a desired particle diameter may not be obtained.

In the above-mentioned process (2), it is preferred that cooling is performed after the completion of reaction (treatment), and further neutralization is performed to obtain a pH of 5.0 to pH of 10.0. The neutralization can be performed with an alkaline compound such as aqueous sodium hydroxide solution or ammonia water. After the neutralization, by performing filtration and washing with water, a desired rutile type fine particle titanium dioxide can be isolated.

As the method of producing titanium dioxide fine particles, a known method described in such as "Titanium Oxide—Physical Properties and Applied Technology" (Manabu Kiyono pp 255 to 258 (2000) GIHODO SHUPPAN Co., Ltd.) can be used.

A preferred primary particle diameter of the titanium dioxide fine particles is preferably 4 nm to 50 nm, and more preferably 4 nm to 30 nm.

(4-5) Amino Acid

In the present invention, an amino acid is preferably added in order to improve the dispersiveness of the metal oxide particles.

The amino acid described in the present invention is a compound having an amino group and a carboxyl group in the same molecule and may be an amino acid of any types of α-, β-, γ- or the like, and is preferably an amino acid having an isoelectric point of 6.5 or less. Although some amino acids have optical isomers, there is no difference in the effect of the amino acid due to the optical isomers in the invention, and any isomer having an isoelectric point of 6.5 or less can be used alone or in a racemic body.

For a detailed explanation of amino acids applicable to the invention, see the description in "the Encyclopedia of Chemistry, vol. 1" (Kagaku Daijiten 1), an abridged edition, 1960, published by Kyoritsu Shuppan Co., Ltd", pp. 268-270.

In the present invention, examples of preferred amino acids include glycine, alanine, valine, α-aminobutyric acid, γ-aminobutyric acid, β-alanine, serine, ∈-amino-n-caproic acid, leucine, norleucine, phenylalanine, threonine, asparagine, asparagic acid, histidine, lysine, glutamine, cysteine, methionine, proline and hydroxyproline. In order to use the amino acids as an aqueous solution, the solubility thereof at the isoelectric point is preferably 3 g or more with respect to 100 g of water. For example, glycine, alanine, serine, histidine, lysine, glutamine, cysteine, methionine, proline, hydroxyproline or the like is preferably used, and from the viewpoint that the metal oxide particle has soft hydrogen bond with a binder, serine and hydroxy proline having a hydroxyl group are more preferably used.

(4-6) Other Additives

In the high refractive index layer and the low refractive index layer of the present invention, a variety of additives can be contained as needed.

For example, a variety of known additives such as: an ultraviolet absorbing agent as described in JP 57-74193 A, JP 57-87988 A, JP 62-261476 A and the like; an anti-fading agent, a variety of anionic, cationic or nonionic surfactants as described in JP 57-74192 A, JP 57-87989 A, JP 60-72785 A, JP 61-146591 A, JP 1-95091 A, JP 3-13376 A and the like; and fluorescent whitening agent, sulfuric acid, phosphoric acid, acetic acid, citric acid, sodium hydroxide, potassium hydroxide, a pH adjusting agent such as potassium carbonate, an antifoaming agent, a lubricant such as diethylene glycol, an antiseptic, an antistatic agent, a matting agent and the like as described in JP 59-42993 A, JP 59-52689 A, JP 62-280069 A, JP 61-242871 A, JP 4-219266 A and the like can also be contained in each layer.

(4-7) Simultaneous Multilayer Coating

The interface reflective layer (dielectric reflective layer) in the film mirror of the present invention can be formed by the simultaneous multilayer coating of a coating liquid in aqueous series for the high refractive index layer and a coating liquid for the low refractive index layer, which are a coating liquid containing the aforementioned water soluble polymer and metal oxide particles, followed by setting and drying.

As the coating method, for example, a roll coating method, a rod bar coating method, an air knife coating method, a spray coating method, a curtain coating method, or a slide bead coating method, an extrusion coating method or the like which uses a hopper as described in U.S. Pat. Nos. 2,761,419 and 2,761,791 is preferably used.

As described herein, the "setting" means a process in which, for example by means of decreasing the temperature of a film by blowing a cold air or the like on the film, the viscosity of a film composition is increased to lower the fluidity of materials between the layers and in each layer or to gellify it.

In the present invention, in order to form a laminate having a continuous refractive index distribution by a simultaneous multilayer coating, the mass ratio between the water soluble polymer and metal oxide particles in each coating liquid (the ratio of the metal oxide particle/the water soluble polymer (F/B)) is preferably in a range of 0.3 to 10, and more preferably in a range of 0.5 to 5. Meanwhile, the water soluble polymer constituting the coating liquid for each refractive index layer preferably contains any one of synthetic polymer like polyvinyl alcohol, thickening polysaccharides, and gelatin, and gelatin is particularly preferable. The coating liquid concentration of the water soluble polymer is preferably 0.3 to 3%, and more preferably 0.35 to 2%.

Further, the time from simultaneous multilayer coating of a high refractive index layer and a low refractive index layer to setting following sol-gel transition is preferably 5 minutes or less, and preferably 2 minutes or less. It is preferred to take 45 seconds or more. This is for the high refractive index layer A (refractive index of nA), the layer B (refractive index of nB=≈nAnC) and the low refractive index layer C (refractive index of nC) which are alternately laminated to have a refractive index profile corresponding to the case in which the ratio of the optical film thicknesses is A: 1/3, B: 1/6, C: 1/3, namely to have a refractive index profile such that the position where the refractive index has a value of (maximum refractive index)−Δn/3 with respect to the maximum refractive index is in a range of 0.9/3 to 1.1/3 with respect to the width (layer thickness) from the maximum refractive index to the minimum refractive index, from the maximum refractive index point; and also such that the position where the refractive index has a value of (minimum refractive index)+Δn/3 with respect to the minimum refractive index is in a range of 0.9/3 to 1.1/3 with respect to the width (layer thickness) from the maximum refractive index to the minimum refractive index, from the minimum refractive index point in a case where (maximum refractive index)−(minimum refractive index)=Δn.

When the time until setting is too short, preferable mixing of components may not be obtained. When the time until setting is too long, layer mixing proceeds too much, whereby a needed difference between the refractive indices may not be obtained.

The setting time can be adjusted by adjusting the concentration of the metal oxide particles, by adjusting the viscosity by other components, by adjusting mass ratio of the binder, or by adjusting with addition of various known gelling agents such as gelatin, pectin, agar, carrageenan, or a gellan gum.

Meanwhile, the time from coating to setting indicates the time until nothing sticks to a finger when the surface is pressed by a finger after applying cold air at 5 to 10° C. to the coated film.

In the case of using cold air, the temperature condition is preferably 25° C. or lower, and more preferably 10° C. or lower. The time for the coated film to be exposed to cold air depends on the coating conveying speed, but is preferably 10 seconds to 120 seconds.

When simultaneous multilayer coating is performed, the viscosity of each coating liquid is, in the case of using a slide bead coating method, preferably in a range of 5 to 100 mPa·s, and more preferably in a range of 10 to 50 mPa·s. When a curtain coating method is used, the viscosity is preferably in a range of 5 to 1200 mPa·s, and more preferably in a range of 25 to 500 mPa·s.

The viscosity of the coating liquid at 15° C. is preferably 100 mPa·s or higher, more preferably 100 to 30,000 mPa·s, still more preferably 3,000 to 30,000 mPa·s, and most preferably 10,000 to 30,000 mPa·s.

As a coating and drying method, preferred is a method in which a coating liquid is heated to 30° C. or higher, and coating is performed, and then the temperature of a film formed is cooled to a temperature of 1 to 15° C. temporarily and then it is dried at 10° C. or higher, and more preferred is a method in which the drying is performed at a wet bulb temperature in a range of 5 to 50° C., and at a film surface temperature in a range of 10 to 50° C. as a drying condition.

As a cooling method just after coating, from the viewpoint of uniformity of a film formed, a horizontal setting method is preferably used.

(5) Anchor Layer

The anchor layer 2 is made of resin to bond the resin substrate 1 to the metal reflective layer 3. Thus, the anchor layer 2 should have adhesive properties for bonding the resin substrate 1 to the metal reflective layer 3, heat resistance for withstanding heat even during the formation of the metal reflective layer 3 by vacuum vapor deposition or the like, and smoothness for unleashing the original highly-reflective performance of the metal reflective layer 3.

The resin material used in the anchor layer 2 is not particularly limited, and may be any type satisfying the requirements for adhesive properties, heat resistance, and smoothness. The resin which may be used is a homo resin such as a polyester resin, an acrylic resin, a melamine resin, an epoxy resin, a polyamide resin, a vinyl chloride resin, or a vinyl chloride-vinyl acetate copolymer resin, or a blend resin of any of these. A blend resin of a polyester resin and a melamine resin is preferred in view of weather resistance, and more preferably, such a blend resin is mixed with a curing agent such as an isocyanate to form a thermocuring resin.

As for the method for forming the anchor layer 2, a conventionally known coating method such as gravure coating, reverse coating, or die coating for coating and applying a predetermined resin material can be used.

The anchor layer 2 preferably has a thickness of 0.01 to 3 μm and more preferably 0.1 to 1 μm. When the thickness is 0.01 μm or more, favorable adhesive properties are obtained, and as it is easy to cover the irregularities of the surface of the resin substrate 1 to provide improved smoothness, which accordingly increases the reflectivity of the metal reflective layer 3, and therefore preferable. Further, when the thickness is 3 μm or less, an improvement of adhesive properties is expected, and as there is no uneven coating, the smoothness is improved and sufficient hardening of the anchor layer 2 is obtained, and therefore preferable.

(6) Resin Coat Layer

The resin coat layer 4 is a resin layer containing a corrosion inhibitor, and it is particularly preferable that the resin coat layer 4 is adjacent to the metal reflective layer 3.

The resin coat layer 4 may consist of a single layer only or plural layers. Thickness of the resin coat layer 4 is preferably 1 to 10 μm, and more preferably 2 to 8 μm.

Examples of the resin (binder) used for the resin coat layer 4 include cellulose ester, polyester, polycarbonate, polyarylate, a polysulfone-base resin (including polyether sulfone), polyester such as polyethylene terephthalate or polyethylene naphthalate, polyethylene, polypropylene, cellophane, cellulose diacetate, cellulose triacetate, cellulose acetate propionate, cellulose acetate butyrate, polyvinylidene chloride, polyvinyl alcohol, ethylene vinyl alcohol, a syndiotactic polystyrene-base resin, polycarbonate, a norbornene-base resin, polymethylpentene, polyether ketone, polyether ketone imide, polyamide, fluororesin, nylon, polymethyl methacrylate, and acrylic resin. Among them, the acrylic resin is preferable.

By coating or applying the resin material (binder) on the metal reflective layer 3 or the like, the resin coat layer 4 can be formed.

(6-1) Corrosion Inhibitor

The corrosion inhibitor preferably has an adsorptive group for silver. As described herein, the "corrosion" is referred to as a phenomenon where metal (silver) is chemically or electrochemically eroded or materially deteriorated by environmental materials surrounding the metal (silver) (see JIS Z0103-2004).

Although an optimum content of the corrosion inhibitor varies depending on a compound to be used, it is generally preferably within a range of 0.1 to 1.0/m².

The corrosion inhibitor having the adsorptive group for silver is desirably selected from at least one kind of amines and derivatives thereof, a compound having a pyrrole ring, a compound having a triazole ring such as benzotriazole, a compound having a pyrazole ring, a compound having a thiazole ring, a compound having an imidazole ring, a compound having an indazole ring, copper chelate compounds, thioureas, a compound having a mercapto group, and a naphthalene-based compound, or a mixture thereof. As for the compound such as benzotriazole, the ultraviolet absorbing agent may also function as a corrosion inhibitor. Further, a silicone-modified resin may be used and is not limited particularly.

Examples of amines and derivatives thereof include ethyl amine, lauryl amine, tri-n-butyl amine, o-toluidine, diphenyl amine, ethylene diamine, diethylene triamine, triethylene tetramine, tetraethylene pentamine, monoethanol amine, diethanol amine, triethanol amine, 2N-dimethylethanol amine, 2-amino-2-methyl-1,3-propane diol, acetamide, acrylamide, benzamide, p-ethoxychrysoidine, dicyclohexyl ammonium nitrite, dicyclohexyl ammonium salicylate, monoethanol amine benzoate, dicyclohexyl ammonium benzoate, diisopropyl ammonium benzoate, diisopropyl ammonium nitrite, cyclohexyl amine carbamate, nitronaphthalene ammonium nitrite, cyclohexyl amine benzoate, dicyclohexyl ammonium cyclohexane carboxylate, cyclohexyl amine cyclohexane carboxylate, dicyclohexyl ammonium acrylate, and cyclohexyl amine acrylate, or a mixture thereof.

Examples of the compound having a pyrrole ring include N-butyl-2,5-dimethyl pyrrole, N-phenyl-2,5-dimethylpyrrole, N-phenyl-3-formyl-2,5-dimethylpyrrole, and N-phenyl-3,4-diformyl-2,5-dimethylpyrrole, or a mixture thereof.

Examples of the compound having a triazole ring include 1,2,3-triazole, 1,2,4-triazole, 3-mercapto-1,2,4-triazole, 3-hydroxy-1,2,4-triazole, 3-methyl-1,2,4-triazole, 1-methyl-1,2,4-triazole, 1-methyl-3-mercapto-1,2,4-triazole, 4-methyl-1,2,3-triazole, benzotriazole, tolyltriazole, 1-hydroxybenzotriazole, 4,5,6,7-tetrahydrotriazole, 3-amino-1,2,4-triazole, 3-amino-5-methyl-1,2,4-triazole, carboxybenzotriazole, 2-(2'-hydroxy-5'-methylphenyl)benzotriazole, 2-(2'-hydroxy-5'-tert-butylphenyl)benzotriazole, 2-(2'-hydroxy-3'5'-di-tert-butylphenyl)benzotriazole, 2-(2'-hydroxy-4-octoxyphenyl)benzotriazole, 2-(2'-hydroxy-3'-t-butyl-5'-methylphenyl)benzotriazole, 2,2'-methylenebis[6-(2H-benzotriazole-2-yl)-4-(1,1,3,3-tetramethylbutyl)phenol] (molecular weight of 659; as a commercially available product, LA31 manufactured by ADEKA Corporation), and 2-(2H-benzotriazole-2-yl)-4,6-bis(1-methyl-1-phenylethyl) phenol (molecular weight of 447.6; as a commercially available product, Tinuvin 234 manufactured by Ciba Japan Co., Ltd.), or a mixture thereof.

Examples of the compound having a pyrazole ring include pyrazole, pyrazoline, pyrazolone, pyrazolidine, pyrazolidone, 3,5-dimethylpyrazole, 3-methyl-5-hydroxypyrazole, 4-aminopyrazole, or a mixture thereof.

Examples of the compound having a thiazole ring include thiazole, thiazoline, thiazolone, thiazolidine, thiazolidone, isothiazole, benzothiazole, 2-N,N-diethylthiobenzothiazole, P-dimethylaminobenzal rhodanine, 2-mercaptobenzothiazole, or a mixture thereof.

Examples of the compound having an imidazole ring include imidazole, histidine, 2-heptadecylimidazole, 2-methylimidazole, 2-ethyl-4-methylimidazole, 2-phenylimidazole, 2-undecylimidazole, 1-benzyl-2-methylimidazole, 2-phenyl-4-methylimidazole, 1-cyanoethyl-2-methylimidazole, 1-cyanoethyl-2-phenylimidazole, 1-cyanoethyl-2-ethyl-4-methylimidazole, 1-cyanoethyl-2-undecylimidazole, 2-phenyl-4-methyl-5-hydromethylimidazole, 2-phenyl-4,5-dihydroymethylimidazole, 4-formylimidazole, 2-methyl-4-formylimidazole, 2-phenyl-4-formylimidazole, 4-methyl-5-formylimidazole, 2-ethyl-4-methyl-5-formylimidazole, 2-phenyl-4-methyl-4-formylimidazole, 2-mercaptobenzimidazole, or a mixture thereof.

Examples of the compound having an indazole ring include 4-chloroindazole, 4-nitroindazole, 5-nitroindazole, 4-chloro-5-nitroindazole, or a mixture thereof.

Examples of copper chelate compounds include copper acetylacetone, copper ethylenediamine, copper phthalocyanine, copper ethylenediamine tetraacetate, copper hydroxyquinoline, or a mixture thereof.

Examples of thioureas include thiourea, guanylthiourea or a mixture thereof.

Examples of the compound having a mercapto group include, when the above materials are included, mercaptoacetic acid, thiophenol, 1,2-ethanediol, 3-mercapto-1,2,4-triazole, 1-methyl-3-mercapto-1,2,4-triazole, 2-mercaptobenzothiazole, 2-mercaptobenzoimidazole, glycol dimercaptoacetate, 3-mercaptopropyltrimethoxysilane, or a mixture thereof.

Examples of the naphthalene-based compound include thionalide.

(7) Gas Barrier Layer

The gas barrier layer 5 is preferably provided on the light incident side rather than the metal reflective layer 3.

Although the gas barrier layer 5 is used for preventing deterioration of the resin substrate 1 and each constitutional layer and so on supported by the resin substrate 1 due to fluctuation of humidity, particularly high humidity, the gas barrier layer may have special functions and applications and it may be provided in various manners as long as it has the deterioration preventing function.

As a moisture-proof property of the gas barrier layer 5, water vapor permeability at 40° C. and 90% RH is preferably not more than 1 g/(m²·day), more preferably not more than 0.5 g/(m²·day), and still more preferably not more than 0.2 g/(m²·day).

An oxygen permeability of the gas barrier layer 5 is preferably not more than 0.6 cm³/(m²·day·atm) under conditions of a measurement temperature of 23° C. and a humidity of 90% RH.

Examples of the method for forming the gas barrier layer 5 include a method of forming an inorganic oxide using a vacuum vapor deposition method, sputtering, an ion beam-assisted method and a chemical vapor deposition method, and a method of coating a precursor of an inorganic oxide by a sol-gel method, then applying heat treatment and/or ultraviolet irradiation treatment to a coating film thus obtained to form an inorganic oxide film is also preferably used.

(7-1) Inorganic Oxide

The inorganic oxide is formed by the localized heating from a sol made from an organic metal compound as a raw material. Examples of the inorganic oxide include an oxide of an element such as silicon (Si), aluminum (Al), zirconium (Zr), titanium (Ti), tantalum (Ta), zinc (Zn), barium (Ba), indium (In), tin (Sn), and niobium (Nb) contained in an organic metal compound. Such an inorganic oxide is, for example, silicon oxide, aluminum oxide, or zirconium oxide, of which silicon oxide is preferred.

As a method of forming an inorganic oxide, a so-called sol-gel method or a polysilazane method is preferably used. In the sol-gel method, an inorganic oxide is formed from an organic metal compound which is a precursor of the inorganic oxide. In the polysilazane method, an inorganic oxide is formed from polysilazane which is a precursor of the inorganic oxide.

(7-2) Precursor of Inorganic Oxide

The gas barrier layer 5 can be formed by coating a precursor which can form an inorganic oxide by heating and applying heat by a common heating method. It is preferable that the gas barrier layer be formed by the localized heating. The precursor is preferably an organic metal compound in the form of sol or polysilazane.

(7-3) Organic Metal Compound

An organic metal compound preferably contains at least one element selected from silicon (Si), aluminum (Al), lithium (Li), zirconium (Zr), titanium (Ti), tantalum (Ta), zinc (Zn), barium (Ba), indium (In), tin (Sn), lanthanum (La), yttrium (Y), and niobium (Nb). Particularly, it is preferable that the organic metal compound contains at least one element selected from silicon (Si), aluminum (Al), lithium (Li), zirconium (Zr), titanium (Ti), zinc (Zn), and barium (Ba). It is more preferable that the organic metal compound contains at least one element selected from silicon (Si), aluminum (Al), and lithium (Li).

Although the organic metal compound is not particularly limited as long as it can be hydrolyzed, a preferable example of the organic metal compound includes a metal alkoxide. The metal alkoxide is represented by the following formula (6).

$$MR^2_m(OR^1)_{n-m} \qquad (6)$$

In the above formula (6), M represents a metal having an oxidation number of n. $R^1$ and $R^2$ each independently represent an alkyl group and m represents an integer of 0 to (n−1). Further, $R^1$ and $R^2$ may be identical or different from each other. $R^1$ and $R^2$ are each preferably an alkyl group having carbon atoms of 4 or less, more preferably a lower alkyl group such as a methyl group $CH_3$ (hereinbelow represented as Me), an ethyl group $C_2H_5$ (hereinbelow represented as Et), a propyl group $C_3H_7$ (hereinbelow represented as Pr), an isopropyl group i-$C_3H_7$ (hereinbelow represented as i-Pr), a butyl group $C_4H_9$ (hereinbelow represented as Bu), and an isobutyl group i-$C_4H_9$ (hereinbelow represented as i-Bu).

Preferable examples of metal alkoxide represented by the above formula (6) include lithium ethoxide LiOEt, niobium ethoxide Nb(OEt)₅, magnesium isopropoxide Mg(OPr-i)₂, aluminum isopropoxide Al(OPr-i)₃, zinc propoxide Zn(OPr)₂, tetraethoxysilane Si(OEt)₄, titanium isopropoxide Ti(OPr-i)₄, barium ethoxide Ba(OEt)₂, barium isopropoxide Ba(OPr-i)₂, triethoxyborane B(OEt)₃, zirconium propoxide Zr(OPr)₄, lanthanum propoxide La(OPr)₃, yttrium propoxide Y(OPr)₃ and lead isoperoxide Pb(OPr-i)₂. Those metal alkoxides are all commercially available and can be easily obtained. A metal alkoxide is also commercially available in the form of a low condensation product, which is produced through partial hydrolysis, and also usable as a raw material.

(7-4) Sol-Gel Method

As described herein, the "sol-gel method" refers to a process in which an organic metal compound is, for example, hydrolyzed to obtain a sol of an hydroxide, the sol is dehydrated to obtain a gel, and the gel is subjected to a heat treatment, whereby a metal oxide glass of a specific form (film form, particle form, fibrous form or the like) is prepared. A multi-component metal oxide glass can be obtained by, for example, a method of mixing a plurality of different sol solutions and a method of adding other metal ions. Specifically, it is preferable that an inorganic oxide is produced by a sol-gel method having the following steps.

The sol-gel method includes a step of, in a reaction solution containing at least water and an organic solvent, subjecting an organic metal compound to hydrolysis and dehydration condensation to obtain a reaction product while controlling the pH in a range between 4.5 to 5.0 with halogen ions as a catalyst in the presence of boron ions, and a step of heating and vitrifying the reaction product at the temperature of 200° C. or less. The process is particularly preferable because of the reason that the resultant is free from formation of pores and deterioration of a film due to high-temperature heat treatment.

In the sol-gel method, although an organic metal compound used as a raw material is not limited especially as long as it can be hydrolyzed, a preferable example of an organic metal compound includes the above-mentioned metal alkoxide.

In the sol-gel method, although the organic metal compound may be used as it is in the reaction, it is preferable that when in use the organic metal compound is diluted with a solvent to facilitate control of the reaction. Any solvent for dilution may be used as long as it is a solvent which can dissolve the organic metal compound and can be uniformly mixed with water. Preferable examples of the solvent for dilution include lower aliphatic alcohols such as methanol, ethanol, propanol, isopropanol, butanol, isobutanol, ethylene glycol and propylene glycol and a mixture thereof. Moreover, a mixed solvent of butanol, cellosolve and butyl cellosolve, or a mixed solvent of xylol, cellosolve acetate, methyl isobutyl ketone and cyclohexane may be used.

When the metal in the organic metal compound is, for example, Ca, Mg, or Al, an alcohol solution of triethanol amine is preferably added to the reaction solution as a masking agent because the metal reacts with water in the reaction solution to generate a hydroxide or generates a carbonate to cause precipitates when carbonate ions $CO_3^{2-}$ exist. The concentration of the organic metal compound when it is mixed and dissolved in the solvent is preferably not more than 70% by mass. It is even more preferable for the organic metal compound to be diluted to 5 to 70% by mass in use.

The reaction solution used in the sol-gel method contains at least water and an organic solvent. Any solvent may be used as the organic solvent as long as it forms a uniform solution with water, acid, and alkali. Usually, a solution similar to aliphatic lower alcohols used to dilute the organic metal compound may be preferably used. Among the lower aliphatic alcohols, preferred are propanol, isopropanol, butanol or isobutanol which has a larger carbon number than methanol and ethanol in view of stabilizing the growth of the metal oxide glass film to be produced. The concentration of water as the rate of water in the reaction solution is preferably within a range from 0.2 to 50 mol/L.

In the sol-gel method, the organic metal compound is hydrolyzed in the reaction solution using halogen ions as a catalyst in the presence of boron ions. Trialkoxy borane $B(OR)_3$ is preferred as a compound providing boron ions $B^{3+}$. Particularly, triethoxy borane $B(OEt)_3$ is more preferred. The $B^{3+}$ ion concentration in the reaction solution is preferably within a range from 1.0 to 10.0 mol/L.

Fluorine ions and/or chlorine ions are preferred as halogen ions. Namely, fluorine ions and chlorine ions may be used either singly or as a mixture of them. Any compound may be used as long as it generates fluorine ions and/or chlorine ions in the reaction solution. Preferable examples of the fluorine ion source include compounds such as ammonium hydrogen fluoride $NH_4HF_2$ and sodium fluoride NaF. Preferable examples of the chlorine ion source include ammonium chloride $NH_4Cl$.

Although the concentration of the halogen ions in the reaction solution varies depending on the thickness of a film made of the inorganic composition having an inorganic matrix to be produced and other conditions, the concentration of the halogen ions is, in general, preferably in a range of 0.001 to 2 mol/kg, more preferably 0.002 to 0.3 mol/kg, with respect to the total mass of the reaction solution containing a catalyst. When the concentration of halogen ions is lower than 0.001 mol/kg, it becomes difficult for hydrolysis of the organic metal compound to sufficiently progress, whereby film formation becomes difficult. When the concentration of halogen ions becomes more than 2 mol/kg, the resulting inorganic matrix (metal oxide glass) tends to become non-uniform, therefore, neither case is preferable.

Regarding boron used in the reaction, when having the boron as a component of $B_2O_3$ be contained in a product as a designed composition of the obtained inorganic matrix, the product may be produced while adding the calculated amount of the organic boron compound corresponding to the content of the boron. When the boron is required to be removed, after film formation, the formed film is heated in the presence of methanol as a solvent or immersed in methanol and heated, so that the boron evaporates as methyl esters of boron and can be removed.

In a process of obtaining the reaction product by hydrolysis and dehydration condensation of the organic metal compound (that is, the previous step), generally a main solution in which a predetermined amount of the organic metal compound is dissolved and mixed in a mixed solvent containing a predetermined amount of water and an organic solvent and a predetermined amount of reaction solution containing a predetermined amount of halogen ions are mixed at a predetermined ratio and sufficiently stirred to obtain a uniform reaction solution. The reaction solution is then adjusted by acid or alkali to have a desired pH value and aged for several hours to thereby allow the reaction to progress to obtain the reaction product. A predetermined amount of the boron compound is mixed and dissolved in advance in the main solution or the reaction solution. When alkoxy borane is used, it is advantageous to dissolve it in the main solution together with another organic metal compound.

The pH of the reaction solution is selected according to the object. When the object is to form a film made of the inorganic composition having the inorganic matrix (metal oxide glass), it is preferable to adjust the pH to a range of 4.5 to 5 using an acid such as hydrochloric acid and then age the reaction solution. In this case, it is convenient to use, for example, a mixture of methyl red and bromo cresol green as an indicator.

In the sol-gel method, while the main solution and the reaction solution (containing $B^{3+}$ and halogen ions) having the same components and concentrations are mixed successively at the same rate while adjusting to have a predetermined pH value, whereby the reaction product can be easily continuously produced. The concentration of the reaction solution may vary within a range of ±50% by mass, the concentration of water (containing acid or alkali) may vary within a range of ±30% by mass, and the concentration of halogen ions may vary within a range of ±30% by mass.

Next, the reaction product obtained in the previous step (the aged reaction solution) is heated to a temperature of not more than 200° C. to be dried so as to be vitrified. In the heating, it is preferable that the temperature is gradually raised with paying special attention in a temperature range of 50 to 70° C. for the purpose of a preliminary drying (solvent vaporization) step and then the temperature is further raised. This drying step is important for forming a poreless film in the film formation. The temperature at which the reaction product is heated and dried after the preliminary drying step is preferably 70 to 150° C., more preferably 80 to 130° C.

(8) Ultraviolet Absorbing Layer

The ultraviolet absorbing layer 7 contains an ultraviolet absorbing agent. It is preferable that the ultraviolet absorbing layer 7 consists of an acrylic resin material having a light transmitting property.

As for the method of forming the ultraviolet absorbing layer 7, a method by coating can be mentioned, for example. When a coating film to obtain the ultraviolet absorbing layer 7 is formed by coating, various conventional coating methods such as spray coating, spin coating, and bar coating can be used.

Further, by directly coating an acrylic resin material containing an ultraviolet absorbing agent on a light incident side surface of the metal reflective layer 3 or on a surface of a constitutional layer (for example, the resin coat layer 4, the dielectric reflective layer 6) provided on the light incident side than the metal reflective layer 3, the ultraviolet absorbing layer 7 can be formed.

With such a coating method for forming the ultraviolet absorbing layer 7, smoothness of the ultraviolet absorbing layer 7 can be enhanced. Specifically, such a coating method can form the ultraviolet absorbing layer 7 with a center line average roughness (Ra) of 3 nm or more and 20 nm or less.

The ultraviolet absorbing layer 7 preferably has a thickness of 10 to 150 μm. The thickness of the ultraviolet absorbing layer is more preferably from 20 to 100 μm, and even more preferably from 40 to 100 μm.

The center line average roughness (Ra) as an indicator of the smoothness the ultraviolet absorbing layer 7 can be determined by the method according to JIS B 0601-1982.

Because the acrylic resin to become the ultraviolet absorbing layer 7 is hard, fine particles of a plasticizer may be contained so that a soft and less breakable, light-transmitting ultraviolet absorbing layer 7 can be obtained. A preferred example of the plasticizer is butyl rubber or butyl acrylate.

The ultraviolet absorbing layer 7 is preferably composed mainly of methacrylic resin. The methacrylic resin is a polymer containing methacrylic acid ester as a main component and it may be a homopolymer of a methacrylic acid ester or a copolymer of 50% by mass or more of a methacrylic acid ester and 50% by mass or less of any other monomer. Usually, an alkyl methacrylate is used as the methacrylic acid ester. In particular, poly(methyl methacrylate) resin (PMMA) is preferably used as the methacrylic resin.

The monomer composition of the methacrylic resin is preferably 50 to 100% by mass of a methacrylate, 0 to 50% by mass of an acrylate, and 0 to 49% by mass of any other monomer, and more preferably 50 to 99.9% by mass of a methacrylate, 0.1 to 50% by mass of an acrylate, and 0 to 49% by mass of any other monomer, with respect to the weight of all monomers.

Herein, examples of the alkyl methacrylate include methyl methacrylate, ethyl methacrylate, butyl methacrylate, and 2-ethylhexyl methacrylate, and the alkyl group generally has 1 to 8 carbon atoms, preferably 1 to 4 carbon atoms. In particular, methyl methacrylate is preferably used among them.

Further, examples of the alkyl acrylate include methyl acrylate, ethyl acrylate, butyl acrylate, and 2-ethylhexyl acrylate, and the alkyl group generally has 1 to 8 carbon atoms, preferably 1 to 4 carbon atoms.

The monomer other than the alkyl methacrylate and the alkyl acrylate may be a monofunctional monomer, specifically, a compound having one polymerizable carbon-carbon double bond in the molecule, or may be a polyfunctional monomer, specifically, a compound having at least two polymerizable carbon-carbon double bonds in the molecule. A monofunctional monomer is preferably used. Examples of such a monofunctional monomer include aromatic alkenyl compounds such as styrene, α-methylstyrene, and vinyl toluene; and alkenyl cyanide compounds such as acrylonitrile and methacrylonitrile. Examples of the polyfunctional monomer include polyhydric alcohol esters of unsaturated polycarboxylic acids such as ethylene glycol dimethacrylate, butanediol dimethacrylate and trimethylolpropane triacrylate; alkenyl esters of unsaturated carboxylic acids such as allyl acrylate, allyl methacrylate and allyl cinnamate; polyalkenyl esters of polybasic acids such as diallyl phthalate, diallyl maleate, triallyl cyanurate and triallyl isocyanurate; and aromatic polyalkenyl compounds such as divinylbenzene.

Meanwhile, if necessary, two or more of each of the alkyl methacrylates, alkyl acrylates, and other monomers may be used.

In view of the heat resistance of the film, the methacrylic resin preferably has a glass transition temperature of 40° C. or higher and more preferably 60° C. or higher. The glass transition temperature can be appropriately set by controlling the type or content of the monomers.

The methacrylic resin can be prepared by suspension polymerization, emulsion polymerization, bulk polymerization, or other types of polymerization of the constituent monomers. In this process, a chain transfer agent is preferably used during the polymerization so that an appropriate glass transition temperature can be obtained or so that an appropriate level of viscosity for exhibiting appropriate film formability can be obtained. The amount of the chain transfer agent may be determined as appropriate depending on the type or ratio of the monomers.

(8-1) Ultraviolet Absorbing Agent

Examples of the ultraviolet absorbing agent which is included in the ultraviolet absorbing layer 7 include, although not particularly limited, an organic-based ultraviolet absorbing agent such as a thiazolidone-based, a benzotriazole-based, an acrylonitrile-based, a benzophenone-based, an aminobutadiene-based, a triazine-based, a phenyl salicylate-based, and a benzoate-based and an inorganic-based ultraviolet absorbing agent including fine powder-based such as cerium oxide or magnesium oxide and titanium oxide, zinc oxide, and iron oxide. The organic-based ultraviolet absorbing agent is particularly preferable.

Examples of the organic-based ultraviolet absorbing agent which may be used include the compounds that are disclosed in publications of each of JP 46-3335 A, JP 55-152776 A, JP 5-197074 A, JP 5-232630 A, JP 5-307232 A, JP 6-211813 A, JP 8-53427 A, JP 8-234364 A, JP 8-239368 A, JP 9-31067 A, JP 10-115898 A, JP 10-147577 A, and JP 10-182621 A, publications of each of DE 19739797 A, EP 711804 A, and specifications of JP 8-501291 W, U.S. Pat. No. 1,023,859, U.S. Pat. No. 2,685,512, U.S. Pat. No. 2,739,888, U.S. Pat. No. 2,784,087, U.S. Pat. No. 2,748,021, U.S. Pat. No. 3,004,896, U.S. Pat. No. 3,052,636, U.S. Pat. No. 3,215,530, U.S. Pat. No. 3,253,921, U.S. Pat. No. 3,533,794, U.S. Pat. No. 3,692,525, U.S. Pat. No. 3,705,805, U.S. Pat. No. 3,707,375, U.S. Pat. No. 3,738,837, U.S. Pat. No. 3,754,919, and GB 1,321,355 or the like.

Examples of the benzophenone-based ultraviolet absorbing agent include 2,4-dihydroxy benzophenone, 2-hydroxy-4-methoxy-benzophenone, 2-hydroxy-4-n-octoxy-benzophenone, 2-hydroxy-4-dodesiloxy-benzophenone, 2-hydroxy-4-octadesiloxy-benzophenone, 2,2'-dihydroxy-4-methoxy-benzophenone, 2,2'-dihydroxy-4,4'-dimethoxy-benzophenone, and 2,2',4,4'-tetrahydroxy-benzophenone.

Examples of the benzotriazole-based ultraviolet absorbing agent include 2-(2'-hydroxy-5-methylphenyl)benzotriazole, 2-(2'-hydroxy-3',5'-di-t-butylphenyl)benzotriazole, 2-(2'-hydroxy-3'-t-butyl-5'-methylphenyl)benzotriazole, 2,2'-methylenebis[6-(2H-benzotriazole-2-yl)-4-(1,1,3,3-tetramethylbutyl)phenol] (molecular weight of 659; as a commercially available product, LA31 produced by ADEKA Corporation), and 2-(2H-benzotriazole-2-yl)-4,6-bis(1-methyl-1-phenylethyl)phenol (molecular weight of 447.6; as a commercially available product, Tinuvin 234 produced by Ciba Japan Co., Ltd.).

Examples of the phenyl salicylate-based ultraviolet absorbing agent include phenyl salicylate and 2-4-di-t-butylphenyl-3,5-di-t-butyl-4-hydroxy benzoate. Examples of the hindered amine-based ultraviolet absorbing agent include bis(2,2,6,6-tetra-methyl piperidine-4-yl)sebacate.

Examples of the triazine-based ultraviolet absorbing agent include 2,4-diphenyl-6-(2-hydroxy-4-methoxyphenyl)-1,3,5-triazine, 2,4-diphenyl-6-(2-hydroxy-4-ethoxyphenyl)-1,3,5-triazine, 2,4-diphenyl-(2-hydroxy-4-propoxyphenyl)-1,3,5-triazine, 2,4-diphenyl-(2-hydroxy-4-butoxyphenyl)-1,3,5-triazine, 2,4-diphenyl-6-(2-hydroxy-4-butoxyphenyl)-1,3,5-triazine, 2,4-diphenyl-6-(2-hydroxy-4-hexyloxyphenyl)-1,3,5-triazine, 2,4-diphenyl-6-(2-hydroxy-4-octyloxyphenyl)-1,3,5-triazine, 2,4-diphenyl-6-(2-hydroxy-4-dodecyloxyphenyl)-1,3,5-triazine, 2,4-diphenyl-6-(2-hydroxy-4-benzyloxyphenyl)-1,3,5-triazine, [2-(4,6-diphenyl-1,3,5-triazine-2-yl)-5-(hexyl)oxyphenol] (Tinuvin 1577FF, trade name, manufactured by Ciba Japan K.K.), and [2-[4,6-bis(2,4-dimethylphenyl)-1,3,5-triazine-2-yl]-5-(octyloxy)phenol] (CYASORB UV-1164, trade name, manufactured by Cytec Industries).

Examples of the benzoate-based ultraviolet absorbing agent include 2,4-di-tert-butylphenyl-3,5-di-tert-butyl-4-hydroxybenzoate (molecular weight of 438.7; as a commercially available product, Sumisorb 400 produced by Sumitomo Chemical Company).

Among those ultraviolet absorbing agents, the ultraviolet absorbing agent with molecular weight of 400 or more are unlikely to evaporate at high boiling temperature and unlikely to scatter during molding at high temperature, and thus the weather resistance can be effectively improved by addition of a relatively small amount.

Further, because the ultraviolet absorbing agent with molecular weight of 400 or more has a low migration property from the thin ultraviolet absorbing layer 7 to other constitutional layer, and it is unlikely to get precipitated on a surface of the laminate, and thus it is preferable from the viewpoint of having excellent persistence of the effect of improving weather resistance or the like as the amount of the contained ultraviolet absorbing agent is maintained for a long period of time.

Examples of the ultraviolet absorbing agent with molecular weight of 400 or more include the benzotriazole-based such as 2-[2-hydroxy-3,5-bis($\alpha,\alpha$-dimethylbenzyl)phenyl]-2-benzotriazole or 2,2-methylenebis[4-(1,1,3,3-tetrabutyl)-6-(2H-benzotriazole-2-yl)phenol], hindered-amine based such as bis(2,2,6,6-tetramethyl-4-piperidyl)sebacate or bis (1,2,2,6,6-pentamethyl-4-piperidyl)sebacate, and a hybrid-based having structures of the hindered phenol and hindered amine in the molecule such as 2-(3,5-di-t-butyl-4-hydroxybenzyl)-2-n-butylmalonic acid bis(1,2,2,6,6-pentamethyl-4-piperidyl) or 1-[2-[3-(3,5-di-t-butyl-4-hydroxyphenyl)propionyloxy]ethyl]-4-[3-(3,5-di-t-butyl-4-hydroxyphenyl) propionyloxy]-2,2,6,6-tetramethyl piperidine, and it may be used either singly or in combination of two or more types. Among them, 2-[2-hydroxy-3,5-bis($\alpha,\alpha$-dimethylbenzyl) phenyl]-2-benzotriazole or 2,2-methylenebis[4-(1,1,3,3-tetrabutyl)-6-(2H-benzotriazole-2-yl)phenol] is particularly preferable.

Besides the above, a compound having the function of converting the energy of ultraviolet ray to vibrational energy in a molecule and emitting the vibrational energy as heat energy or the like may also be used as an ultraviolet absorbing agent. The ultraviolet absorbing agent may also be used in combination with a compound that produces an effect when used in combination with an anti-oxidant or a colorant or the like or may also be used in combination with a light stabilizer, called a quencher, capable of acting as a light energy-converting agent. When any of the above ultraviolet absorbing agents is used, the light absorption wavelength of the ultraviolet absorbing agent should be selected not to overlap the effective wavelength of the photopolymerization initiator. When a common ultraviolet absorbing agent is used, a photopolymerization initiator that produces radicals when exposed to visible light can be effectively used.

Meanwhile, if necessary, two or more of the above ultraviolet absorbing agents may be used. If necessary, any other ultraviolet absorbing agent than the above ultraviolet absorbing agents, such as a salicylic acid derivative, substituted acrylonitrile, or a nickel complex may also be added.

The content of the ultraviolet absorbing agent in the ultraviolet absorbing layer 7 is preferably from 0.1 to 20% by mass, more preferably from 1 to 15% by mass and even more preferably from 3 to 10% by mass. The ultraviolet absorbing agent content in the ultraviolet absorbing layer 7 is, in terms of the content per unit film area, preferably from 0.17 to 2.28 g/m$^2$ and more preferably from 0.4 to 2.28 g/m$^2$ or more. When the content is in the above range, sufficient weather resistance can be exhibited while contamination of the roll or the film can be prevented, which would otherwise be caused by bleed-out of the ultraviolet absorbing agent.

(8-2) Anti-Oxidant

In order to prevent deterioration of the ultraviolet absorbing layer 7, an anti-oxidant may be contained in the ultraviolet absorbing layer 7. Preferred examples of the anti-oxidant include the followings.

As an anti-oxidant, a phenol-based anti-oxidant, a thiol-based anti-oxidant and a phosphite-based anti-oxidant are preferably used.

Examples of the phenol-based anti-oxidant include 1,1,3-tris(2-methyl-4-hydroxy-5-t-butylphenyl)butane, 2,2'-methylenebis(4-ethyl-6-t-butylphenol), tetrakis-[methylene-3-(3',5'-di-t-butyl-4'-hydroxyphenyl)propionate]methane, 2,6-di-t-butyl-p-cresol, 4,4'-thiobis(3-methyl-6-t-butylphenol), 4,4'-butylidenebis(3-methyl-6-t-butylphenol), 1,3,5-tris(3',5'-di-t-butyl-4'-hydroxybenzyl)-S-triazine-2,4,6-(1H,3H,5H)trione, stearyl-β-(3,5-di-t-butyl-4-hydroxyphenyl)propionate, triethylene glycol bis[3-(3-t-butyl-5-methyl-4-hydroxyphenyl)propionate], 3,9-bis[1,1-di-methyl-2-[β-(3-t-butyl-4-hydroxy-5-methylphenyl)propionyloxy]ethyl]-2,4,8,10-tetraoxaspiro[5,5]undecane, and 1,3,5-trimethyl-2,4,6-tris(3,5-di-t-butyl-4-hydroxybenzyl)benzene. A phenol-based anti-oxidant having a molecular weight of not less than 550 is particularly preferred.

Examples of the thiol-based anti-oxidant include distearyl-3,3'-thiodipropionate and pentaerythritol-tetrakis-(β-lauryl-thiopropionate).

Examples of the phosphite-based anti-oxidant include tris(2,4-di-t-butylphenyl)phosphite, distearylpentaerythritol diphosphite, di(2,6-di-t-butylphenyl)pentaerythritol diphosphite, bis-(2,6-di-t-butyl-4-methylphenyl)-pentaerythritol diphosphite, tetrakis(2,4-di-t-butylphenyl) 4,4'-biphenylenediphosphonite, and 2,2'-methylenebis(4,6-di-t-butylphenyl) octylphosphite.

Meanwhile, in the present invention, the above antioxidant and the following photostabilizer can be used in combination.

Examples of the hindered amine-based photostabilizer include bis(2,2,6,6-tetramethyl-4-piperidyl)sebacate, bis(1,2,2,6,6-pentamethyl-4-piperidyl)sebacate, bis(1,2,2,6,6-pentamethyl-4-piperidyl)-2-(3,5-di-t-butyl-4-hydroxybenzyl)-2-n-butylmalonate, 1-methyl-8-(1,2,2,6,6-pentamethyl-4-piperidyl)-sebacate, 1-[2-[3-(3,5-di-t-butyl-4-hydroxyphenyl)propionyloxy]ethyl]-4-[3-(3,5-di-t-butyl-4-hydroxyphenyl)propionyloxy]-2,2,6,6-tetramethylpiperidine, 4-benzoyloxy-2,2,6,6-tetramethylpiperidine, tetrakis(2,2,6,6-tetramethyl-4-piperidyl)-1,2,3,4-butane-tetracarboxylate, triethylenediamine, and 8-acetyl-3-dodecyl-7,7,9,9-tetramethyl-1,3,8-triazaspiro[4,5]decane-2,4-dione.

Of the hindered amine-based photostabilizers, hindered amine-based photostabilizer containing only a tertiary amine is particularly preferred, and specific examples thereof include bis(1,2,2,6,6-pentamethyl-4-piperidyl)-sebacate, bis(1,2,2,6,6-pentamethyl-4-piperidyl)-2-(3,5-di-t-butyl-4-hydroxybenzyl)-2-n-butylmalonate. Further, a condensate of 1,2,2,6,6-pentamethyl-4-piperidinolitridecyl alcohol and 1,2,3,4-butanetetracarboxylic acid is also preferred.

In addition, a nickel-based ultraviolet stabilizer is usable as a photostabilizer, and examples of the nickel-based ultraviolet stabilizer include [2,2'-thiobis(4-t-octylphenolate)]-2-ethylhexylamine nickel (II), nickel complex-3,5-di-t-butyl-4-hydroxybenzyl.phosphoric acid monoethylate, and nickel-dibutyl-dithiocarbamate.

It is also possible to provide the ultraviolet absorbing layer 7 with an anti-static property by adding an anti-static agent thereto.

Further, a phosphorus-based flame retardant can be added to the ultraviolet absorbing layer 7. Examples of the phosphorus-based flame retardant which is used herein include one type selected from red phosphorus, triaryl phosphoric acid ester, diaryl phosphoric acid ester, monoaryl phosphoric acid ester, an aryl phosphonic acid compound, an arylphosphine oxide compound, a condensed aryl phosphoric acid ester, halogenated alkyl phosphoric acid ester, halogen-containing condensed phosphoric acid ester, halogen-containing condensed phosphonic acid ester, and a halogen-containing phosphorus acid, or a mixture of two or more types of them. Specific examples thereof include triphenyl phosphate, 9,10-dihydro-9-oxa-10-phosphaphenanthrene-10-oxide, phenylphosphonic acid, tris(β-chloroethyl)phosphate, tris(dichloropropyl)phosphate, and tris(tribromoneopentyl)phosphate.

(9) Hard Coat Layer

The hard coat layer 8 is formed for the purpose of preventing scratches or adhesion of dirts on a surface of the film mirror. The transparent hard coat layer 8 is preferably formed on an outermost layer at the light incident side.

As for the method for forming the hard coat layer 8, a conventionally known coating method such as gravure coating, reverse coating, or die coating can be mentioned. Further, in addition to coating and applying a certain material, various surface treatments or the like may be employed in combination.

Meanwhile, the thickness of the hard coat layer 8 is, from the viewpoint of obtaining sufficient scratch resistance and preventing an occurrence of warpage of the film mirror, preferably 0.05 μm to 10 μm. More preferably, it is 1 μm to 10 μm.

The material for forming the hard coat layer 8 is not particularly limited, if the transparency, weather resistance, hardness, mechanical strength, or the like are obtained. The hard coat layer 8 can be composed of, for example, acrylic resins, urethane resins, melamine resins, epoxy resins, organic silicate compounds, and silicone resins. In particular, silicone resins and acrylic resins are preferred in view of hardness and durability. Furthermore, it preferably consists of an acrylic resin of active energy ray curing type or an acrylic resin of thermocuring type from the viewpoint of curability, flexibility, and productivity.

The acrylic resin of active energy ray curing type or acrylic resin of thermocuring type is a composition including a polyfunctional acrylate, acrylic oligomer, or reactive diluent as a polymerizable curing component. The composition can optionally contain other additives, such as photoinitiators, photosensitizers, thermal polymerization initiators, and modifiers, if necessary.

Examples of the acrylic oligomer include oligomers having acrylic resin backbones bonded with reactive acrylic groups; and also polyester acrylates, urethane acrylates, epoxy acrylates, and polyether acrylates. Further examples of the acrylic oligomer used include oligomers having rigid backbones, such as melamine and isocyanuric acid, bonded with acrylic groups.

Further, the reactive diluents function not only as a solvent for a coating agent in the coating process, but also as a copolymerizable component of the coat layer as the diluents itself has a group for reacting with the monofunctional or polyfunctional acrylic oligomer.

Examples of the commercially available polyfunctional acrylic curing paints which may be used include Mitsubishi Rayon Co., Ltd.; (trade name "DIABEAM (registered trademark)" or the like), Nagase & CO., Ltd.; (trade name "DENACOL (registered trademark)" or the like), Shin-Nakamura Chemical Co., Ltd; (trade name "NK ester" (registered trademark) series, or the like), Dainippon Ink Chemical Corporation; (trade name "UNIDIC (registered trademark)" or the like), TOAGOSEI Co., Ltd.; (trade name "Aronix (registered trademark)" or the like), NOF Corporation; (trade name, "BLEMMER (registered trademark)" or the like), Nippon Kayaku Co., Ltd.; (trade name, "KAYARAD (registered trademark)" or the like), and Kyoeisha Chemical Co., Ltd.; (trade name and "LIGHT ESTER" series and "LIGHT ACRYLATE" series), or the like.

More specifically, a resin cured by irradiation of electron beam or ultraviolet ray or a thermocuring resin can be used. In particular, a thermocuring silicone-based hard coat composed of a partially hydrolyzed oligomer of an alkoxysilane compound, a hard coat composed of thermocuring polysiloxane resin, an ultraviolet curing acrylic hard coat composed of an acrylic compound having an unsaturated group, and a thermocuring inorganic material are preferable. Moreover, as such materials usable for the hard coat layer 8, there are mentioned: acrylic resin containing aqueous colloidal silica (JP 2005-66824 A); a polyurethane-based resin composition (JP 2005-110918 A); a resin film using an aqueous silicone compound as a binder (JP 2004-142161 A); a silica film or alumina containing a photocatalytic oxide such as titanium oxide, or a photocatalyst film of titanium oxide with a high aspect ratio or niobium oxide (JP 2009-62216 A); fluorine resin coating containing a photocatalyst (Pialex Technologies Corp.); organic/inorganic polysilazane films; and organic/inorganic polysilazane films containing a hydrophilicity-accelerating agent (AZ Electronic Materials Ltd.).

For the thermocuring silicone-based hard coat layer 8, a partially hydrolyzed oligomer of an alkoxysilane compound synthesized by a publicly known method can be used. An example of a synthesis method thereof is as follows. First, tetramethoxysilane or tetraethoxysilane as the alkoxysilane compound is used and it is added with a predetermined amount of water under the presence of an acid catalyst such as hydrochloric acid or nitric acid, and is allowed to proceed a reaction at room temperature to 80° C. while removing alcohol produced as a by-product. By this reaction, the alkoxysilane is hydrolyzed and further by a condensation reaction, a partially hydrolyzed oligomer of the alkoxysilane compound is obtained, in which two or more silanol groups or alkoxy groups are included in one molecule and an average degree of polymerization is 4 to 8. Next, the oligomer is added with a curing catalyst such as acetic acid or maleic acid, and an obtained mixture is dissolved in an alcohol or glycol ether-based organic solvent, whereby a thermocuring silicone-based hard coat solution is obtained. Then, the solution is coated onto an outer surface of the film mirror or the like by an application method in a usual coating and is heated and cured at a temperature of 80 to 140° C., whereby a transparent hard coat layer is formed. Note that, in this case, it is premised that the curing temperature is set at the thermal deformation temperature of the film mirror or less. Note that it is possible to form a polysiloxane-based transparent hard coat layer in a similar way by using di(alkyl or aryl) dialkoxysilane and/or mono(alkyl or aryl) trialkoxysilane in place of the tetraalkoxysilane.

For the ultraviolet curing acrylic hard coat layer 8, as the acrylic compound having the unsaturated group, there can be used a polyfunctional (meth)acrylate mixture such as pentaerythritol di(meth)acrylate, diethylene glycol di(meth)acrylate, trimethylol propane tri(meth)acrylate, and tetramethylol tetra(meth)acrylate, and the like. It is used by being blended with a photopolymerization initiator such as benzoin, benzoin methyl ether and benzophenone. Then, it is coated onto the outer surface of the reflecting film substrate and is cured by an ultraviolet ray, whereby the transparent hard coat layer 8 is formed.

Moreover, preferably, the hard coat layer 8 is subjected to a surface treatment and is thereby imparted with hydrophilicity. For example, there can be mentioned corona treatment (JP 11-172028 A), plasma surface treatment, ultraviolet/ozone treatment, surface protrusion formation (JP 2009-226613 A), surface micro processing treatment, and the like as treatment for imparting hydrophilicity.

In the case where the hard coat layer 8 is composed of an inorganic material, the hard coat layer can be formed by performing film formation for silicon oxide, aluminum oxide, silicon nitride, aluminum nitride, lanthanum oxide, lanthanum nitride and the like by the vacuum film forming methods. As the vacuum film forming methods, for example, there are a resistance heating vacuum vapor deposition method, an electron beam heating vacuum vapor deposition method, an ion plating method, an ion beam-assisted vacuum vapor deposition method, a sputtering method and the like.

Moreover, in the case where the hard coat layer 8 is composed of an inorganic material, preferably, the hard coat layer is composed of a film formed by coating a polysilazane and film-forming thereof, followed by heating and curing. In the case where a precursor of the hard coat layer contains polysilazane, then a solution which is obtained by adding a catalyst according to needs into an organic solvent containing, for example, polysilazane represented by the following formula (7), is coated on the film mirror, and thereafter, the solvent is removed by being evaporated, whereby a polysilazane layer having a layer thickness of 0.05 to 3.0 μm is left on the film mirror. Then, preferably, there is adopted a method of forming a coating film of a glass-like transparent hard coat on the film mirror by locally heating the above-described polysilazane layer under the presence of oxygen, or active oxygen, or nitrogen according to the case in an atmosphere containing water vapor:

$$—(SiR^1R^2—NR^3)_n— \quad (7)$$

In the formula (7), $R^1$, $R^2$ and $R^3$ are the same or different from one another, and each independently represent a hydrogen or a substituted or non-substituted alkyl group, aryl group, vinyl group or (trialkoxysilyl) alkyl group, and preferably, a group selected from the group consisting of hydrogen, methyl, ethyl, propyl, iso-propyl, butyl, iso-butyl, tert-butyl, phenyl, vinyl, 3-(triethoxysilyl)propyl and 3-(trimethoxysilyl)propyl. In this event, n is an integer, and n is determined so that the polysilazane can have a number average molecular weight of 150 to 150,000 g/mol.

As the catalyst, preferably, a basic catalyst is used, and particularly preferably, used is N,N-diethylethanolamine, N,N-dimethylethanolamine, triethanolamine, triethylamine, 3-morpholinopropylamine or an N-heterocyclic compound. When polysilazane is taken as a reference, a concentration of the catalyst usually ranges from 0.1 to 10% by mol, and preferably ranges from 0.5 to 7% by mol.

As one of preferable aspects, there is used a solution containing perhydropolysilazane in which all of $R^1$, $R^2$ and $R^3$ in the formula (7) are hydrogen atoms.

Moreover, in another preferable aspect, the hard coat layer 8 of the present invention contains at least one type of polysilazane represented by the following formula (8):

$$—(SiR^1R^2—NR^3)_n—(SiR^4R^5—NR^6)_p— \quad (8)$$

In the formula (8), $R^1$, $R^2$, $R^3$, $R^4$, $R^5$ and $R^6$ each independently represent hydrogen, or a substituted or non-substituted alkyl group, aryl group, vinyl group or (trialkoxysilyl)alkyl group. In this event, n and p are integers, and in particular, n is determined so that the polysilazane can have a number average molecular weight of 150 to 150,000 g/mol.

Particularly preferable ones are: a compound in which $R^1$, $R^3$ and $R^6$ represent hydrogen and $R^2$, $R^4$ and $R^5$ represent methyl; a compound in which $R^1$, $R^3$ and $R^6$ represent hydrogen, $R^2$ and $R^4$ represent methyl, and $R^5$ represents vinyl; and a compound in which $R^1$, $R^3$, $R^4$ and $R^6$ represent hydrogen and $R^2$ and $R^5$ represent methyl.

Furthermore, in still another preferable aspect, the transparent hard coat layer contains at least one type of polysilazane represented by the following formula (9).

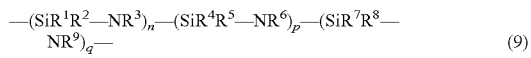

$$—(SiR^1R^2—NR^3)_n—(SiR^4R^5—NR^6)_p—(SiR^7R^8—NR^9)_q— \quad (9)$$

In the formula (9), $R^1$, $R^2$, $R^3$, $R^4$, $R^5$, $R^6$, $R^7$, $R^8$ and $R^9$ each independently represent hydrogen, or a substituted or non-substituted alkyl group, aryl group, vinyl group or (trialkoxysilyl)alkyl group. In this event, n, p and q are integers, and in particular, n is determined so that the polysilazane can have a number average molecular weight of 150 to 150,000 g/mol.

A particularly preferable one is a compound in which $R^1$, $R^3$ and $R^6$ represent hydrogen, $R^2$, $R^4$, $R^5$ and $R^8$ represent methyl, $R^9$ represents (triethoxysilyl)propyl, and $R^7$ represents alkyl or hydrogen.

A ratio of the polysilazane in the solvent is generally 1 to 80% by mass, preferably 5 to 50% by mass, and particularly preferably 10 to 40% by mass.

Particularly suitably, the solvent is an organic solvent, which does not contain water and a reactive group (for example, a hydroxyl group or an amine group) and is inert to polysilazane, and preferably, is a non-protonic solvent. For example, this is aliphatic or aromatic hydrocarbon, halogenated hydrocarbon, ester such as ethyl acetate and butyl acetate, ketone such as acetone and methyl ethyl ketone, ether such as tetrahydrofuran and dibutyl ether, mono- and poly-alkylene glycol dialkyl ether (diglymes), or a mixture composed of these solvents.

As an additional component of such a polysilazane solution, still another binder as conventionally used for producing paint can be used. For example, this is cellulose ether and cellulose ester such as ethyl cellulose, nitrocellulose, cellulose acetate and cellulose acetobutyrate, natural resin such as rubber and rosin resin, or synthetic resin such as polymer resin and condensation resin, which includes aminoplast, in particular, urea resin and melamine formaldehyde resin, alkyd resin, acrylic resin, polyester or modified polyester, epoxide, polyisocyanate or blocked polyisocyanate, or polysiloxane.

Moreover, as another component to be further added to this polysilazane mixture, for example, there can be used: an additive, which affects viscosity of the mixture, wettability of the base, film forming properties, a lubricating function or exhaust properties; or inorganic nanoparticles, which are made of, for example, $SiO_2$, $TiO_2$, ZnO, $ZrO_2$ or $Al_2O_3$.

The transparent hard coat layer 8, which has polysilazane and is formed as described above, can also be used as an oxygen.water vapor barrier film.

As one preferred example of the transparent hard coat layer 8, the hard coat layer 8 containing a polyfunctional acrylic monomer and a silicone resin can be mentioned. The polyfunctional acrylic monomer is hereinbelow referred to as an component "A", and the silicone resin is hereinbelow referred to as a component "B".

(9-1) Component "A"

The component "A" which is the polyfunctional acrylic monomer preferably has an unsaturated group and particularly an active energy ray reactive unsaturated group. The active energy ray mentioned in the present specification is preferably referred to as an electron beam or ultraviolet rays. As the polyfunctional acrylic monomer having the active energy ray reactive unsaturated group, a radical polymerization-based monomer is used, and, for example, polyfunctional acrylate-based monomer or polyfunctional methacrylate-based monomer which are two or more polyfunctional monomers having α,β-unsaturated double bond in the molecule is preferred. In addition, it may have a vinyl-type monomer, an allyl-type monomer, or a monofunctional monomer. The radical polymerization-based monomer may be used alone, or two or more kinds of the radical polymerization-based monomers may be used together in order to adjust crosslink density. As the component "A", in addition to the relatively low molecular weight compounds such as a monomer in the narrow sense whose molecular weight is less than 1000, oligomer or prepolymer having a relatively large molecular weight, for example, having a weight average molecular weight not less than 1000 and less than 10000 may be used.

Specific examples of the monofunctional (meth)acrylate monomer include 2-(meth)acryloyloxyethylphthalate, 2-(meth)acryloyloxyethyl-2-hydroxyethylphthalate, 2-(meth)acryloyloxyethylhexahydrophthalate, 2-(meth)acryloyloxypropylphthalate, 2-ethylhexyl(meth)acrylate, 2-ethylhexylcarbitol(meth)acrylate, 2-hydroxybutyl(meth)acrylate, 2-hydroxyethyl(meth)acrylate, 2-hydroxypropyl(meth)acrylate, 2-methoxyethyl(meth)acrylate, 3-methoxybutyl(meth)acrylate, 4-hydroxybutyl(meth)acrylate, benzyl(meth)acrylate, butanediol mono(meth)acrylate, butoxyethyl(meth)acrylate, butyl(meth)acrylate, caprolactone(meth)acrylate, cetyl(meth)acrylate, cresol(meth)acrylate, cyclohexyl(meth)acrylate, dicyclopentanyl(meth)acrylate, dicyclopentenyl(meth)acrylate, dicyclopentenyloxyethyl(meth)acrylate, diethylene glycol monoethyl ether (meth)acrylate, dimethylaminoethyl(meth)acrylate, dipropylene glycol (meth)acrylate, phenyl(meth)acrylate, ethyl(meth)acrylate, isoamyl(meth)acrylate, isobornyl(meth)acrylate, isobutyl(meth)acrylate, isodecyl(meth)acrylate, isooctyl(meth)acrylate, isostearyl(meth)acrylate, isomyristyl(meth)acrylate, lauroxypolyethylene glycol (meth)acrylate, lauryl(meth)acrylate, methoxydipropylene glycol (meth)acrylate, methoxytripropylene glycol (meth)acrylate, methoxypolyethylene glycol (meth)acrylate, methoxytriethylene glycol (meth)acrylate, methyl(meth)acrylate, neopentyl glycol benzoate(meth)acrylate, nonylphenoxypolyethylene glycol (meth)acrylate, nonylphenoxypolypropylene glycol (meth)acrylate, octafluoropentyl (meth)acrylate, octoxypolyethylene glycol-polypropylene glycol (meth)acrylate, octyl(meth)acrylate, paracumylphenoxyethylene glycol (meth)acrylate, perfluorooctylethyl (meth)acrylate, phenoxy(meth)acrylate, phenoxydiethylene glycol (meth)acrylate, phenoxyethyl(meth)acrylate, phenoxyhexaethylene glycol (meth)acrylate, phenoxytetraethylene glycol (meth)acrylate, polyethylene glycol (meth)acrylate, stearyl(meth)acrylate, succinic acid (meth)acrylate, t-butyl(meth)acrylate, t-butylcyclohexyl(meth)acrylate, tetrafluoropropyl(meth)acrylate, tetrahydrofurfuryl(meth)acrylate, tribromophenyl(meth)acrylate, tridecyl(meth)acrylate, trifluoroethyl(meth)acrylate, β-carboxyethyl(meth)acrylate, ω-carboxy-polycaprolactone(meth)acrylate, and derivatives and modified products thereof.

Specific examples of the polyfunctional (meth)acrylate monomer include 1,3-butylene glycol di(meth)acrylate, 1,4-butanediol di(meth)acrylate, 1,6-hexanediol di(meth)acrylate, 1,9-nonane diol di(meth)acrylate, bisphenol A di(meth)acrylate, bisphenol F di(meth)acrylate, diethylene glycol di(meth)acrylate, hexahydrophthalic acid di(meth)acrylate, hydroxypyvalic acid neopentyl glycol di(meth)acrylate, neopentyl glycol di(meth)acrylate, hydroxypyvalic acid ester neopentyl glycol di(meth)acrylate, pentaerythritol di(meth)acrylate, phthalic acid di(meth)acrylate, polyethylene glycol di(meth)acrylate, polypropylene glycol di(meth)acrylate, polytetramethylene glycol di(meth)acrylate, bisphenol A diglycidyl ether di(meth)acrylate, triethylene glycol di(meth)acrylate, tetraethylene glycol di(meth)acrylate, tricyclodecane dimethanol di(meth)acrylate, dimethylol dicyclopentanedi(meth)acrylate, neopentyl glycol modified trimethylolpropane di(meth)acrylate, tripropylene glycol di(meth)acrylate, triglycerol di(meth)acrylate, dipropylene glycol di(meth)acrylate, glycerol tri(meth)acrylate, pentaerythritol tri(meth)acrylate, phosphoric acid tri(meth) acrylate, trimethylolpropane tri(meth)acrylate, trimethylolpropane benzoatetri(meth)acrylate, tris((meth)acryloxyethyl)isocyanurate, di(meth)acrylated isocyanurate, dipentaerythritol hexa(meth)acrylate, dipentaerythritol hydroxypenta(meth)acrylate, ditrimethylolpropane tetra(meth)acrylate, pentaerythritol tetra(meth)acrylate, and derivatives and modified products thereof Examples of commercial products of the component "A" as such a polymerizable organic compound include M-400, M-408, M-450, M-305, M-309, M-310, M-315, M-320, M-350, M-360, M-208, M-210, M-215, M-220, M-225, M-233, M-240, M-245, M-260, M-270, M-1100, M-1200, M-1210, M-1310, M-1600, M-221, M-203, TO-924, TO-1270, TO-1231, TO-595, TO-756, TO-1343, TO-902, TO-904, TO-905, and TO-1330 produced by Toagosei Co., Ltd., KAYARAD D-310, D-330, DPHA, DPCA-20, DPCA-30, DPCA-60, DPCA-120, DN-0075, DN-2475, SR-295, SR-355, SR-399E, SR-494, SR-9041, SR-368, SR-415, SR-444, SR-454, SR-492, SR-499, SR-502, SR-9020, SR-9035, SR-111, SR-212, SR-213, SR-230, SR-259, SR-268, SR-272, SR-344, SR-349, SR-601, SR-602, SR-610, SR-9003, PET-30, T-1420, GPO-303, TC-1205, HDDA, NPGDA, TPGDA, PEG400DA, MANDA, HX-220, HX-620, R-551, R-712, R-167, R-526, R-551, R-712, R-604, R-684, TMPTA, THE-330, TPA-320, TPA-330, KS-HDDA, KS-TPGDA, and KS-TMPTA produced by Nippon Kayaku Co., Ltd., Light Acrylate PE-4A, DPE-6A, DTMP-4A produced by Kyoeisha Chemical Co., Ltd.

From the viewpoint of enhancing the antifouling property and the light resistance, the content of the polymerizable organic compound component "A" is preferably 10 to 90% by mass, and more preferably 15 to 80% by mass, based on 100% by mass of the total composition of "A"+"B".

(9-2) Component "B"

The silicone resin component "B" is preferably a silicone resin having an active energy ray reactive unsaturated group. The silicone resin contains polyorganosiloxane and is preferably a compound having a polyorganosiloxane chain which has an active energy ray curable unsaturated bond in the molecule. In particular, it is preferably an active energy ray curable resin component which is a vinyl copolymer with a number average molecular weight of 5000 to 100000 synthesized by reacting a polymer (a), which is obtained by polymerizing monomers including 1 to 50% by mass of a monomer (a) having a radical polymerizable double bond and a polyorganosiloxane chain, 10 to 95% by mass of a monomer (b) other than (a), which has a radical polymerizable double bond and a reactive functional group, and 0 to 89% by mass of a monomer (c) other than (a) and (b), which has a radical polymerizable double bond, with a compound (β) having a functional group capable of reacting with the aforementioned reactive functional group and a radical polymerizable double bond.

Specific examples of the monomer (a) having a radical polymerizable double bond and a polyorganosiloxane chain include a polyorganosiloxane compound having a (meth)acryloxy group at one end such as Silaplane FM-0711, FM-0721, and FM-0725 manufactured by Chisso Corporation, AC-SQ SI-20 manufactured by Toagosei Co., Ltd., and an acrylate or methacrylate containing compound of POSS (Polyhedral Oligomeric Silsesquioxane) series produced by Hybrid Plastics Inc.

One kind of or a mixture of two or more kinds of the component "B" may be used according to required performance. The proportion of polymerization is preferably 1 to 50% by mass based on the total weight of a monomer constituting a polymer, and more preferably 10 to 35% by mass. When the proportion of copolymerization of the component "B" is less than 1% by mass, it is difficult to impart an antifouling property and weather resistance to an upper surface of a cured material, and when it is more than 50% by mass, scratch resistance is lowered and, in addition, it is difficult to obtain coating performance such as compatibility with other components contained in a radiation curable composition, adhesiveness with a substrate and toughness, and solubility in a solvent for the polymer. An appropriate amount of polysiloxane can be contained in the above-mentioned component, and by adding polysiloxane according to the chemical structure or quantitative ratio of the component "B", the durability is enhanced.

It is preferable that the hard coat layer 8 has flexibility to prevent warpage. The transparent hard coat layer 8 on the outermost surface layer of a film mirror may form a dense cross-linked structure, and thus the film may be warped and bent, or a crack may be easily formed because of no flexibility, so that the handling is difficult. In such a case, it is preferable to perform design so that flexibility and flatness are obtained by adjusting an amount of an inorganic substance in a hard coat layer composition.

(9-3) Additive

It is also possible to contain an ultraviolet absorbing agent or an anti-oxidant in the hard coat layer 8. As for the ultraviolet absorbing agent or anti-oxidant, the ultraviolet absorbing agent or anti-oxidant used for the aforementioned ultraviolet absorbing layer 7 can be also used.

A particularly preferred ultraviolet absorbing agent for the hard coat layer 8 containing the polyfunctional acrylic monomer and silicone resin is a benzotriazole-based ultraviolet absorbing agent. By containing the benzotriazole-based ultraviolet absorbing agent in the hard coat layer 8, an excellent effect can be obtained that the weather resistance is further improved and, at the same time, the falling angle can be further reduced. Especially when a compound represented by the formula (10) is contained in the hard coat layer 8, the effect of reducing the falling angle is pronounced. Meanwhile, the falling angle means an angle obtained by measuring a minimum angle as follows. A water droplet is dropped on a horizontal mirror, and thereafter an inclination angle of the mirror is gradually increased. Then, the minimum angle allowing the fall of the predetermined mass of stationary water droplet is measured as the falling angle. The smaller the falling angle, the easier water droplets are rolled off from the surface, so that it can be said that the surface is a surface on which water droplets are less likely to be attached.

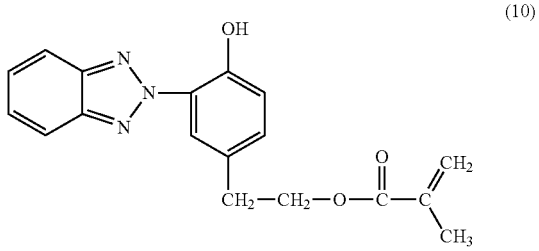
(10)

Meanwhile, the use amount of the ultraviolet absorbing agent in the hard coat layer 8 is preferably 0.1 to 20% by mass to improve the weather resistance while maintaining the adhesiveness at favorable level. More preferably, it is 0.25 to 15% by mass, and still more preferably 0.5 to 10% by mass.

As an anti-oxidant used for the hard coat layer 8, an organic-based anti-oxidant such as a phenol-based anti-oxidant, a thiol-based anti-oxidant and a phosphite-based anti-oxidant is preferably used. The falling angle can be reduced by allowing the organic-based anti-oxidant to be contained in the hard coat layer 8. The anti-oxidant and photostabilizer may be used in combination.

Examples of the hindered amine-based photostabilizer include bis(2,2,6,6-tetramethyl-4-piperidyl)sebacate, bis(1,2,2,6,6-pentamethyl-4-piperidyl)sebacate, bis(1,2,2,6,6-pentamethyl-4-piperidyl)-2-(3,5-di-t-butyl-4-hydroxybenzyl)-2-n-butylmalonate, 1-methyl-8-(1,2,2,6,6-pentamethyl-4-piperidyl)-sebacate, 1-[2-[3-(3,5-di-t-butyl-4-hydroxyphenyl)propionyloxy]ethyl]-4-[3-(3,5-di-t-butyl-4-hydroxyphenyl)propionyloxy]-2,2,6,6-tetramethylpiperidine, 4-benzoyloxy-2,2,6,6-tetramethylpiperidine, tetrakis(2,2,6,6-tetramethyl-4-piperidyl)-1,2,3,4-butane-tetracarboxylate, triethylenediamine, and 8-acetyl-3-dodecyl-7,7,9,9-tetramethyl-1,3,8-triazaspiro[4,5]decane-2,4-dione.

In particular, as the hindered amine-based photostabilizer, hindered amine-based photostabilizer containing only a tertiary amine is preferred, and specifically, bis(1,2,2,6,6-pentamethyl-4-piperidyl)-sebacate, bis(1,2,2,6,6-pentamethyl-4-piperidyl)-2-(3,5-di-t-butyl-4-hydroxybenzyl)-2-n-butyl malonate, or a condensate of 1,2,2,6,6-pentamethyl-4-piperidinol/tridecylalcohol and 1,2,3,4-butanetetracarboxylic acid is preferred.

In addition, a nickel-based ultraviolet stabilizer is usable as a photostabilizer, and examples of the nickel-based ultraviolet stabilizer include [2,2'-thiobis(4-t-octylphenolate)]-2-ethylhexylamine nickel (II), nickel complex-3,5-di-t-butyl-4-hydroxybenzyl.phosphoric acid monoethylate, and nickel-dibutyl-dithiocarbamate.

The hard coat layer 8, in particular the hard coat layer 8 containing the monofunctional acrylic monomer and silicone resin, preferably contains an initiator for starting polymerization. A photopolymerization initiator of an active energy ray (such as ultraviolet ray)-curable resin is preferably used. Examples of the initiator include benzoin and a derivative thereof, acetophenone, benzophenone, hydroxybenzophenone, Michler's ketone, α-amyloxime ester, thioxanthone and their derivatives. The initiator may be used with a photosensitizer. The above initiator can also be used as a photosensitizer. Moreover, sensitizers such as n-butylamine, triethylamine and tri-n-butylphosphine can be used when an epoxy acrylate-based initiator is used. The content of the initiator or the photosensitizer is 0.1 to 15 parts by mass, preferably 1 to 10 parts by mass, and more preferably 2 to 5 parts by mass, based on 100 parts by mass of the composition. Two types of initiators may be used together, and especially when a radical initiator is used, at least two types of initiators may be used. Radical initiators absorbing different wavelengths are preferably used, and two types of initiators having different ultraviolet absorption wavelengths are more preferably used. For example, when only an initiator absorbing a shorter wavelength is used, at times it is not able to perform polymerization reaction of all monomers with the initiator. Meanwhile, when only an initiator absorbing a longer wavelength is used, although reactivity is improved, the initiator may be colored during long-term use. Thus, it is preferable to use radical initiators which are not colored even during long-term use, improve the weather resistance, and absorb different wavelengths in order to improve the polymerization reactivity.

In the hard coat layer 8, various additives may be blended, if necessary. For example, a surfactant, a leveling agent, and an antistatic agent can be used.

The leveling agents are particularly effective to reduce surface irregularities. The preferred leveling agents are silicone-based leveling agents such as dimethylpolysiloxane-polyoxyalkylene copolymers (for example, SH190 manufactured by Dow Corning Toray Co., Ltd.).

(10) Adhesion Layer

The adhesion layer 9 has an adhesive property for allowing adhesion of the film mirror onto the supporting substrate 11. The adhesion layer 9 is a constitutional layer for forming a reflection device for photovoltaic power generation via binding the film mirror to the supporting substrate 11 based on its adhesiveness.

As for the adhesion layer 9, any one of dry lamination based, wet lamination based, adhesives, heat sealing based, and hot melt based can be used without being particularly limited. Specific examples of the adhesives include polyester resins, urethane resins, polyvinyl acetate resins, acrylic resins, and nitrile rubbers. The method of lamination for forming the adhesion layer 9 is not particularly limited, and for example, performing continuously based on a roll mode is preferred in view of economic efficiency and productivity. The adhesion layer typically has a thickness in a range of preferably about 1 to 100 μm in view of adhesive effect and drying speed.

Meanwhile, the film mirror may be provided with a peeling sheet (not illustrated) for covering the surface of the adhesion layer 9, which is opposite to the resin substrate 1. When the film mirror has a peeling sheet, after peeling the peeling sheet from the adhesion layer 9, the film mirror can be attached to the supporting substrate 11 via the adhesion layer 9.

(10-1) Peeling Sheet

The peeling sheet is a member for covering a surface of the adhesion layer 9 in the film mirror, in which the surface is opposite to the light incident side.

For example, at the time of shipping the film mirror, it is a state in which the peeling sheet is stuck to the adhesion layer 9. After that, by peeling the peeling sheet from the adhesion layer 9 of the film mirror and attaching the film mirror to the supporting substrate 11, thus a reflection device for photovoltaic power generation can be formed.

As long as the adhesiveness of the adhesion layer 9 is protected, any peeling sheet may be used. For example, used are a plastic film or sheet such as acryl film or sheet, polycarbonate film or sheet, polyarylate film or sheet, polyethylene naphthalate film or sheet, polyethylene terephthalate film or sheet, and fluorine film, a resin film or sheet in which titanium oxide, silica, aluminum powder, copper powder is kneaded into, or a resin film or sheet on which surface treatment is performed by coating the resin kneaded thereof or by metal vapor deposition of a metal like aluminum.

Thickness of the peeling sheet is not particularly limited, but it is preferable in the range of 12 to 250 μm, in general.

(11) Method for Manufacturing Film Mirror

By suitably laminating each constitutional layer described above, a film mirror for photovoltaic power generation can be manufactured.

Herein, the explanations are given having the film mirror 10d illustrated in FIG. 4A as an example.

For example, by coating a predetermined resin material on a polyethylene terephthalate film, which is the resin substrate 1 produced by melt film forming or the like, the anchor layer 2 is formed.

Subsequently, a silver reflective layer as the metal reflective layer 3 is formed on top of the anchor layer 2 by vacuum vapor deposition.

Subsequently, by coating a resin material containing a corrosion inhibitor on top of the silver reflective layer, the resin coat layer 4 is formed.

Subsequently, by performing the sol-gel method and heating/UV treatment on top of the resin coat layer 4, the gas barrier layer 5 is formed.

Subsequently, by performing simultaneous multilayer coating (aqueous coating) of a coating liquid to be the high refractive index layer and the low refractive index layer on top of the gas barrier layer 5, the dielectric reflective layer (interface reflective layer) 6 is formed.

Subsequently, by coating an acrylic resin material containing an ultraviolet absorbing agent on top of the dielectric reflective layer (interface reflective layer) 6, the ultraviolet absorbing layer 7 is formed.

Subsequently, by coating a hard coat material on top of the ultraviolet absorbing layer 7, the hard coat layer 8 is formed.

Further, by applying an adhesive material on a backside of the resin substrate 1 to form the adhesion layer 9 and covering the adhesion layer 9 with a peeling sheet, the film mirror 10d is manufactured.

Meanwhile, when the film mirror 10a, 10b, and 10c are manufactured, a desired film mirror can be manufactured by omitting a step for forming the constitutional layer not present in the film mirror 10d and laminating in a predetermined order the constitutional layer required for each film mirror on the resin substrate 1.

(12) Reflection Device for Photovoltaic Power Generation

The reflection device for photovoltaic power generation is a reflection mirror having a film mirror and the supporting substrate 11 with self-supporting property in which the film mirror is bonded to the supporting substrate 11 via the adhesion layer 9.

Meanwhile, the "self-supporting property" described herein means that, in a state of being cut to a size used as a supporting substrate of a reflection device for photovoltaic power generation, the supporting substrate 11 has rigidity to the extent that it can hold the film mirror by supporting a short edge part of the film mirror. As the supporting substrate 11 of the reflection device for photovoltaic power generation has a self-supporting property, the handling property for installing a reflection device for photovoltaic power generation becomes excellent and the supporting member for supporting the reflection device for photovoltaic power generation can have a simple constitution, and as a result, the reflection device itself can have light weight and power consumption at the time of tracking sun can be suppressed.

(12-1) Supporting Substrate

As for the supporting substrate 11 having a self-supporting property, those having a pair of flat metal plates and an intermediate layer interposed between them (type A) or those composed of a resin material with a hollow structure (type B) are preferable.

(12-2) Supporting Substrate Type A

The supporting substrate 11 has a pair of flat metal plates and an intermediate layer interposed between them. As the intermediate layer is composed of a material or a resin material with a hollow structure, the supporting substrate 11 can have not only high flatness of a flat metal plate but also a significant light weight of the supporting substrate itself compared to a case of constituting the supporting substrate only with a flat metal plate. Further, because the rigidity can be increased with a flat metal plate while using an intermediate layer with relatively light weight, it becomes possible to have a function as a supporting substrate having light weight and a self-supporting property.

Further, even for a case in which the intermediate layer is composed of a resin material, by having a layer of a resin material with a hollow structure, the weight can be further reduced.

Further, when the intermediate layer is prepared to have a hollow structure, the intermediate layer functions as a thermal insulation material. As such, transfer of the temperature change of the flat metal plate on the opposite side of the adhesion layer 9 to the film mirror is suppressed, and thus it becomes possible to prevent dew condensation or suppress the deterioration caused by heat.

As for the flat metal plate to be a surface layer of both sides of the supporting substrate 11, a metal material having high thermal conductivity such as a steel sheet, a copper sheet, an aluminum sheet, an aluminum-plated steel sheet, an aluminum alloy-plated steel sheet, a copper-plated steel sheet, a tin-plated steel sheet, a chromium-plated steel sheet, or a stainless steel sheet can be preferably used. In the present invention, a plated steel sheet, a stainless steel sheet, an aluminum sheet, or the like having good corrosion resistance are preferably used, in particular.

As the intermediate layer of the supporting substrate 11, a material like a metal, an inorganic material (glass or the like), a resin material or the like can be used.

When the intermediate layer is prepared to have a hollow structure, a foam structure consisting of a foamed resin, a three-dimensional structure having a wall consisting of a metal, an inorganic material, or a resin material (that is, honeycomb structure), or a resin material added with hollow fine particles can be applied.

The foam structure of the foamed resin indicates that gas is finely dispersed in a resin material to form a foamed shape or a porous shape. As for the material therefor, a known foamed resin material can be used. However, a polyolefin resin, polyurethane, polyethylene, polystyrene, or the like are preferably used.

The honeycomb structure is to represent a general three-dimensional structure which is constituted with plural small spaces in which the space is surrounded by side walls.

When the hollow structure of the intermediate layer is prepared to have a three-dimensional structure having a wall consisting of a resin material, a homopolymer of olefins such as ethylene, propylene, butene, isoprene pentene, or methylpentene, or polyolefin which is a copolymer of them (for example, polypropylene, high density polyethylene), polyamide, polystyrene, polyvinyl chloride, polyacrylonitrile, or an acrylic derivative such as ethylene-ethylacrylate copolymer, polycarbonate, a vinyl acetate copolymer such as ethylene-vinyl acetate copolymer, ionomer, a terpolymer such as ethylene-propylene-dienes, and a thermoplastic resin such as an ABS resin, polyolefin oxide, or polyacetal are preferably used as a resin material for forming walls. Meanwhile, they may be used either singly or as a mixture of two or more types. In particular, among the thermoplastic resins, an olefin resin or a resin having an olefin resin as a main component, and a polypropylene resin or a resin having a polypropylene resin as a main component are preferred in that they have an excellent balance in mechanical strength and molding property. The resin material may contain additives, and examples of the additives include an inorganic filler such as silica, mica, talc, calcium carbonate, glass fiber, or carbon fiber, a plasticizer, a stabilizer, a coloring agent, an anti-static agent, a flame retardant, and a foaming agent.

Further, it is also possible to have the intermediate layer which consists of a resin plate. In that case, the same materials as those for constituting the resin substrate 1 of the film mirror as explained above can be also preferably used as a resin material for constituting the intermediate layer.

Meanwhile, it is not necessary that the intermediate layer is formed on every region of the supporting substrate 11. Instead, if it is in a range guaranteeing the flatness of the flat metal plate and self-supporting property as a supporting substrate, it may be formed on a partial region. When the intermediate layer is prepared to have the aforementioned three-dimensional structure, it is preferable that the three-dimensional structure is formed on 90 to 95% or so of the region compared to the area of the flat metal plate. When a foamed resin is used, it is preferable to form on 30 to 40% or so of the region.

(12-3) Supporting Substrate Type B

It is also possible that the supporting substrate 11 is prepared as a layer consisting of a resin material with a hollow structure.

If the supporting substrate 11 is prepared as a layer consisting only of a resin material, the thickness required to obtain the rigidity for having the self-supporting property increases, and as a result, the mass of the supporting substrate 11 increases. However, by having the resin material with a hollow structure, weight of the supporting substrate 11 can be reduced while maintaining the self-supporting property.

When the supporting substrate 11 consists of a resin material with a hollow structure, it is preferable that a resin material with a hollow structure is used as an intermediate layer and a resin sheet having a smooth surface is installed as a surface layer of the both sides from the viewpoint of increasing the regular reflectivity of the film mirror. As for the material of the resin sheet, the same materials as those for constituting the resin substrate 1 of the film mirror as explained above can be also preferably used. As for the resin material with a hollow structure, the aforementioned foaming material or a resin material having a three-dimensional structure (honeycomb structure) can be preferably used.

(12-4) Supporting Member

The reflection device for photovoltaic power generation has a supporting member for supporting the reflection device itself.

The supporting member preferably supports the reflective surface (film mirror) of the reflection device for photovoltaic power generation in a state of enabling sun tracking. Shape of the supporting member is not particularly limited. However, in order for the reflection device for photovoltaic power generation to maintain the desired shape or position, it is preferable to have a shape in which multiple points of the supporting substrate 11 on a backside of the reflection device for photovoltaic power generation are supported by a rod-like columnar member or a beam-like member.

The supporting member has a constitution for maintaining the reflection device for photovoltaic power generation in a sun tracking state. For tracking the sun, the operation can be made manually, or it is possible to have a constitution of automatic sun tracking by installing a separate operation device.

EXAMPLES

The present invention will be hereinbelow specifically described by way of Examples and Comparative Examples. The film mirror of Examples corresponds to the embodiments illustrated in FIG. 1A to FIG. 4A and FIG. 8A. However, the present invention is not limited thereto. In Examples and Comparative Examples described below, terms "part(s)" and "%" are used, and unless otherwise specified, they refer to "part(s) by mass" and "% by mass", respectively.

Comparative Example 1

(Manufacture of Film Mirror of Comparative Example 1)

A biaxially-stretched polyester film (polyethylene terephthalate film having a thickness of 25 µm) was used as the resin substrate 1.

On one side of the above-mentioned polyethylene terephthalate film, a resin liquid in which polyester resin (POLYESTER SP-181 produced by Nippon Synthetic Chemical Industry Co., Ltd.), a melamine resin (Super Beckamine J-820 produced by DIC), TDI (tolylene diisocyanate)-based isocyanate (2,4-tolylene diisocyanate), and HMDI (hexamethylene diisocyanate)-based isocyanate (1,6-hexamethylene diisocyanate) are mixed in toluene such that the resin solid content ratio is 20:1:1:2 and the solid matter concentration is 10% was coated by a gravure coating method to form the anchor layer 2 with a thickness of 0.1 µm.

On the anchor layer 2, an aluminum reflective layer with a thickness of 100 nm was formed as the metal reflective layer 3 by a vacuum vapor deposition method.

Further, on the aluminum reflective layer, mixed resin of polyester resin and TDI-based isocyanate with a resin solid content ratio of 10:2 was coated by a gravure coating method to form the resin coat layer 4 with a thickness of 3.0 µm.

Figure 5A:
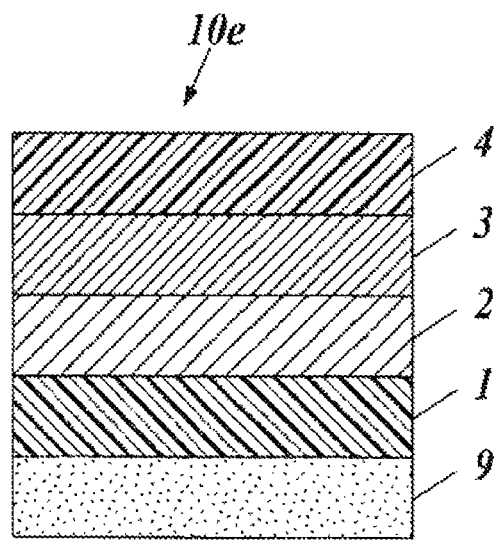
FIG. 5A is a brief cross-section drawing illustrating one exemplary configuration of the film mirror for photovoltaic power generation as a comparative example.

Further, one part of platinum-based catalyst was added to 100 parts of an addition reaction type silicone-based adhesive with a weight average molecular weight of 500,000 to obtain 35% by mass toluene solution, which was then coated on one side of a polyester separate film with a thickness of 25 µm as a peeling sheet followed by heating for 5 minutes at 130° C. to form the silicone-based adhesion layer 9 (Si-based) with a thickness of 25 µm. After that, by laminating the adhesion layer on an opposite side to the anchor layer and the aluminum reflective layer of the polyethylene terephthalate film, the film mirror 10e of Comparative Example 1 was obtained (see FIG. 5A).

Figure 5B:
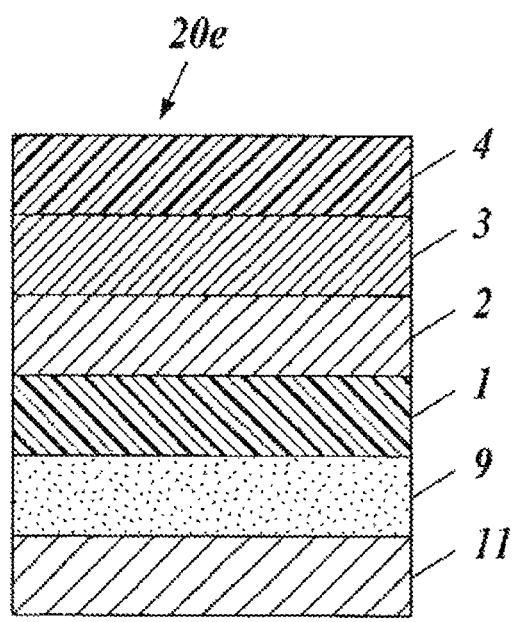
FIG. 5B is a brief cross-section drawing illustrating one exemplary configuration of the reflection device for photovoltaic power generation as a comparative example.

The peeling sheet was peeled from the film mirror 10e of Comparative Example 1. The film mirror 10e was then attached to the supporting substrate 11 composed of an aluminum plate having a thickness of 0.1 mm and a height of 4 cm×a width of 5 cm via the adhesion layer 9 to manufacture the reflection device for photovoltaic power generation 20e (A-1) (see FIG. 5B).

Comparative Example 2

(Manufacture of Film Mirror of Comparative Example 2)

Figure 6A:
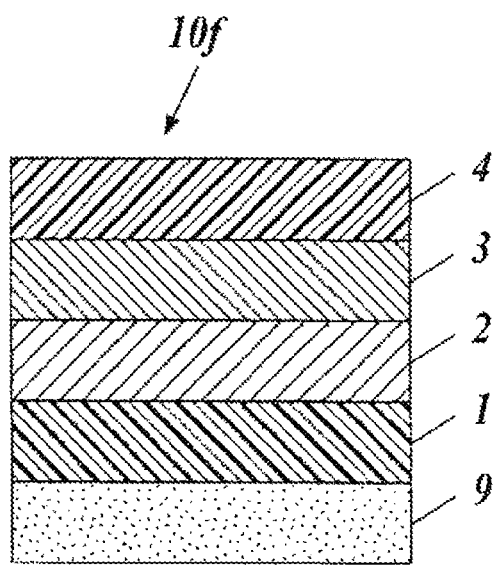
FIG. 6A is a brief cross-section drawing illustrating one exemplary configuration of the film mirror for photovoltaic power generation as a comparative example.

The film mirror 10f of Comparative Example 2 was obtained in the same method as Comparative Example 1 except that a silver reflective layer with a film thickness of 100 nm was formed by a vacuum vapor deposition method instead of the aluminum reflective layer as the metal reflective layer 3 in the film mirror of Comparative Example 1 (see FIG. 6A).

Figure 6B:
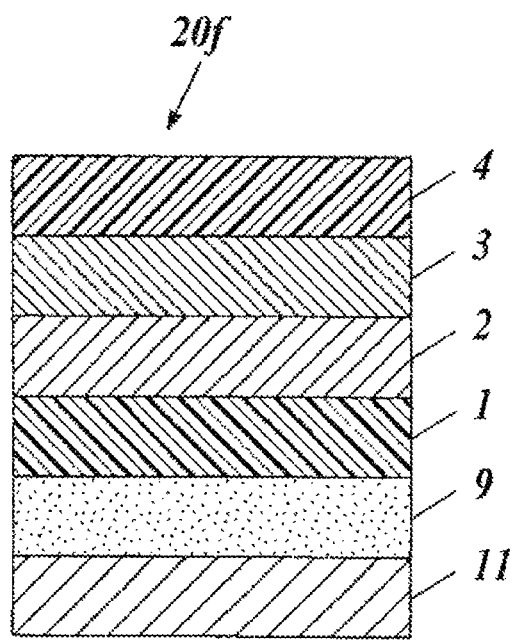
FIG. 6B is a brief cross-section drawing illustrating one exemplary configuration of the reflection device for photovoltaic power generation as a comparative example.

Further, the reflection device for photovoltaic power generation 20f (B-1) was manufactured by using the film mirror 10f of Comparative Example 2 with the same method as the reflection device for photovoltaic power generation (A-1) (see FIG. 6B).

Comparative Example 3

(Manufacture of Film Mirror of Comparative Example 3)

By dispersing the following composition for four hours using a ball mill, a dispersion of titanium oxide, which has a dispersed particle diameter D50 of 20 nm, was prepared.

| | |
|---|---|
| Isopropanol | 100 parts by mass |
| Pyridine | 3 parts by mass |
| Ethyl silicate (produced by COLCOAT CO., LTD., effective component: 30% by mass) | 5 parts by mass |
| Rutile type titanium oxide particles (volume average particle diameter of 15 nm) | 10 parts by mass |

To the obtained dispersion, 1.5 parts by mass of ultraviolet ray curable binder (manufactured by Shin-Etsu Chemical Co., Ltd., X-12-2400, effective component of 30% by mass) and 0.15 parts by mass of catalyst (manufactured by Shin-Etsu Chemical Co., Ltd., DX-2400) were added and dispersed for one hour with a ball mill to produce the coating liquid "H1" for a high refractive index layer which contains titanium oxide having a dispersed particle diameter D50 of 16 nm.

The coating liquid "H1" for a high refractive index layer was coated on the light incident side of the film mirror 10f (on the resin coat layer 4), which has been obtained from Comparative Example 2, by spin coating with a condition to have a dry film thickness of 75 nm. After drying at 100° C. and curing by irradiation with ultraviolet rays, the high refractive index layer containing titanium oxide was formed.

Further, the coating liquid "L1" for a low refractive index layer was produced in the same manner as the coating liquid "H1" for a high refractive index layer except that the rutile type titanium oxide particles for the coating liquid "H1" for a high refractive index layer described above were changed to silica organosol (XBA-ST with an average primary particle diameter of 10 to 20 nm, produced by Nissan Chemical Industries, Ltd.)

The coating liquid "L1" for a low refractive index layer was coated by spin coating on the high refractive index layer containing titanium oxide with a condition to have a dry film thickness of 78 nm. After drying at 100° C. and curing by irradiation with ultraviolet rays, the low refractive index layer containing silica was formed.

Figure 7A:
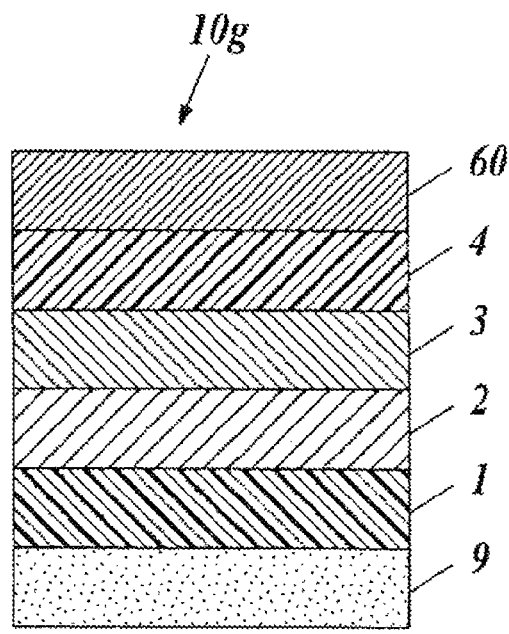
FIG. 7A is a brief cross-section drawing illustrating one exemplary configuration of the film mirror for photovoltaic power generation as a comparative example.

By repeating the same process again, the high refractive index layer containing titanium oxide and the low refractive index layer containing silica were laminated alternately, 12 layers for each, to form the ultraviolet curing type dielectric reflective layer 60 consisting of 24 layers in total, and thus the film mirror 10g of Comparative Example 3 was obtained (see FIG. 7A).

Figure 7B:
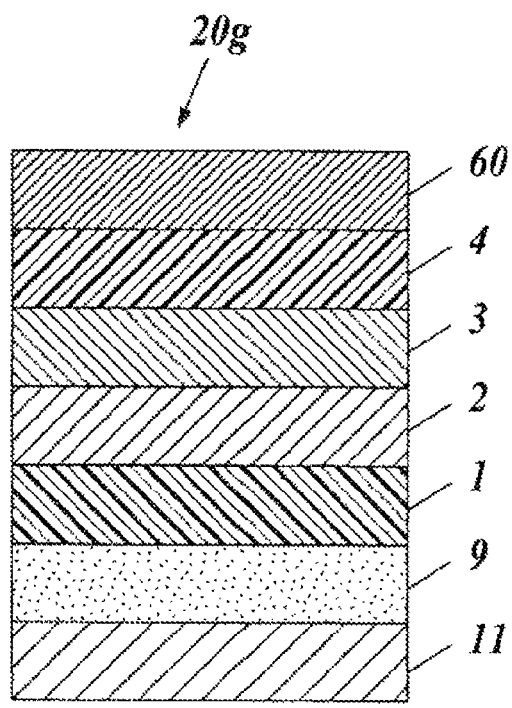
FIG. 7B is a brief cross-section drawing illustrating one exemplary configuration of the reflection device for photovoltaic power generation as a comparative example.

Further, the reflection device for photovoltaic power generation 20g (C-1) was manufactured by using the film mirror 10g of Comparative Example 3 according to the same method as the reflection device for photovoltaic power generation (A-1) (see FIG. 7B).

Example 1

(Manufacture of Film Mirror of Example 1)

A biaxially-stretched polyester film (polyethylene terephthalate film having a thickness of 25 μm) was used as the resin substrate 1.

On one side of the above-mentioned polyethylene terephthalate film, a resin liquid in which polyester resin (POLYESTER SP-181 produced by Nippon Synthetic Chemical Industry Co., Ltd.), a melamine resin (Super Beckamine J-820 produced by DIC), TDI-based isocyanate (2,4-tolylene diisocyanate), and HMDI-based isocyanate (1,6-hexamethylene diisocyanate) are mixed in toluene such that the resin solid content ratio is 20:1:1:2 and the solid matter concentration is 10% was coated by a gravure coating method to form the anchor layer 2 with a thickness of 0.1 μm.

On the anchor layer 2, a silver reflective layer with a thickness of 100 nm was formed by a vacuum vapor deposition method.

Further, on the silver reflective layer, mixed resin of polyester resin and TDI-based isocyanate with a resin solid content ratio of 10:2 was coated by a gravure coating method to form the resin coat layer 4 with a thickness of 3.0 μm.

Next, each of the coating liquid "H2" for a high refractive index layer and the coating liquid "L2" for a low refractive index layer, which have been prepared as described below, was maintained for 56 hours while incubating each coating liquid at 45° C. After that, each coating liquid was coated using a slide hopper such that, on the resin coat layer 4, the coating liquid "H2" for a high refractive index layer and the coating liquid "L2" for a low refractive index layer were overlapped alternately with a dry film thickness of 78 nm for each (simultaneous multilayer coating). Then, according to setting by spraying for 1 minute cold air with a condition to have a film surface of 15° C. or lower followed by drying with spraying of hot air at 80° C., the dielectric reflective layer 6 with total 24 layers resulting from laminating alternately the high refractive index layer and the low refractive index layer, 12 layers for each, was formed. Meanwhile, pH of the film surface was adjusted to 7.2. For the pH adjustment, acetic acid and ammonia water were used.

<Preparation of Coating Liquid "H2" for High Refractive Index Layer>

By adding and mixing the following additives 1 to 5 in the order, the coating liquid "H2" for a high refractive index layer was prepared.

First, after heating 1) sol of titanium oxide particles to 50° C. under stirring, 2) gelatin with a low molecular weight was added followed by stirring for 30 minutes to coat the surface of titanium oxide particles with the gelatin with low molecular weight. Subsequently, 3) gelatin with a high molecular weight and 4) pure water were added, and after stirring for 90 minutes, 5) a surfactant was added to prepare the coating liquid "H2" for a high refractive index layer. This preparation method is referred to as the preparation pattern A.

| | |
|---|---|
| 1) Sol of 20% by mass titanium oxide particles (volume average particle diameter of 35 nm, rutile type titanium oxide particles, SRD-02W manufactured by Sakai Chemical Industrial Co., Ltd.) | 60 g |
| 2) 5.0% by mass aqueous solution of gelatin with a low molecular weight (Gel$_L$2) | 125 g |
| 3) 5.0% by mass aqueous solution of gelatin with a high molecular weight (Gel$_H$2) | 100 g |
| 4) Pure water | 150 g |
| 5) 5.0% by mass aqueous solution of surfactant (Cotamine 24P, quaternary ammonium-based cationic surfactant, manufactured by Kao Corporation) | 0.45 g |

Gel$_{L2}$ corresponds to the low molecular weight gelatin with a weight average molecular weight of 20,000 after performing hydrolysis by an alkali treatment (HBC-P20 manufactured by Nitta Gelatin Co., Ltd.) and Gel$_{H2}$ corresponds to acid-treated gelatin with a weight average molecular weight of 130,000 (high molecular weight gelatin) (AP-270 manufactured by Nippy Chemicals).

<Preparation of Coating Liquid "L2" for Low Refractive Index Layer>

By adding and mixing the following additives 1 to 5 in the order, the coating liquid "L2" for a low refractive index layer was prepared.

First, after heating 1) colloidal silica (SNOWTEX AK with an average particle diameter of 6 nm, manufactured by Nissan Chemical Industries, Ltd.) to 40° C. under stirring, 2) gelatin with a low molecular weight was added followed by stirring for 10 minutes. Subsequently, 3) gelatin with a high molecular weight and 4) pure water were added, and after stirring for 10 minutes, 5) a surfactant was added to prepare the coating liquid "L2" for a low refractive index layer according to the preparation pattern A.

| | |
|---|---|
| 1) 20% by mass colloidal silica | 68 g |
| 2) 5.0% by mass aqueous solution of gelatin with a low molecular weight (Gel$_L$2) | 180 g |
| 3) 5.0% by mass aqueous solution of gelatin with a high molecular weight (Gel$_H$2) | 100 g |
| 4) Pure water | 240 g |
| 5) 5.0% by mass aqueous solution of surfactant (Co-tamine 24P, quaternary ammonium-based cationic surfactant, manufactured by Kao Corporation) | 0.64 g |

Gel$_{L2}$ corresponds to the low molecular weight gelatin with a weight average molecular weight of 20,000 after performing hydrolysis by an alkali treatment and Gel$_{H2}$ corresponds to acid-treated gelatin with a weight average molecular weight of 130,000 (high molecular weight gelatin).

Further, one part of platinum-based catalyst was added to 100 parts of an addition reaction type silicone-based adhesive with a weight average molecular weight of 500,000 to obtain 35% by mass toluene solution, which was then coated on one side of a polyester separate film with a thickness of 25 μm as a peeling sheet followed by heating for 5 minutes at 130° C. to form the silicone-based adhesion layer 9 (Si-based) with a thickness of 25 μm. After that, by laminating the adhesion layer on an opposite side to the anchor layer and the silver reflective layer of the polyethylene terephthalate film, the film mirror 10a of Example 1 was obtained (see FIG. 1A).

Further, the reflection device for photovoltaic power generation 20a (D-1) was manufactured by using the film mirror 10a of Example 1 according to the same method as the reflection device for photovoltaic power generation (A-1) (see FIG. 1B).

Example 2

(Manufacture of Film Mirror of Example 2)

The film mirror 10b of Example 2 was obtained in the same method as Example 1 except that, on top of the outermost layer (on the dielectric reflective layer 6) of the film mirror 10a of Example 1, the ultraviolet absorbing layer 7 consisting of an acrylic resin material was additionally formed by coating to have a dry film thickness of 50 μm (see FIG. 2A).

<Preparation of Coating Liquid for Ultraviolet Absorbing Layer Consisting of Acrylic Resin Material>

To 800 ml MEK (methyl ethyl ketone), 150 g of the acrylic resin BR-85 and 50 g of BR-87 (all manufactured by Mitsubishi Rayon Co., Ltd.) were added in order under stirring and dissolved for 1 hour at 50° C. After confirming the dissolution of the acrylic resins, 1 g of TINUVIN1577 and 4 g of TINUVIN234 (all manufactured by BASF) were added as an UV absorbing agent. By dissolving for 30 minutes under stirring, a coating liquid for ultraviolet absorbing layer consisting of an acrylic resin material was produced.

Further, the reflection device for photovoltaic power generation 20b (E-1) was manufactured by using the film mirror 10b of Example 2 according to the same method as the reflection device for photovoltaic power generation (A-1) (see FIG. 2B).

Example 3

(Manufacture of Film Mirror of Example 3)

The film mirror 10b of Example 3 was obtained in the same method as Example 2 except that the coating liquid "H3" for a high refractive index layer and the coating liquid "L3" for a low refractive index layer described below were used instead of the coating liquid "H2" for a high refractive index layer and the coating liquid "L2" for a low refractive index layer for the film mirror 10b obtained from Example 2 (see FIG. 2A).

<Preparation of Coating Liquid "H3" for High Refractive Index Layer and Coating Liquid "L3" for Low Refractive Index Layer>

The coating liquid "H3" for a high refractive index layer and the coating liquid "L3" for a low refractive index layer were prepared in the same manner as the coating liquid "H2" for a high refractive index layer and the coating liquid "L2" for a low refractive index layer except that polyvinyl alcohol (hereinbelow, also referred to PVA) (polyvinyl alcohol 235, manufactured by Kuraray Co., Ltd.) was used in the same amount as gelatin mass (gelatin with a low molecular weight+gelatin with high molecular weight) instead of the gelatin added to the coating liquid "H2" for a high refractive index layer and the coating liquid "L2" for a low refractive index layer.

Further, the reflection device for photovoltaic power generation 20b (F-1) was manufactured by using the film mirror 10b of Example 3 according to the same method as the reflection device for photovoltaic power generation (A-1) (see FIG. 2B).

Example 4

(Manufacture of Film Mirror of Example 4)

The film mirror 10b of Example 4 was obtained in the same method as Example 2 except that the coating liquid "H4" for a high refractive index layer and the coating liquid "L4" for a low refractive index layer described below were used instead of the coating liquid "H2" for a high refractive index layer and the coating liquid "L2" for a low refractive index layer for the film mirror 10b obtained from Example 2 (see FIG. 2A).

<Preparation of Coating Liquid "H4" for a High Refractive Index Layer and Coating Liquid "L4" for Low Refractive Index Layer>

The coating liquid "H4" for a high refractive index layer and the coating liquid "L4" for a low refractive index layer were prepared in the same manner as the coating liquid "H2" for a high refractive index layer and the coating liquid "L2" for a low refractive index layer except that tamarind seed gum (TG-500, manufactured by MRC Polysaccharides Co., Ltd.) in the same amount as gelatin mass (gelatin with a low molecular weight+gelatin with a high molecular weight) was added at 15% (4% in terms of mass) relative to the volume of metal oxide particles instead of the gelatin added to the coating liquid "H2" for a high refractive index layer and the coating liquid "L2" for a low refractive index layer.

Further, the reflection device for photovoltaic power generation 20b (G-1) was manufactured by using the film mirror 10b of Example 4 according to the same method as the reflection device for photovoltaic power generation (A-1) (see FIG. 2B).

Example 5

(Manufacture of Film Mirror of Example 5)

The film mirror 10c of Example 5 was obtained in the same method as Example 4 except that the following coating liquid for hard coat layer was coated on the outermost layer of the film mirror 10b of Example 4 (that is, on top of the ultraviolet absorbing layer 7) and, for curing, irradiation of ultraviolet rays was further performed at 1.0 J/cm² after drying at 80° C. to form the hard coat layer 8 with a thickness of 6 μm (see FIG. 3A).

<Preparation of Coating Liquid for Hard Coat Layer>

Commercially available hard coating agent (OPSTAR Z7534 (registered trademark) manufactured by JSR) was diluted with methyl ethyl ketone to have solid content concentration of 50% by mass. By further adding the acrylic fine particles with an average particle diameter of 1.5 μm (CHEMISNOW (registered trademark) MX series manufactured by Soken Chemical & Engineering Co., Ltd.) in an amount of 1% by mass relative to the solid content of the hard coating agent, the coating liquid for hard coat layer was prepared.

Further, the reflection device for photovoltaic power generation 20c (H-1) was manufactured by using the film mirror 10c of Example 5 according to the same method as the reflection device for photovoltaic power generation (A-1) (see FIG. 3B).

Example 6

(Manufacture of Film Mirror of Example 6)

The film mirror 10d of Example 6 was obtained in the same method as Example 5 except that 3% perhydropolysilazane liquid (NL120 manufactured by Clariant Corporation) was bar-coated to have a film thickness of 100 nm after drying on top of the resin coat layer 4 such that the gas barrier layer 5 was disposed between the resin coat layer 4 and the dielectric reflective layer 6 of the film mirror 10c of Example 5 and, after natural cooling for 3 minutes, an annealing treatment was performed for 30 minutes in an oven at 90° C. to form the gas barrier layer 5 (see FIG. 4A).

Meanwhile, in case of Example 6, the dielectric reflective layer 6 was formed on top of the gas barrier layer 5.

Further, the reflection device for photovoltaic power generation 20d (I-1) using the film mirror 10d of Example 6 was manufactured according to the same method as the reflection device for photovoltaic power generation (A-1) (see FIG. 4B).

Example 7

(Manufacture of Film Mirror of Example 7)

The film mirror 10h was manufactured in the same method as the film mirror 10d of Example 6 except that the anchor layer and the metal reflective layer (silver reflective layer) were not formed for manufacturing the film mirror 10d of Example 6. Specifically, with regard to the manufacture of the film mirror 10d of Example 6, the resin coat layer 4 was formed on one side of the resin substrate 1 and the gas barrier layer 5, the dielectric reflective layer (aqueous coating) 6, the ultraviolet absorbing layer 7, and the hard coat layer 8 were formed in the order. By additionally forming the adhesion layer 9 on opposite side of the resin substrate, the film mirror 10h of Example 7 was obtained (see FIG. 8A).

Figure 8A:
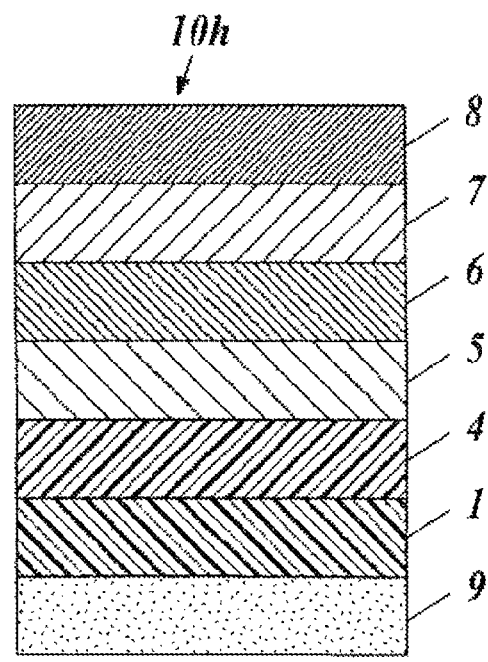
FIG. 8A is a brief cross-section drawing illustrating one exemplary configuration of the film mirror for photovoltaic power generation of the present invention.
Figure 8B:
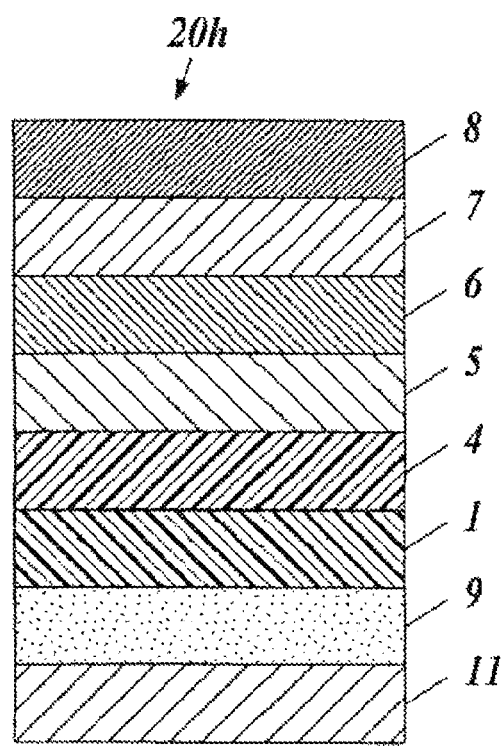
FIG. 8B is a brief cross-section drawing illustrating one exemplary configuration of the reflection device for photovoltaic power generation of the present invention.

Further, the reflection device for photovoltaic power generation 20h (K-1) was manufactured by using the film mirror 10h of Example 7 according to the same method as the reflection device for photovoltaic power generation (A-1) (see FIG. 8B).

Comparative Example 4

(Manufacture of Film Mirror of Comparative Example 4)

Figure 9A:
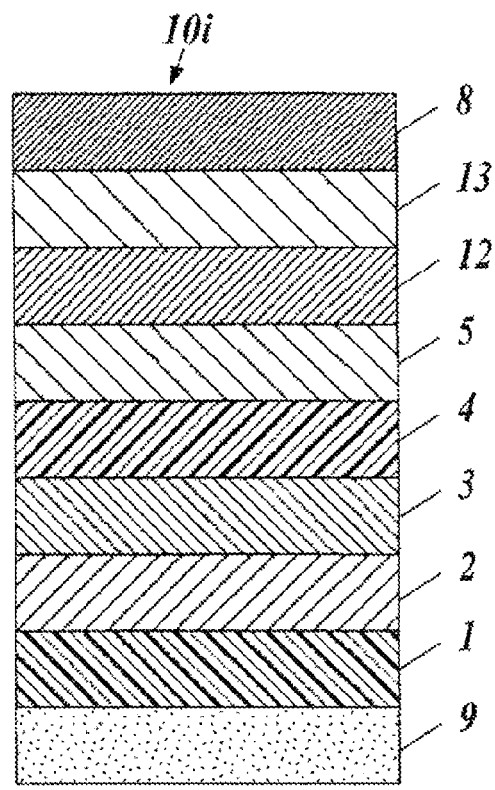
FIG. 9A is a brief cross-section drawing illustrating one exemplary configuration of the film mirror for photovoltaic power generation as a comparative example.

With regard to the manufacture of the film mirror 10d of Example 6, the following adhesive layer 12 was formed on top of the gas barrier layer 5 and the following dielectric reflective layer 13 was attached by drying lamination process at lamination temperature of 60° C. After that, the film mirror 10i of Comparative Example 4 was obtained by forming the hard coat layer 8 on the dielectric reflective layer in the same manner as Example 6 (FIG. 9A).

(Construction of Dielectric Reflective Layer 13)

By co-extrusion of polyethylene naphthalate (PEN) and polymethyl methacrylate (PMMA), a film having 275 alternate layers was formed. The multilayer film was applied to a cooling roll at 22 m per minute to form a web with formed multilayer having a thickness of about 725 μm (29 mill). The web with formed multilayer was heated for 10 seconds in an oven at 145° C., and then biaxially oriented at stretch ratio of 3.8×3.8. The oriented multilayer film was heated again for 10 seconds to 225° C. to increase the crystallinity of the PEN layer, and thus the dielectric reflective layer 13 was formed.

(Construction of Adhesive Layer 12)

On top of the gas barrier layer 5, mixed resins in which polyester resin (POLYESTER SP-18 produced by Nippon Synthetic Chemical Industry Co., Ltd.), a melamine resin (Super Beckamine J-820 produced by DIC), TDI-based isocyanate (2,4-tolylene diisocyanate), and HMDI-based isocyanate (1,6-hexamethylene diisocyanate) are mixed in toluene such that the resin solid content ratio is 20:1:1:2 (mass ratio) and the solid matter concentration is 10% by mass was coated by a gravure coating method to form the adhesive layer 12 with a thickness of 8 μm.

Figure 9B:
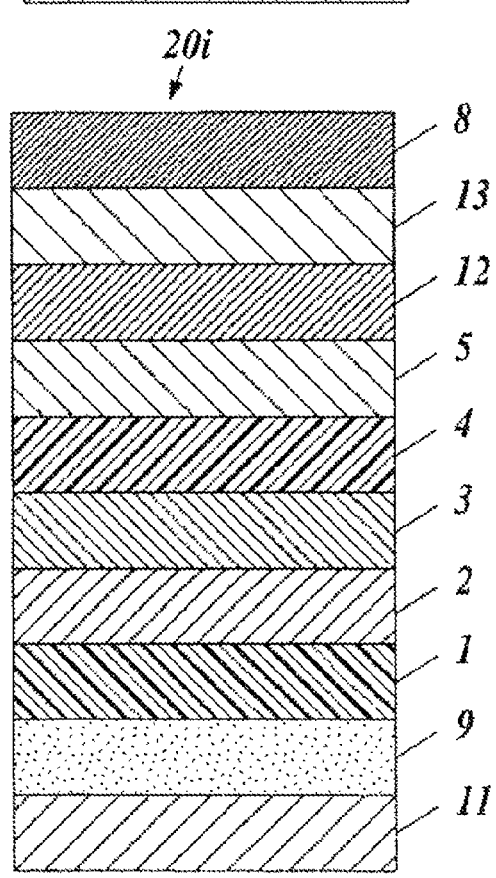
FIG. 9B is a brief cross-section drawing illustrating one exemplary configuration of the reflection device for photovoltaic power generation as a comparative example.

Further, the reflection device for photovoltaic power generation 20i (J-1) was manufactured by using the film mirror 10i of Comparative Example 4 according to the same method as the reflection device for photovoltaic power generation (A-1) (see FIG. 9B).

Example 8

The reflection device for photovoltaic power generation (D-2) to (I-2), in which the supporting substrate 11 having two material surfaces and a self-supporting property is used instead of the aluminum plate (supporting substrate 11) with a thickness of 0.1 mm and a length of 4 cm×a width of 5 cm for producing the aforementioned reflection device for photovoltaic power generation (D-1) to (I-1), was produced.

As for the supporting substrate 11 having a self-supporting property, those with a thickness of 2 mm were used. As described herein, the two material surfaces indicate a material in which an intermediate layer having a hollow structure is sandwiched with flat metal plates, which correspond to the supporting substrate type A. Meanwhile, the flat metal plate has 0.12 mm aluminum on single side and, as the intermediate resin layer, those obtained by filling a foamed polyethylene resin with a thickness of 1.76 mm were used.

As a result of measuring the mass of the reflection device for photovoltaic power generation (D-2) to (I-2), the weight can be significantly reduced compared to a conventionally known reflection device for photovoltaic power generation, and as a result, the conveyance efficiency was increased to yield simplification of the installation process. It also contributes to the cost reduction.

Evaluation

With the film mirror and the reflection device for photovoltaic power generation which have been prepared as described above, evaluations of regular reflectivity, weather resistance, yellow discoloration, anti-fouling property, and hardness were made according to the following methods.

Further, measurement was also made regarding the mass and electricity consumption amount for driving the mirror.

<Measurement of Regular Reflectivity>

Spectrophotometer "UV265" manufactured by Shimadzu Corp. added with an integrating sphere reflective attachment was modified so that an incidence angle of an incident light was adjusted to be 5° relative to a normal line of the reflective surface, and the regular reflectivity of the angle of reflection 5° was measured.

As the evaluation of the regular reflectivity of the film mirror (reflection device for photovoltaic power generation), the average reflectivity from 350 nm to 700 nm was measured.

<Weather Resistance Test>

The regular reflectivity of the film mirror (reflection device for photovoltaic power generation) after keeping it for 30 days under a condition with a temperature of 85° C. and a humidity of 85% RH was measured in the same manner as the measurement of regular reflectivity. Then, a decreasing rate of the regular reflectivity was calculated from the ratio of the regular reflectivity of the film mirror before an enforced degradation to the regular reflectivity of the film mirror after an enforced degradation. The criteria for evaluation of the weather resistance test are described below.

5: Decreasing rate of regular reflectivity is less than 5%.
4: Decreasing rate of regular reflectivity is 5% or more and less than 10%.
3: Decreasing rate of regular reflectivity is 10% or more and less than 15%.
2: Decreasing rate of regular reflectivity is 15% or more and less than 20%.
1: Decreasing rate of regular reflectivity is 20% or more.

<Yellow Discoloration of Film Mirror>

After performing ultraviolet irradiation of the obtained film mirror (reflection device for photovoltaic power generation) for 7 days under an atmosphere of 65° C. by using EYE SUPER UV TESTER produced by Iwasaki Electric Co., Ltd., the yellow discoloration was visually examined.

○: No color change is visually observed.
Δ: Slight color change is visually observed.
x: Clear color change is visually observed.

<Anti-Fouling Test>

The obtained film mirror (reflection device for photovoltaic power generation) was cut to obtain a test specimen having a width of 10 cm×a length of 10 cm and fixed onto an aluminum frame. It was then tilted at 45° and installed in an outside for exposure (January to June, 2010, location: Hachioji City, Tokyo).

Degree of the contamination after exposure to outside for 6 months was visually observed and 3-level evaluations were made (○: no adhesion of dirts, Δ: slight adhesion of dirts, x: significant adhesion of dirts).

<Pencil Hardness Test>

Based on JIS-K5400, a pencil hardness of each film mirror (reflection device for photovoltaic power generation) was measured at 45° inclination and 1 kg load.

The results of measurement•evaluation of the regular reflectivity, weather resistance, yellow discoloration, anti-fouling property, and hardness are indicated in Table 1.

<Mass and Electricity Consumption Amount of Mirror>

Mass of 1.0 m² size and electricity consumption rate for driving were measured and compared to each other for the reflection device for photovoltaic power generation I-1 and I-2.

The electricity consumption rate for driving was obtained as the rate of driving electricity at the time of embedding the reflection device for photovoltaic power generation I-2 in a sun-tracking type device, under the condition that the driving electricity used for tracking one device at the time of embedding the reflection device for photovoltaic power generation I-1 in a sun-tracking type device was set at 100.

The measurement•evaluation results of the mass and electricity consumption rate for driving of the mirror are indicated in Table 2.

TABLE 1

| | Reflection device for photovoltaic power generation | Regular reflectivity (%) | Weather resistance test | Yellow discoloration | Anti-fouling property | Pencil hardness |
|---|---|---|---|---|---|---|
| Comparative Example-1 | A-1 | 87 | 3 | Δ | Δ | B |
| Comparative Example-2 | B-1 | 91 | 1 | Δ | Δ | B |
| Comparative Example-3 | C-1 | 93 | 2 | X | Δ | 3B |
| Comparative Example-4 | J-1 | 92 | 2 | Δ | Δ | HB |
| Example-1 | D-1 | 95 | 4 | ○ | Δ | H |
| Example-2 | E-1 | 95 | 4 | ○ | Δ | H |
| Example-3 | F-1 | 96 | 4 | ○ | Δ | H |
| Example-4 | G-1 | 96 | 4 | ○ | Δ | H |
| Example-5 | H-1 | 96 | 4 | ○ | ○ | 3H |
| Example-6 | I-1 | 96 | 5 | ○ | ○ | 3H |
| Example-7 | K-1 | 94 | 5 | ○ | ○ | 3H |

TABLE 2

| | Reflection device for photovoltaic power generation | Mass of reflection device for photovoltaic power generation | Electricity consumption rate of driving |
|---|---|---|---|
| Example-8 | I-1 | 3.7 kg/m² | 100 |
| Example-8 | I-2 | 2.1 kg/m² | 64 |

As it is clearly shown in the evaluation results indicated in Tables 1 and 2, the various properties of Examples according to the present invention are better than Comparative Examples.

Specifically, by disposing the dielectric reflective layer (interface reflective layer) 6 having at least one set of a high refractive index layer and a low refractive index layer, that are adjacent to each other in the film mirror, closer to the light incident side than the silver reflective layer, it is found that a film mirror having high reflectivity and durability can be obtained.

In particular, the film mirrors 10a to 10d and 10h (reflection devices for photovoltaic power generation D-1 to I-1 and K-1) provided with the dielectric reflective layer 6 in which at least one of the high refractive index layer and the low refractive index layer contains a water soluble polymer and metal oxide particles exhibit no deterioration related to weather resistance or yellow discoloration, thus showing high hardness and excellent durability.

Further, since deterioration of the surface property of the hard coat layer over time, which is caused by the deterioration of the adhesiveness, is low as the dielectric reflective layer according to the present invention has good adhesiveness to the hard coat layer as caused by a water soluble polymer, a favorable anti-fouling property can be maintained for a long period of time. Since the non-water soluble polymer has poor adhesiveness, the anti-fouling property is poor.

As described in the above, the film mirrors 10a to 10d and 10h and the reflection devices for photovoltaic power generation 20a to 20d and 20h (D-1 to I-1 and K-1) according to the present invention have high reflectivity for efficiently concentrating solar light, and also have high weather resistance.

Meanwhile, although the silver reflective layer (metal reflective layer) and the dielectric reflective layer (interface reflective layer) 6 are used in combination in the above embodiments, the present invention is not limited thereto. As shown by the evaluation results of the reflection device for photovoltaic power generation K-1 which has been manufactured in Example 7, it is also possible to have a mirror having only the dielectric reflective layer (interface reflective layer) 6 without having a metal reflective layer.

Moreover, it is needless to say that suitable modifications can be made to other specific detailed structures of the like.

INDUSTRIAL APPLICABILITY

The film mirror of the present invention has high reflectivity for efficient concentration of solar light and excellent weather resistance, and therefore it can be desirably used for a reflection device for photovoltaic power generation, and a film mirror for photovoltaic power generation.

The invention claimed is:

1. A film mirror manufacturing method for manufacturing a film mirror having a metal reflective layer formed on a resin substrate, the film mirror comprising, closer to a light incident side than the metal reflective layer, an interface reflective layer having at least one set of a high refractive index layer and a low refractive index layer that are adjacent to each other, wherein at least one of the high refractive index layer and the low refractive index layer contains a water soluble polymer and metal oxide particles, the film mirror manufacturing method comprising:
   forming the interface reflective layer by simultaneous multilayer coating of materials of the high refractive index layer and the low refractive index layer.

2. A film mirror having a metal reflective layer formed on a resin substrate, the film mirror comprising, closer to a light incident side than the metal reflective layer,
   an interface reflective layer having at least one set of a high refractive index layer and a low refractive index layer that are adjacent to each other,
   an adhesion layer containing, on a site opposite to the light incident side relative to the resin substrate, at least one of polyester resin, urethane resin, polyvinyl acetate resin, acrylic resin, and nitrile rubber, and a thickness of the adhesion layer is 1 to 100 μm;
   wherein at least one of the high refractive index layer and the low refractive index layer contains a water soluble polymer and metal oxide particles.

3. The film mirror according to claim 2, wherein a peeling sheet with a thickness of 12 to 250 μm is formed on a site opposite to the light incident side relative to the adhesion layer.

4. The film mirror according to claim 3, wherein the interface reflective layer is an interface reflective layer obtained by simultaneous multilayer coating of materials for the high refractive index layer and the low refractive index layer.

5. A film mirror having a metal reflective layer formed on a resin substrate, the film mirror comprising, closer to a light incident side than the metal reflective layer,
   an interface reflective layer having at least one set of a high refractive index layer and a low refractive index layer that are adjacent to each other,
   wherein at least one of the high refractive index layer and the low refractive index layer contains a water soluble polymer and metal oxide particles,
   wherein the interface reflective layer comprises a mix region of the high refractive index layer and the low refractive index layer.

6. The film mirror according to claim 5, wherein the water soluble polymer comprises at least one water soluble polymer of polyvinyl alcohol, gelatin, and thickening polysaccharides.

7. The film mirror according to claim 5, wherein the metal oxide is rutile type titanium dioxide.

8. The film mirror according to claim 5, wherein an ultraviolet absorbing layer is provided closer to the light incident side than the interface reflective layer.

9. The film mirror according to claim 5, wherein a hard coat layer is provided on an outermost surface of the light incident side of the film mirror.

10. The film mirror according to claim 5, wherein a gas barrier layer is provided closer to the light incident side than the metal reflective layer.

11. A reflection device for photovoltaic power generation formed by adhering the film mirror according to claim 5 to a supporting substrate with a self-supporting property via an adhesion layer.

12. The reflection device for photovoltaic power generation according to claim 11, wherein the supporting substrate comprises a resin material with a hollow structure.

13. The reflection device for photovoltaic power generation according to claim 11, wherein the supporting substrate includes a pair of flat metal plates and an intermediate layer interposed between the flat metal plates, and the intermediate layer comprises a material or a resin material with a hollow structure.

14. The film mirror according to claim 5, wherein the center line average line roughness (Ra) of the outermost layer on the light incident side is 3 nm to 20 nm.

15. The film mirror according to claim 9, wherein a center line average line roughness (Ra) of the outermost layer on the light incident side is 3 nm to 20 nm.

16. The film mirror according to claim 15, wherein the thickness of the hard coat layer is 0.05 μm to 10 μm.

17. The film mirror according to claim 16, wherein the hard coat layer comprises a silicone-based leveling agent.

18. The film mirror according to claim 16, wherein the hard coat layer comprises a thermocuring silicone-based material.

* * * * *